(12) United States Patent
Tokita et al.

(10) Patent No.: US 10,090,399 B2
(45) Date of Patent: Oct. 2, 2018

(54) SEMICONDUCTOR DEVICE AND A MANUFACTURING METHOD THEREOF

(71) Applicant: RENESAS ELECTRONICS CORPORATION, Tokyo (JP)

(72) Inventors: Hirofumi Tokita, Tokyo (JP); Tamotsu Ogata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/792,423

(22) Filed: Oct. 24, 2017

(65) Prior Publication Data

US 2018/0061964 A1 Mar. 1, 2018

Related U.S. Application Data

(62) Division of application No. 14/973,471, filed on Dec. 17, 2015, now Pat. No. 9,831,318.

(30) Foreign Application Priority Data

Jan. 27, 2015 (JP) .................................. 2015-013578

(51) Int. Cl.
*H01L 29/66* (2006.01)
*H01L 27/11568* (2017.01)
(Continued)

(52) U.S. Cl.
CPC .. *H01L 29/66545* (2013.01); *H01L 21/28282* (2013.01); *H01L 27/11568* (2013.01);
(Continued)

(58) Field of Classification Search
CPC ....................... H01L 27/1157; H01L 29/42344
See application file for complete search history.

(56) References Cited

U.S. PATENT DOCUMENTS 7,863,131 B2    1/2011    Yasui et al.
8,390,053 B2    3/2013    Akita et al.
(Continued)

FOREIGN PATENT DOCUMENTS

JP    2006-054292 A    2/2006
JP    2009-054687 A    3/2009
JP    2012-059777 A    3/2012

OTHER PUBLICATIONS

Notice of Allowance dated Aug. 16, 2017 issued in Parent U.S. Appl. No. 14/973,471.
(Continued)

*Primary Examiner* — Moazzam Hossain
*Assistant Examiner* — Farun Lu
(74) *Attorney, Agent, or Firm* — McDermott Will & Emery LLP

(57) ABSTRACT

The reliability of a semiconductor device having a nonvolatile memory is improved. The memory cell of the nonvolatile memory is of a split gate type, and has first and second n type semiconductor regions in a semiconductor substrate, a control electrode formed over the substrate between the semiconductor regions via a first insulation film, and a memory gate electrode formed over the substrate between the semiconductor regions via a second insulation film having a charge accumulation part. The SSI method is used for write to the memory cell. During the read operation of the memory cell, the first and second semiconductor regions function as source and drain regions, respectively. The first width of the first sidewall spacer formed adjacent to the side surface of the memory gate electrode is larger than the second width of the second sidewall spacer formed adjacent to the side surface of the control gate electrode.

5 Claims, 41 Drawing Sheets

(51) Int. Cl.
    *H01L 29/792*    (2006.01)
    *H01L 21/28*     (2006.01)
    *H01L 29/423*    (2006.01)

(52) U.S. Cl.
    CPC .. *H01L 29/42344* (2013.01); *H01L 29/66833*
             (2013.01); *H01L 29/792* (2013.01)

(56) References Cited

U.S. PATENT DOCUMENTS

| | | |
|---|---|---|
| 2004/0188753 A1 | 9/2004 | Kawashima et al. |
| 2008/0233691 A1 | 9/2008 | Cheng et al. |
| 2009/0231921 A1* | 9/2009 | Kimura ............. H01L 27/11568 |
| | | 365/185.18 |
| 2012/0068243 A1 | 3/2012 | Kawashima et al. |
| 2014/0050029 A1 | 2/2014 | Kang et al. |

OTHER PUBLICATIONS

Final Office Action dated Mar. 2, 2017 issued in Parent U.S. Appl. No. 14/973,471.
Non-Final Office Action dated Nov. 3, 2016 issued in Parent U.S. Appl. No. 14/973,471.
Japanese Office Action issued in corresponding Japanese Patent Application No. 2015-013578, dated Jul. 31, 2018, with English Translation.

* cited by examiner

| APPLIED VOLTAGE / OPERATION | Vd | Vcg | Vmg | Vs | Vb |
|---|---|---|---|---|---|
| WRITE | 0.5V | 1V | 10V | 5V | 0 |
| ERASE | 0 | 0 | 12V | 0 | 0 |
| READ | 1.5V | 1.5V | 0 | 0 | 0 |

1

SEMICONDUCTOR DEVICE AND A MANUFACTURING METHOD THEREOF

CROSS-REFERENCE TO RELATED APPLICATIONS

This application is a divisional of U.S. application Ser. No. 14/973,471, filed on Dec. 17, 2015, which claims the benefit of Japanese Patent Application No. 2015-013578 filed on Jan. 27, 2015 including the specification, drawings and abstract is incorporated herein by reference in its entirety.

BACKGROUND

The present invention relates to a semiconductor device, and a manufacturing method thereof. More particularly, the present invention is preferably applicable to a semiconductor device having a nonvolatile memory, and a manufacturing method thereof.

As electrically writable/erasable nonvolatile semiconductor storage devices, EEPROMs (Electrically Erasable and Programmable Read Only Memories) have been widely used. The storage devices typified by currently and widely used flash memories have conductive floating gate electrodes surrounded by an oxide film, or trapping insulation films under gate electrodes of MISFETs. The storage devices use charge accumulation states at the floating gates or the trapping insulation film as stored information, and read out the information as a threshold value of each transistor. The trapping insulation film denotes an insulation film capable of accumulating electric charges. As one example thereof, mention may be made of a silicon nitride film. Implantation/discharge of electric charges into such charge accumulation regions causes each MISFET to be shifted in threshold value and to operate as a storage element. The flash memories include a split gate type cell using a MONOS (Metal-Oxide-Nitride-Oxide-Semiconductor) film. Such a memory has the following advantages: use of a silicon nitride film as a charge accumulation region leads to an excellent data holding reliability because electric charges are accumulated discretely as compared with a conductive floating gate, and the excellent data holding reliability can reduce the film thickness of the oxide films over and under the silicon nitride film, which enables a lower voltage for write/erase operation; and other advantages.

Japanese Unexamined Patent Application Publication No. 2012-59777 (Patent Document 1) describes the technology regarding a semiconductor device having a field-effect transistor.

[Patent Document 1] Japanese Unexamined Patent Application Publication No. 2012-59777

SUMMARY

A semiconductor device having a nonvolatile memory is also expected to be improved in reliability as much as possible. Alternatively, the semiconductor device is expected to be improved in performances. Still alternatively, the semiconductor device is expected to be improved in reliability, and to be improved in performances.

Other objects and novel features will be apparent from the description of this specification and the accompanying drawings.

In accordance with one embodiment, a semiconductor device has a memory cell of a nonvolatile memory; the memory cell is of a split gate type; and the SSI method is used for write to the memory cell. Then, the width of a sidewall spacer on the side to be a source region at the time of read is larger than the width of a sidewall spacer on the side to be a drain region at the time of read.

In accordance with another embodiment, a method for manufacturing a semiconductor device is a method for manufacturing a semiconductor device having a memory cell of a nonvolatile memory. The memory cell is of a split gate type, and the SSI method is used for write to the memory cell. Then, the width of a sidewall spacer on the side to be a source region at the time of read is made larger than the width of a sidewall spacer on the side to be a drain region at the time of read.

In accordance with one embodiment, it is possible to improve the reliability of the semiconductor device.

Alternatively, it is possible to improve the performances of the semiconductor device.

Still alternatively, it is possible to improve the reliability of the semiconductor device, and to improve the performances thereof.

DETAILED DESCRIPTION

Figure 1:
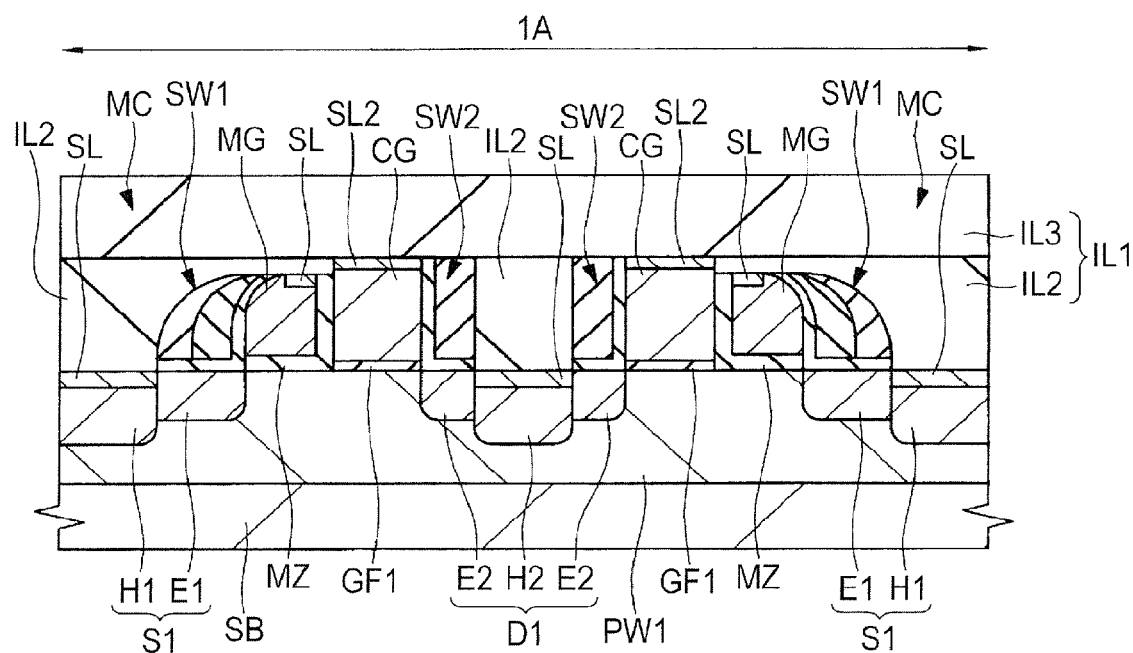
FIG. 1 is an essential part cross sectional view of a semiconductor device of one embodiment.

In description of the following embodiment, the embodiment may be described in a plurality of divided sections or embodiments for convenience, if required. However, unless otherwise specified, these are not independent of each other, but are in a relation such that one is a modified example, details, a complementary explanation, or the like of a part or the whole of the other. Further, in the following embodiments, when a reference is made to the number of elements, and the like (including number, numerical value, quantity, range, or the like), the number of elements, or the like is not limited to the specific number, but may be greater than or less than the specific number, unless otherwise specified, except for the case where the number is apparently limited to the specific number in principle, or except for other cases. Further, in the following embodiments, it is needless to say that the constitutional elements (including element steps, or the like) are not always essential, unless otherwise specified, and except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, and unless otherwise considered apparently in principle, or except for other cases. This also applies to the foregoing numerical values and ranges.

Below, the embodiments will be described in details by reference to the accompanying drawings. Incidentally, in all the drawings for describing the following embodiments, those having the same function are given the same reference signs and numerals, and a repeated description thereon is omitted. Further, in the following embodiments, a description on the same or similar part will not be repeated in principle unless otherwise required.

Further, in drawings for use in the embodiments, hatching may be omitted even in cross section for ease of understanding of the drawing. Whereas, hatching may be added even in plan view for ease of understanding of the drawing.

First Embodiment

<Regarding a Structure of a Semiconductor Device>

Each semiconductor device of the present embodiment and the following embodiments is a semiconductor device including a nonvolatile memory (nonvolatile storage element, flash memory, or nonvolatile semiconductor storage device). In the present embodiment and the following embodiments, a nonvolatile memory will be described with reference to a memory cell based on an n channel type MISFET (MISFET: Metal Insulator Semiconductor Field Effect Transistor). Further, the polarities (the polarity of each applied voltage and the polarity of carriers for write/erase/ read) in the present embodiment and the following embodiments are for describing the operation in the case of a memory cell based on an n channel type MISFET. When a memory cell is based on a p channel type MISFET, by inverting all the polarities of applied potentials, the conductivity type of carriers, and the like, it is possible to obtain the same operation in principle.

The semiconductor device of the present embodiment will be described by reference to the accompanying drawings.

Figure 2:
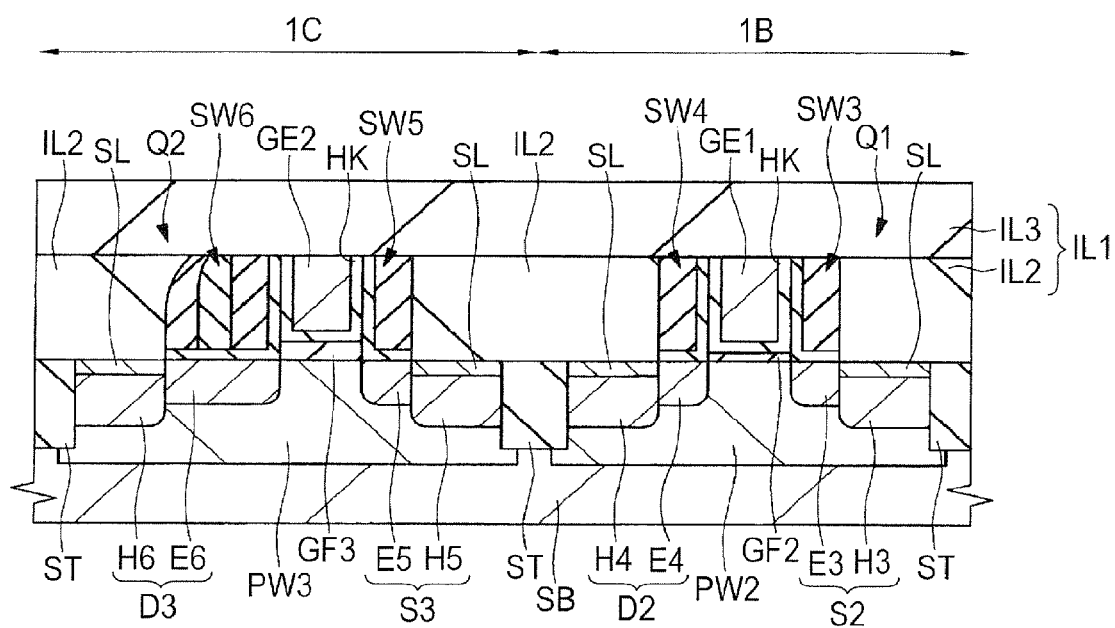
FIG. 2 is an essential part cross sectional view of the semiconductor device of one embodiment.
Figure 3:
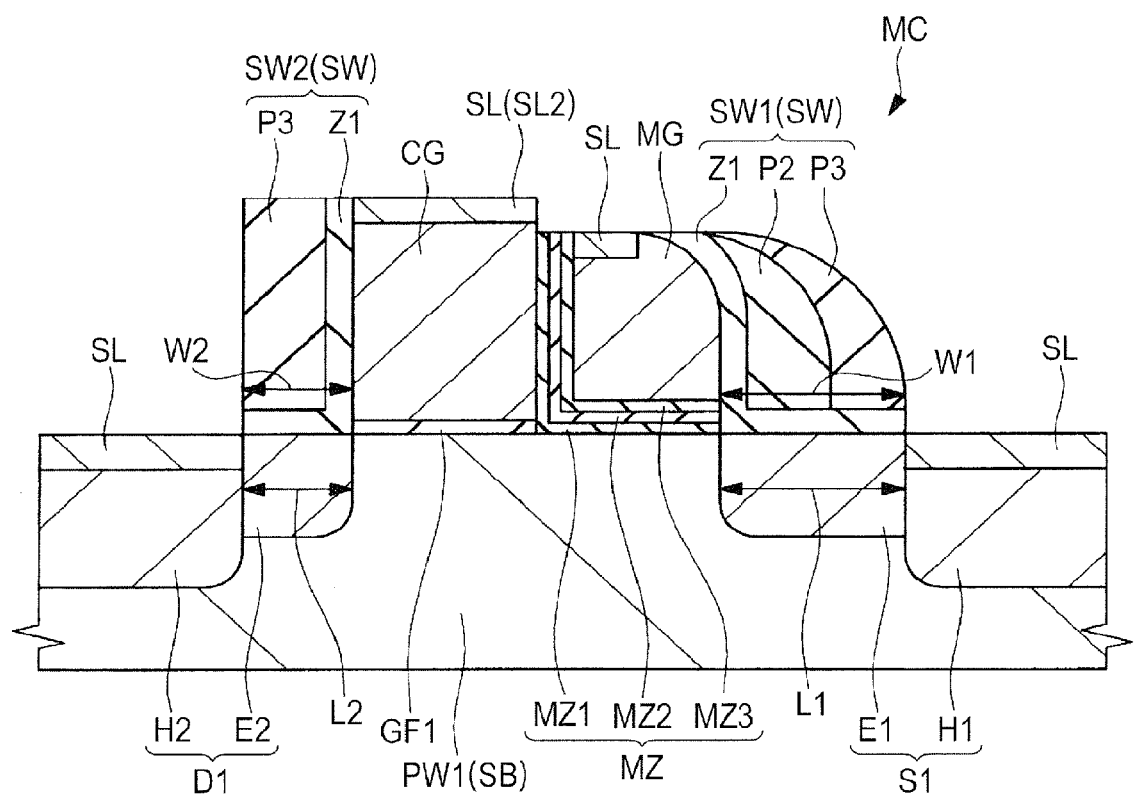
FIG. 3 is an essential part cross sectional view of the semiconductor device of one embodiment.
Figure 4:
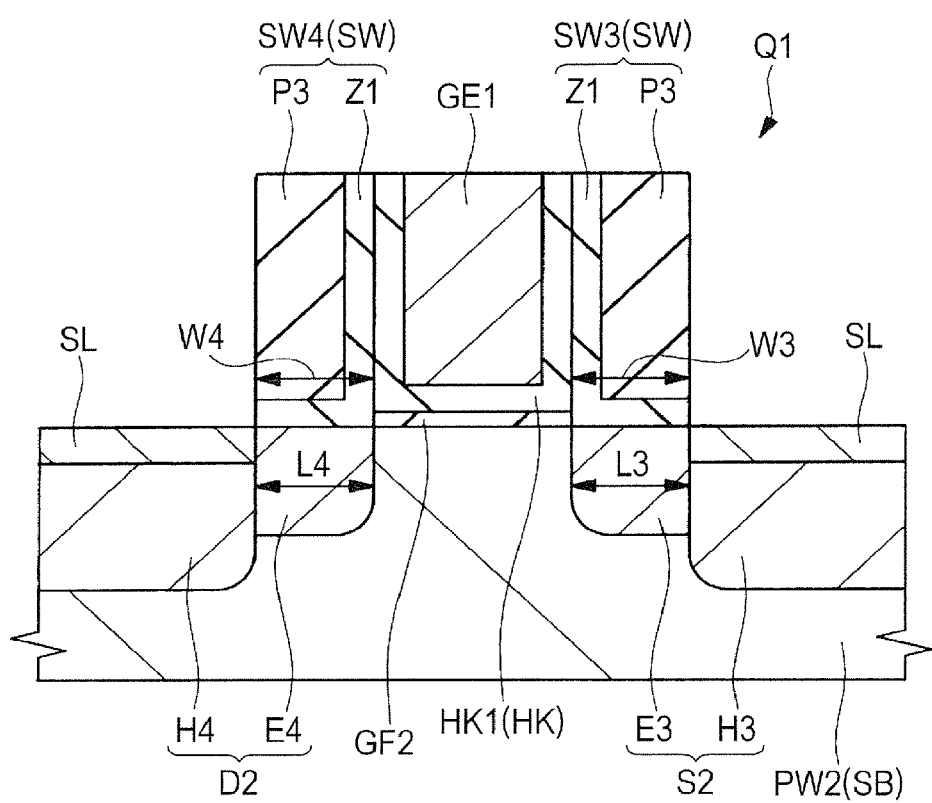
FIG. 4 is an essential part cross sectional view of the semiconductor device of one embodiment.
Figure 5:
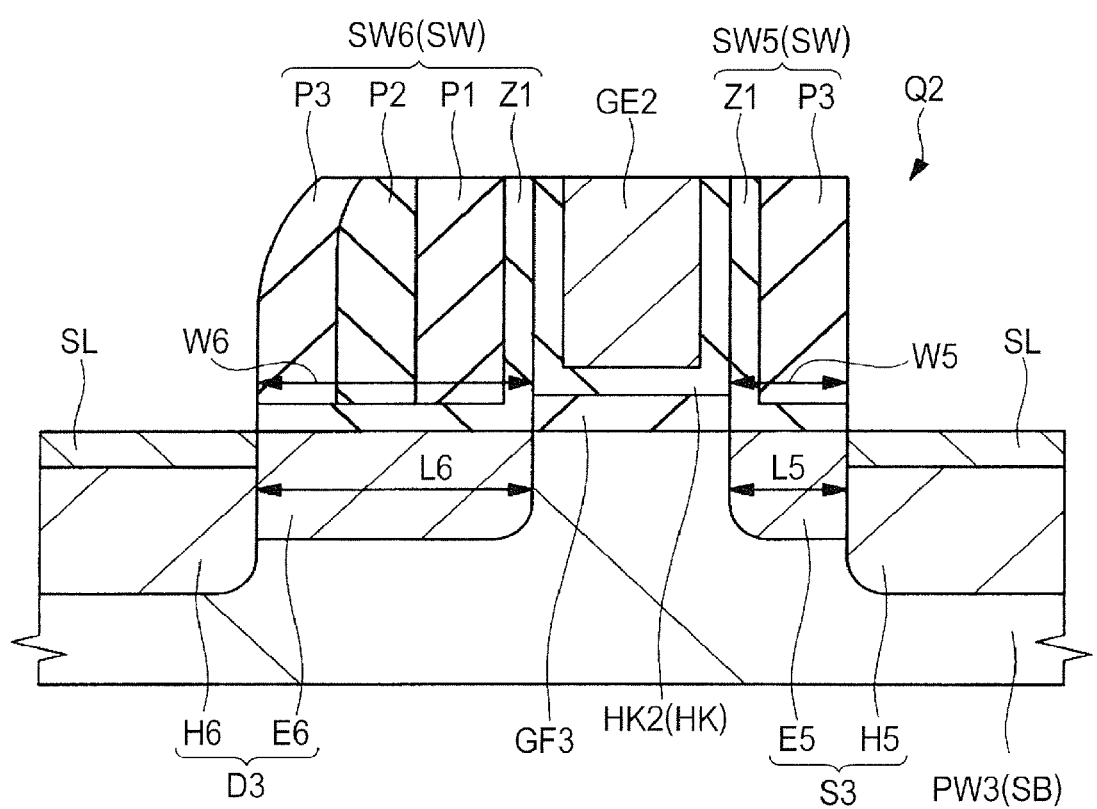
FIG. 5 is an essential part cross sectional view of the semiconductor device of one embodiment.
Figures 6, 7:
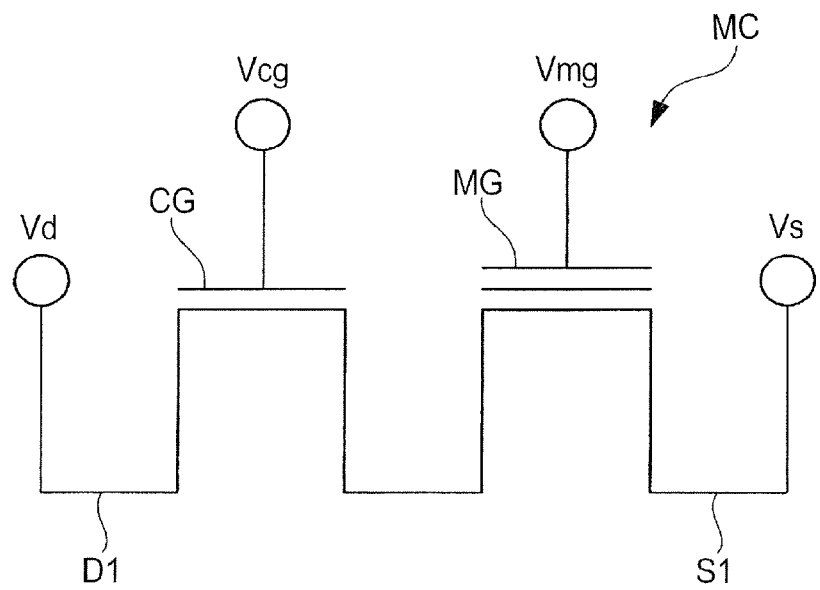
FIG. 6 is an equivalent circuit diagram of a memory cell.
FIG. 7 is a table showing one example of the application conditions of voltages to respective sites of a selection memory cell at the times of "write", "erase", and "read"

FIGS. 1 to 5 are each an essential part cross sectional view of the semiconductor device of the present embodiment. Of these, FIG. 1 shows an essential part cross sectional view of a memory cell region 1A. FIG. 2 shows an essential part cross sectional view of a low breakdown voltage MISFET formation region 1B and a high breakdown voltage MISFET formation region 1C. Whereas, FIG. 3 shows a cross sectional region corresponding to the right half part of FIG. 1 (i.e., a cross sectional region for one memory cell). FIG. 4 shows a cross sectional region corresponding to the right half part of FIG. 2 (i.e., the low breakdown voltage MISFET formation region 1B). FIG. 5 shows a cross sectional region corresponding to the left half part of FIG. 2 (i.e., the high breakdown voltage MISFET formation region 1C). However, for ease of understanding of the drawings, insulation films IL2 and IL3 shown in FIGS. 1 and 2 are not shown in FIGS. 3 to 5. FIG. 6 is an equivalent circuit diagram of the memory cell MC.

Herein, the memory cell region 1A is a region in which the memory cell of a nonvolatile memory is formed at the main surface of the semiconductor substrate SB. Whereas, the low breakdown voltage MISFET formation region 1B is a region in which a low breakdown voltage MISFET forming the peripheral circuit is formed at the main surface of the semiconductor substrate SB. Further, the high breakdown voltage MISFET formation region 1C is a region in which a high breakdown voltage MISFET forming the peripheral circuit is formed at the main surface of the semiconductor substrate SB. The breakdown voltage of the MISFET (Q2) formed in the high breakdown voltage MISFET formation region 1C is higher than the breakdown voltage of the MISFET (Q1) formed in the low breakdown voltage MISFET formation region 1B. The memory cell region 1A, the low breakdown voltage MISFET formation region 1B, and the high breakdown voltage MISFET formation region 1C are formed in the same semiconductor substrate SB. Namely, the memory cell region 1A, the low breakdown voltage MISFET formation region 1B, and the high breakdown voltage MISFET formation region 1C correspond to mutually different planar regions at the main surface of the same semiconductor substrate SB. Incidentally, the low breakdown voltage MISFET formation region 1B and the high breakdown voltage MISFET formation region 1C are not required to be adjacent to each other. However, for ease of understanding thereof, in the cross sectional view of FIG. 2, the high breakdown voltage MISFET formation region 1C is shown adjacent to the low breakdown voltage MISFET formation region 1B.

Herein, the peripheral circuits are circuits other than a nonvolatile memory, for example, a processor such as a CPU, a control circuit, a sense amplifier, a column decoder, a row decoder, and an input/output circuit. The MISFETs formed in the low breakdown voltage MISFET formation region 1B, and the MISFETs formed in the high breakdown voltage MISFET formation region 1C are both MISFETs for the peripheral circuits.

Further, the operation voltage of the high breakdown voltage MISFET Q2 formed in the high breakdown voltage MISFET formation region 1C is higher than the operation voltage of the low breakdown voltage MISFET Q1 formed in the low breakdown voltage MISFET formation region 1B. In other words, the high breakdown voltage MISFET Q2 is a MISFET operating at a first power supply voltage. The low breakdown voltage MISFET Q1 is a MISFET operating at a second power supply voltage lower than the first power supply voltage. As described later, the thickness of the gate insulation film of the high breakdown voltage MISFET Q2 is larger than the thickness of the gate insulation film of the low breakdown voltage MISFET Q1.

Incidentally, in the present embodiment, a description will be given to the case where each MISFET is an n channel type MISFET. However, a p channel type MISFET can also be formed by inverting the conductivity type. Alternatively, both of an n channel type MISFET and a p channel type MISFET can also be formed.

The semiconductor device of the present embodiment shown in FIGS. 1 to 5 is a semiconductor device including a nonvolatile memory.

In the semiconductor substrate (semiconductor wafer) SB formed of for example, a p type single crystal silicon having a specific resistance of about 1 to 10 Ωcm, an element isolation region ST for isolating elements is formed. In the memory cell region 1A, in an active region defined by the element isolation regions ST, a p type well PW1 is formed.

In the memory cell region 1A, the memory cell MC of the nonvolatile memory formed of a memory transistor and a control transistor is formed. In the memory cell region 1A, in actuality, a plurality of memory cells MC are formed in an array. FIG. 1 shows the cross sectional views of two memory cells MC having an $n^+$ type semiconductor region H2 (drain region) in common. The cross sectional view of one memory cell MC of these is shown in FIG. 3.

The memory cell MC of the nonvolatile memory formed in the memory cell region 1A is a split gate type memory cell, and includes two MISFETs of a control transistor having a control gate electrode CG and a memory transistor having a memory gate electrode MG, coupled to each other.

Herein, the MISFET (Metal Insulator Semiconductor Field Effect Transistor) having a gate insulation film including a charge accumulation part (charge accumulation layer), and the memory gate electrode MG is referred to as a memory transistor. Whereas, the MISFET having a gate insulation film and the control gate electrode CG is referred to as a control transistor. Therefore, the memory gate electrode MG is the gate electrode of the memory transistor. The control gate electrode CG is the gate electrode of the control transistor. The control gate electrode CG and the memory gate electrode MG are the gate electrodes forming the memory cell of the nonvolatile memory.

Incidentally, the control transistor is a transistor for memory cell selection, and hence can also be regarded as a selection transistor. Accordingly, the control gate electrode CG can also be regarded as a selection gate electrode. The memory transistor is a transistor for storage.

Below, the configuration of the memory cell MC will be described specifically.

As shown in FIGS. 1 and 3, the memory cell MC of the nonvolatile memory has n type semiconductor regions S1 and D1 for source and drain formed in the p type well PW1 of the semiconductor substrate SB, a control gate electrode CG formed over the semiconductor substrate SB (p type well PW), and a memory gate electrode MG formed over the semiconductor substrate SB (p type well PW1), and adjacent to the control gate electrode CG. The memory cell MC of the nonvolatile memory further has an insulation film (gate insulation film) GF1 formed between the control gate electrode CG and the semiconductor substrate SB (p type well PW1), and an insulation film MZ formed between the memory gate electrode MG and the semiconductor substrate SB (p type well PW1) and between the memory gate electrode MG and the control gate electrode CG. The memory cell MC of the nonvolatile memory further has sidewall spacers SW formed over the side surfaces of the memory gate electrode MG and the control gate electrode CG on the sides not adjacent to each other.

The control gate electrode CG and the memory gate electrode MG extend and are arranged side by side along the main surface of the semiconductor substrate SB with the insulation film MZ interposed between their respective opposed side surfaces. The direction of extension of the control gate electrode CG and the memory gate electrode MG is the direction perpendicular to each paper plane of FIGS. 1 and 3.

The control gate electrode CG and the memory gate electrode MG are formed over the semiconductor substrate SB (p type well PW1) between the semiconductor region D1 and the semiconductor region S1 via the insulation film GF1 or the insulation film MZ. The memory gate electrode MG is situated on the semiconductor region S1 side, and the control gate electrode CG is situated on the semiconductor region D1 side. However, the control gate electrode CG and the memory gate electrode MG are formed over the semiconductor substrate SB (p type well PW1) via the insulation film GF1 and the insulation film MZ, respectively.

The control gate electrode CG and the memory gate electrode MG are adjacent to each other with the insulation film MZ interposed therebetween. The memory gate electrode MG is formed in a sidewall spacer shape over the side surface (sidewall) of the control gate electrode CG via the insulation film MZ. Whereas, the insulation film MZ extends continuously over both the regions of the region between the memory gate electrode MG and the semiconductor substrate SB (p type well PW1), and the region between the memory gate electrode MG and the control gate electrode CG.

The insulation film GF1 formed between the control gate electrode CG and the semiconductor substrate SB (p type well PW1), namely, the insulation film GF1 under the control gate electrode CG functions as the gate insulation film of the control transistor. The insulation film GF1 can be formed of, for example, a silicon oxide film.

Further, the insulation film MZ extending in the region between the memory gate electrode MG and the semiconductor substrate SB (p type well PW1), and the region between the memory gate electrode MG and the control gate electrode CG can be regarded as a gate insulation film. However, the insulation film MZ between the memory gate electrode MG and the semiconductor substrate SB (p type well PW1), namely, the insulation film MZ under the memory gate electrode MG functions as the gate insulation film of the memory transistor. However, the insulation film MZ between the memory gate electrode MG and the control gate electrode CG functions as an insulation film for establishing an insulation (an electrical isolation) between the memory gate electrode MG and the control gate electrode CG.

The insulation film MZ is a lamination insulation film, and is formed of a lamination film having an insulation film MZ1, an insulation film MZ2 over the insulation film MZ1, and an insulation film MZ3 over the insulation film MZ2. Herein, the insulation film MZ1 is formed of a silicon oxide film (oxide film); the insulation film MZ2 is formed of a silicon nitride film (nitride film); and the insulation film MZ3 is formed of a silicon oxide film (oxide film).

Incidentally, in FIG. 1, for ease of understanding of the drawing, the lamination film formed of the insulation film MZ1, the insulation film MZ2, and the insulation film MZ3 is shown simply as the insulation film MZ. However, in actuality, as shown in FIG. 3, the insulation film MZ is formed of the lamination film of the insulation film MZ1, the insulation film MZ2, and the insulation film MZ3.

Of the insulation film MZ, the insulation film MZ2 is an insulation film having a charge accumulation function. Namely, of the insulation film MZ, the insulation film MZ2 is an insulation film for accumulating electric charges, and can function as a charge accumulation part (charge accumulation layer). In other words, the insulation film MZ2 is a trapping insulation film formed in the insulation film MZ. Herein, the trapping insulation film denotes an insulation film capable of accumulating electric charges. Thus, as the insulation film having a trap level, the insulation film MZ2 is used. For this reason, the insulation film MZ can be regarded as an insulation film having a charge accumulation part (herein, the insulation film MZ2).

Of the insulation film MZ, the insulation film MZ3 and the insulation film MZ1 situated over and under the insulation film MZ2 of a trapping insulation film can each function as a charge block layer (a charge confining layer) for confining electric charges in the trapping insulation film. By adopting a structure in which the insulation film MZ2 of the trapping insulation film is interposed between the insulation film MZ1 and the insulation film MZ3 each functioning as a charge block layer, it becomes possible to accumulate electric charges into the insulation film MZ2.

The insulation film MZ functions as the gate insulation film of the memory transistor, and has a charge holding (charge accumulating) function. Therefore, the insulation film MZ has a lamination structure of at least three layers so as to function as a gate insulation film having a charge holding function of the memory transistor. As compared with the potential barrier heights of the outer layers (herein, the insulation films MZ1 and MZ3) functioning as charge block layers, the potential barrier height of the inner layer (herein, the insulation film MZ2) functioning as a charge accumulation part is lower.

Respective band gaps of the insulation film MZ3 and the insulation film MZ1 are required to be larger than the band gap of the charge accumulation layer (herein, the insulation film MZ2) between the insulation film MZ3 and the insulation film MZ1. Namely, respective band gaps of the insulation film MZ1 and the insulation film MZ3 are larger than the band gap of the insulation film MZ2 of the trapping insulation film. With such a configuration, the insulation film MZ3 and the insulation film MZ1 interposing the insulation film MZ2 as a charge accumulation layer can each function as a charge block layer. A silicon oxide film has a larger band gap than the band gap of a silicon nitride film. For this reason, it is possible to adopt a silicon nitride film as the insulation film MZ2, and to adopt silicon oxide films as the insulation film MZ1 and the insulation film MZ3, respectively.

The semiconductor region S1 is a semiconductor region functioning as one of the source region or the drain region; and the semiconductor region D1 is a semiconductor region functioning as the other of the source region or the drain region. Herein, the semiconductor region S1 is a semiconductor region functioning as a source region; and the semiconductor region D1 is a semiconductor region functioning as a drain region. Incidentally, the designations of the source (source region) and the drain (drain region) of the memory cell MC denote the source (source region) and the drain (drain region) at the time of the read operation of the memory cell MC, respectively.

The semiconductor regions S1 and D1 are each formed of an n type semiconductor region doped with an n type impurity, and each include a LDD (lightly doped drain) structure. Namely, the semiconductor region S1 for source has an n$^-$ type semiconductor region E1, and an n$^+$ type semiconductor region H1 having a higher impurity concentration than that of the n$^-$ type semiconductor region E1. The semiconductor region D1 for drain has an n$^-$ type semiconductor region E2, and an n$^+$ type semiconductor region H2 having a higher impurity concentration than that of the n$^-$ type semiconductor region E2. The n$^+$ type semiconductor region H1 is larger in junction depth, and higher in impurity concentration than the n$^-$ type semiconductor region E1. Whereas, the n$^+$ type semiconductor region H2 is larger in junction depth and higher in impurity concentration than the n$^-$ type semiconductor region E2.

Over respective side surfaces (respective side surfaces not adjacent to each other) of the memory gate electrode MG and the control gate electrode CG, sidewall spacers (sidewalls or sidewall insulation films) SW formed of an insulator (insulation film) are formed, respectively. Namely, over the side surface (sidewall) of the memory gate electrode MG opposite to the side thereof adjacent to the control gate electrode CG via the insulation film MZ, and over the side surface (sidewall) of the control gate electrode CG opposite to the side thereof adjacent to the memory gate electrode MG via the insulation film MZ, sidewall spacers SW are formed, respectively.

Herein, the sidewall spacer SW formed over the side surface (sidewall) of the memory gate electrode MG is indicated with a reference sign SW1, and is referred to as a sidewall spacer SW1. Whereas, the sidewall spacer SW formed over the side surface (sidewall) of the control gate electrode CG is indicated with a reference sign SW2, and is referred to as a sidewall spacer SW2. The sidewall spacer SW1 is formed adjacent to the side surface of the memory gate electrode MG (the side surface opposite to the side thereof adjacent to the control gate electrode CG). Whereas, the sidewall spacer SW2 is formed adjacent to the side surface of the control gate electrode CG (the side surface opposite to the side thereof adjacent to the memory gate electrode MG).

The n$^-$ type semiconductor region E1 on the source side is formed in self-alignment with the side surface of the memory gate electrode MG. The n$^+$ type semiconductor region H1 is formed in self-alignment with the side surface of the sidewall spacer SW1 over the side surface of the memory gate electrode MG (the side surface opposite to the side thereof in contact with the memory gate electrode MG). For this reason, in the p type well PW1, the low-concentration n$^-$ type semiconductor region E1 is formed under the sidewall spacer SW1 over the side surface of the memory gate electrode MG. The high-concentration n$^+$ type semiconductor region H1 is formed outside the low-concentration n$^-$ type semiconductor region E1. Therefore, the low-concentration n$^-$ type semiconductor region E1 is formed in such a manner as to be adjacent to the channel region of the memory transistor. The high-concentration n$^+$ type semiconductor region H1 is formed in such a manner as to be adjacent to the low-concentration n$^-$ type semiconductor region E1, and to be separated from the channel region of the memory transistor by the n$^-$ type semiconductor region E1.

The n$^-$ type semiconductor region E1 is interposed between the n$^+$ type semiconductor region H1 and the channel region of the memory transistor.

The drain-side n$^-$ type semiconductor region E2 is formed in self-alignment with the side surface of the control gate electrode CG. The n$^+$ type semiconductor region H2 is formed in self-alignment with the side surface of the sidewall spacer SW2 over the side surface of the control gate electrode CG (the side surface opposite to the side thereof in contact with the control gate electrode CG). For this reason, in the p type well PW1, the low-concentration n$^-$ type semiconductor region E2 is formed under the sidewall spacer SW2 over the side surface of the control gate electrode CG. The high-concentration n$^+$ type semiconductor region H2 is formed outside the low-concentration n$^-$ type semiconductor region E2. Therefore, the low-concentration n$^-$ type semiconductor region E2 is formed in such a manner as to be adjacent to the channel region of the control transistor. The high-concentration n$^+$ type semiconductor region H2 is formed in such a manner as to be adjacent to the low-concentration n$^-$ type semiconductor region E2, and to be separated from the channel region of the control transistor by the n$^-$ type semiconductor region E2. The n$^-$ type semiconductor region E2 is interposed between the n$^+$ type semiconductor region H2 and the channel region of the control transistor.

In the p type well PW1, the channel region of the memory transistor is formed under the insulation film MZ under the memory gate electrode MG; and the channel region of the control transistor is formed under the insulation film GF1 under the control gate electrode CG. In the channel formation region of the control transistor under insulation film GF1 under the control gate electrode CG, a semiconductor region (a p type semiconductor region or an n type semiconductor region) for adjusting the threshold voltage of the control transistor is formed, if required. Whereas, in the channel formation region of the memory transistor under the insulation film MZ under the memory gate electrode MG, a semiconductor region (a p type semiconductor region or an n type semiconductor region) for adjusting the threshold voltage of the memory transistor is formed, if required.

The control gate electrode CG is formed of a conductive film, and is formed of a silicon film such as an n type polysilicon film. Specifically, the control gate electrode CG is formed of a patterned silicon film.

The memory gate electrode MG is formed of a conductive film, and is formed of a silicon film such as an n type polysilicon film. Specifically, the memory gate electrode MG is formed in the following manner: the silicon film formed over the semiconductor substrate SB in such a manner as to cover the control gate electrode CG is anisotropically etched (etched back); as a result, the silicon film is left over the side surface of the control gate electrode CG via the insulation film MZ. Accordingly, the memory gate electrode MG is formed in a sidewall spacer shape over one side surface of the control gate electrode CG via the insulation film MZ.

Then, the configuration of the MISFET Q1 formed in the low breakdown voltage MISFET formation region 1B will be specifically described.

As shown in FIGS. 2 and 4, in the low breakdown voltage MISFET formation region 1B, a p type well PW2 is formed in the active region defined by the element isolation regions ST. The MISFET Q1 formed in the low breakdown voltage MISFET formation region 1B has n type semiconductor regions S2 and D2 for source and drain formed in the p type well PW2 of the semiconductor substrate SB, and a gate electrode GE1 formed over the semiconductor substrate SB (p type well PW2) via the insulation films GF2 and HK1.

The gate electrode GE1 is formed over the semiconductor substrate SB (p type well PW2) between the semiconductor region D2 and the semiconductor region S2 via the insulation films GF2 and HK1.

The semiconductor region S2 is a semiconductor region functioning as one of the source region or the drain region of the MISFET Q1. The semiconductor region D2 is a semiconductor region functioning as the other of the source region or the drain region. Herein, the semiconductor region S2 is a semiconductor region functioning as the source region. The semiconductor region D2 is a semiconductor region functioning as a drain region.

Over each side surface (sidewall) of the gate electrode GE1, a sidewall spacer SW formed of an insulator (insulation film) is formed.

Herein, the sidewall spacer SW formed over the side surface (sidewall) on the source side of the gate electrode GE1 is indicated with a reference sign SW3, and is referred to as a sidewall spacer SW3. Whereas, the sidewall spacer SW formed over the side surface (sidewall) on the drain side of the gate electrode GE1 is indicated with a reference sign SW4, and is referred to as a sidewall spacer SW4. The sidewall spacer SW3 is formed adjacent to the side surface of the gate electrode GE1 on the semiconductor region S2 side (source side). The sidewall spacer SW4 is formed adjacent to the side surface of the gate electrode GE1 on the semiconductor region D2 side (drain side). In the gate electrode GE1, the side surface on the side on which the sidewall spacer SW3 is formed, and the side surface on the side on which the sidewall spacer SW4 is formed are opposite to each other.

Between the gate electrode GE1 and the semiconductor substrate SB (p type well PW2), the lamination film of the insulation film GF2 and the insulation film HK1 is interposed. The lower side (the semiconductor substrate SB side) is the insulation film GF2 side, and the upper side (the gate electrode GE1 side) is the insulation film HK1 side. The lamination film of the insulation film GF2 and the insulation film HK1 interposed between the gate electrode GE1 and the semiconductor substrate SB (p type well PW2) functions as the gate insulation film of the MISFET Q1.

The insulation film GF2 is formed of, for example, a silicon oxide film, and the insulation film HK1 is formed of a high dielectric constant insulation film. Herein, the high dielectric constant insulation film means an insulation film having a higher dielectric constant than that of a silicon nitride film. Examples thereof may include a hafnium oxide film, an aluminum oxide film (alumina), or a tantalum oxide film.

The gate electrode GE1 is formed of a conductive film, herein, is formed of a metal film, and is a so-called metal gate electrode.

Incidentally, in the present application, when a reference is made to the metal film forming the gate electrode, the metal film denotes a conductive film showing metal conduction, and also includes not only an elementary metal film (pure metal film), or an alloy film, but also a metal compound film showing metal conduction (such as a metal nitride film or a metal carbide film). For this reason, the gate electrode GE1, a gate electrode GE2 described later, and a control gate electrode CG1 described later are each formed of a conductive film showing metal conduction, and each have a resistivity as low as that of the metal grade.

Although will be particularly described later, a gate electrode GE3 described later is removed, and then, the gate electrode GE1 and the insulation film HK1 are embedded in the removed region. Accordingly, the insulation film GF2 is formed in the region interposed between the gate electrode GE1 and the semiconductor substrate SB (p type well PW2). However, the insulation film HK1 is formed not only in the region interposed between the gate electrode GE1 and the semiconductor substrate SB (p type well PW2), but also in the region interposed between the gate electrode GE1 and the sidewall spacer SW3, and the region interposed between the gate electrode GE1 and the sidewall spacer SW4. Namely, the insulation film HK1 continuously extends over between the gate electrode GE1 and the insulation film GF2 over the semiconductor substrate SB (p type well PW2), between the gate electrode GE1 and the sidewall spacer SW3, and between the gate electrode GE1 and the sidewall spacer SW4. Therefore, the sidewall spacer SW3 is formed over the side surface of the gate electrode GE1 on the source side via the insulation film HK1; and the sidewall spacer SW4 is formed over the side surface of the gate electrode GE1 on the drain side via the insulation film HK1.

The semiconductor regions S2 and D2 are each formed of an n type semiconductor region doped with an n type impurity, and each have a LDD structure. Namely, the semiconductor region S2 for source has an $n^-$ type semiconductor region E3, and an $n^+$ type semiconductor region H3 having a higher impurity concentration than that thereof. The semiconductor region D2 for drain has an $n^-$ type semiconductor region E4, and an $n^+$ type semiconductor region H4 having a higher impurity concentration than that thereof. The $n^+$ type semiconductor region H3 is larger in junction depth, and higher in impurity concentration than the $n^-$ type semiconductor region E3. Whereas, the $n^+$ type semiconductor region H4 is larger in junction depth, and higher in impurity concentration than the $n^-$ type semiconductor region E4.

In the p type well PW2, the low-concentration $n^-$ type semiconductor region E3 is formed under the sidewall spacer SW3 over one side surface of the gate electrode GE1. The high-concentration $n^+$ type semiconductor region H3 is formed outside the low-concentration $n^-$ type semiconductor region E3. Whereas, in the p type well PW2, the low-concentration $n^-$ type semiconductor region E4 is formed under the sidewall spacer SW4 over the other side surface of the gate electrode GE1. The high-concentration $n^+$ type semiconductor region H4 is formed outside the low-concentration $n^-$ type semiconductor region E4. Therefore, the low-concentration $n^-$ type semiconductor region E3 and the $n^-$ type semiconductor region E4 are formed in such a manner as to be adjacent to the channel region of the MISFET Q1, and to interpose the channel region therebetween in the channel length direction. Then, the high-concentration $n^+$ type semiconductor region H3 is formed in such a manner as to be adjacent to the low-concentration $n^-$ type semiconductor region E3, and to be separated from the channel region of the MISFET Q1 by the $n^-$ type semiconductor region E3. Further, the high-concentration $n^+$ type semiconductor region H4 is formed in such a manner as to be adjacent to the low-concentration $n^-$ type semiconductor region E4, and to be separated from the channel region of the MISFET Q1 by the $n^-$ type semiconductor region E4. Accordingly, the $n^-$ type semiconductor region E3 is interposed between the $n^+$ type semiconductor region H3 and the channel region of the MISFET Q1. The $n^-$ type semiconductor region E4 is interposed between the $n^+$ type semiconductor region H4 and the channel region of the MISFET Q1.

In the p type well PW2, the channel region of the MISFET Q1 is formed under the insulation films HK1 and GF2 under the gate electrode GE1. In the channel formation region of the MISFET Q1 under the insulation films HK1 and GF2 under the gate electrode GE1, a semiconductor region (a p type semiconductor region or an n type semiconductor region) for adjusting the threshold voltage of the MISFET Q1 is formed, if required.

Then, the configuration of the MISFET Q2 formed in the high breakdown voltage MISFET formation region 1C will be described specifically.

As shown in FIGS. 2 and 5, in the high breakdown voltage MISFET formation region 1C, a p type well PW3 is formed in an active region defined by the element isolation regions ST. The MISFET Q2 formed in the high breakdown voltage MISFET formation region 1C has n type semiconductor regions S3 and D3 for source and drain formed in the p type well PW3 of the semiconductor substrate SB, and a gate electrode GE2 formed over the semiconductor substrate SB (p type well PW3) via the insulation films GF3 and HK2.

The gate electrode GE2 is formed over the semiconductor substrate SB (p type well PW3) between the semiconductor region D3 and the semiconductor region S3 via the insulation films GF3 and HK2 (gate insulation films).

The semiconductor region S3 is a semiconductor region functioning as one of the source region or the drain region of the MISFET Q2. The semiconductor region D3 is a semiconductor region functioning as the other of the source region or the drain region. Herein, the semiconductor region S3 is a semiconductor region functioning as a source region. The semiconductor region D3 is a semiconductor region functioning as a drain region.

Over each side surface (sidewall) of the gate electrode GE2, a sidewall spacer SW formed of an insulator (insulation film) is formed.

Herein, the sidewall spacer SW formed over the side surface (sidewall) of the gate electrode GE2 on the source side is indicated with a reference sign SW5, and is referred to as a sidewall spacer SW5. Whereas, the sidewall spacer SW formed over the side surface (sidewall) of the gate electrode GE2 on the drain side is indicated with a reference sign SW6, and is referred to as a sidewall spacer SW6. The sidewall spacer SW5 is formed adjacent to the side surface of the gate electrode GE2 on the semiconductor region S3 side (source side). The sidewall spacer SW6 is formed adjacent to the side surface of the gate electrode GE2 on the semiconductor region D3 side (drain side). In the gate electrode GE2, the side surface thereof over which the sidewall spacer SW5 is formed, and the side surface thereof over which the sidewall spacer SW6 is formed are opposite to each other.

Between the gate electrode GE2 and the semiconductor substrate SB (p type well PW3), the lamination film of the insulation film GF3 and the insulation film HK2 is interposed. The lower side (semiconductor substrate SB side) is the insulation film GF3 side. The upper side (gate electrode GE2 side) is the insulation film HK2 side. The lamination film of the insulation film GF3 and the insulation film HK2 interposed between the gate electrode GE2 and the semiconductor substrate SB (p type well PW3) functions as the gate insulation film of the MISFET Q2.

The insulation film GF3 is formed of, for example, a silicon oxide film. The insulation film HK2 is formed of a high dielectric constant insulation film. The thickness of the insulation film GF3 is larger than the thickness of the insulation film GF2. The insulation film HK2 and the insulation film HK1 are formed of the common insulation film. Accordingly, the insulation film HK2 and the insulation film HK1 are formed of the same insulation material. Further, the thickness of the insulation film HK2 and the thickness of the insulation film HK1 are nearly equal to each other. For this reason, the total thickness of the insulation film GF3 and the insulation film HK2 interposed between the gate electrode GE2 and the semiconductor substrate SB (p type well PW3) (i.e., the thickness of the gate insulation film of the MISFET Q2) is larger than the total thickness of the insulation film GF2 and the insulation film HK1 interposed between the gate electrode GE1 and the semiconductor substrate SB (p type well PW2) (i.e., the thickness of the gate insulation film of the MISFET Q1).

The gate electrode GE2 is formed of a conductive film, and, herein, is formed of a metal film (a conductive film showing a metal conduction), and is a so-called metal gate electrode.

Although will be particularly described later, after removing a gate electrode GE4 described later, the gate electrode GE2 and the insulation film HK2 are embedded in the removed region. For this reason, the insulation film GF3 is formed in the region interposed between the gate electrode GE2 and the semiconductor substrate SB (p type well PW3). Whereas, the insulation film HK2 is formed not only in the region interposed between the gate electrode GE2 and the semiconductor substrate SB (p type well PW3), but also in the region interposed between the gate electrode GE2 and the sidewall spacer SW5, and the region interposed between the gate electrode GE2 and the sidewall spacer SW6. Namely, the insulation film HK2 extends continuously over between the gate electrode GE2 and the insulation film GF3 over the semiconductor substrate SB (p type well PW3), between the gate electrode GE2 and the sidewall spacer SW5, and between the gate electrode GE2 and the sidewall spacer SW6. Therefore, the sidewall spacer SW5 is formed over the side surface of the gate electrode GE2 on the source side via the insulation film HK2. The sidewall spacer SW6 is formed over the side surface of the gate electrode GE2 on the drain side via the insulation film HK2.

The semiconductor regions S3 and D3 are each formed of an n type semiconductor region doped with an n type impurity, and each have a LDD structure. Namely, the semiconductor region S3 for source has an $n^-$ type semiconductor region E5, and an $n^+$ type semiconductor region H5 having a higher impurity concentration than that thereof. The semiconductor region D3 for drain has an $n^-$ type semiconductor region E6, and an $n^+$ type semiconductor region H6 having a higher impurity concentration than that thereof. The $n^+$ type semiconductor region H5 is larger in junction depth, and higher in impurity concentration than the $n^-$ type semiconductor region E5. Whereas, the n type semiconductor region H6 is larger in junction depth, and higher in impurity concentration than the $n^-$ type semiconductor region E6.

In the p type well PW3, the low-concentration $n^-$ type semiconductor region E5 is formed under the sidewall spacer SW5 over one side surface of the gate electrode GE2. The high-concentration $n^+$ type semiconductor region H5 is formed outside the low-concentration $n^-$ type semiconductor region E5. Whereas, in the p type well PW3, the low-concentration $n^-$ type semiconductor region E6 is formed under the sidewall spacer SW6 over the other side surface of the gate electrode GE2. The high-concentration $n^+$ type semiconductor region H6 is formed outside the low-concentration $n^-$ type semiconductor region E6. Therefore, the low-concentration $n^-$ type semiconductor region E5 and the $n^-$ type semiconductor region E6 are formed in such a manner as to be adjacent to the channel region of the MISFET Q2, and to interpose the channel region therebetween in the channel length direction. Then, the high-concentration n⁺ type semiconductor region H5 is formed in such a manner as to be adjacent to the low-concentration n⁻ type semiconductor region E5, and to be separated from the channel region of the MISFET Q2 by the n⁻ type semiconductor region E5. Whereas, the high-concentration n⁺ type semiconductor region H6 is formed in such a manner as to be adjacent to the low-concentration n⁻ type semiconductor region E6, and to be separated from the channel region of the MISFET Q2 by the n⁻ type semiconductor region E6. Accordingly, the n⁻ type semiconductor region E5 is interposed between the n⁺ type semiconductor region H5 and the channel region of the MISFET Q2; and the n⁻ type semiconductor region E6 is interposed between the n⁺ type semiconductor region H6 and the channel region of the MISFET Q2.

In the p type well PW3, the channel region of the MISFET Q2 is formed under the insulation films HK2 and GF3 under the gate electrode GE2. In the channel formation region of the MISFET Q2 under the insulation films HK2 and GF3 under the gate electrode GE2, a semiconductor region (a p type semiconductor region or an n type semiconductor region) for adjusting the threshold voltage of the MISFET Q2 is formed, if required.

At the top (top surface) of the memory gate electrode MG, the top (top surface) of the control gate electrode CG, and respective tops (top surfaces) of the n⁺ type semiconductor regions H1, H2, H3, H4, H5, and H6, metal silicide layers SL are formed by a Salicide: Self Aligned Silicide technology, or the like. The metal silicide layer SL is formed of, for example, a cobalt silicide layer, a nickel silicide layer, or a platinum-doped nickel silicide layer. The metal silicide layer SL can reduce the diffusion resistance or the contact resistance.

The combination of the silicon film forming the control gate electrode CG, and the metal silicide layer SL thereover can also be regarded as the control gate electrode CG. Whereas, the combination of the silicon film forming the memory gate electrode MG, and the metal silicide layer SL thereover can also be regarded as the memory gate electrode MG. Alternatively, from the viewpoint of minimizing the short circuit between the memory gate electrode MG and the control gate electrode CG, the metal silicide layer SL may not be formed at the top of one, or both of the memory gate electrode MG and the control gate electrode CG.

Over the semiconductor substrate SB, an interlayer insulation film IL1 is formed as an insulation film in such a manner as to cover the control gate electrode CG, the memory gate electrode MG, the gate electrode GE1, the gate electrode GE2, and the sidewall spacers SW. Herein, the interlayer insulation film IL1 is formed of an insulation film IL2, and an insulation film IL3 over the insulation film IL2. The top surface of the interlayer insulation film IL1, namely, the insulation film IL2 is planarized.

In the interlayer insulation film IL1, contact holes described later are formed. In each contact hole, a plug PG described later is formed. Over the interlayer insulation film IL1 including the plugs PG embedded therein, an insulation film IL6 described later is formed. In a wire trench in the insulation film IL6, a wire M1 described later is formed, but is herein not shown and not described.

In the present embodiment, in the memory cell region 1A, the width W1 of the sidewall spacer SW1 formed over the side surface of the memory gate electrode MG is larger than the width W2 of the sidewall spacer SW2 formed over the side surface of the control gate electrode CG (W1>W2). Whereas, in the low breakdown voltage MISFET formation region 1B, the width W3 of the sidewall spacer SW3 formed over the side surface of the gate electrode GE1 on the source side, and the width W4 of the sidewall spacer SW4 formed over the side surface of the gate electrode GE1 on the drain side are nearly equal to each other (W3=W4). Whereas, in the high breakdown voltage MISFET formation region 1C, the width W6 of the sidewall spacer SW6 formed over the side surface of the gate electrode GE2 on the drain side is larger than the width W5 of the sidewall spacer SW5 formed over the side surface of the gate electrode GE2 on the source side (W6>W5).

Herein, the width W1 of the sidewall spacer SW1 is the width (dimension) of the sidewall spacer SW1 in the gate length direction of the memory gate electrode MG, and corresponds to the width (dimension) of the sidewall spacer SW1 when measured in a direction in parallel with the gate length direction of the memory gate electrode MG. Whereas, the width W2 of the sidewall spacer SW2 is the width (dimension) of the sidewall spacer SW2 in the gate length direction of the control gate electrode CG, and corresponds to the width (dimension) of the sidewall spacer SW2 when measured in a direction in parallel with the gate length direction of the control gate electrode CG. Further, respective widths W3 and W4 of the sidewall spacers SW3 and SW4 are respective widths (dimensions) of the sidewall spacers SW3 and SW4 in the gate length direction of the gate electrode GE1, respectively, and correspond to respective widths (dimensions) of the sidewall spacers SW3 and SW4 when measured in a direction in parallel with the gate length direction of the gate electrode GE1, respectively. Furthermore, respective widths W5 and W6 of the sidewall spacers SW5 and SW6 are respective widths (dimensions) of the sidewall spacers SW5 and SW6 in the gate length direction of the gate electrode GE2, respectively, and correspond to respective widths (dimensions) of the sidewall spacers SW5 and SW6 when measured in a direction in parallel with the gate length direction of the gate electrode GE2, respectively.

The width W1 of the sidewall spacer SW1 is larger than the width W2 of the sidewall spacer SW2. This is because the number of layers of the insulation films forming the sidewall spacer SW1 is larger than the number of layers of the insulation films forming the sidewall spacer SW2. Specifically, the sidewall spacer SW1 is formed of the insulation film Z1, the sidewall spacer (sidewall insulation film) P2, and the sidewall spacer (sidewall insulation film) P3. The sidewall spacer SW2 is formed of the insulation film Z1 and the sidewall spacer (sidewall insulation film) P3. In other words, the width W1 of the sidewall spacer SW1 corresponds to the total of the thickness of the insulation film Z1, the thickness of the sidewall spacer P2, and the thickness of the sidewall spacer P3. The width W2 of the sidewall spacer SW2 corresponds to the total of the thickness of the insulation film Z1 and the thickness of the sidewall spacer P3. Accordingly, the width W1 is larger than the width W2 by the thickness of the sidewall spacer P2.

Whereas, the width W3 of the sidewall spacer SW3 and the width W4 of the sidewall spacer SW4 are nearly equal to each other. This is because the number of layers of the insulation films forming the sidewall spacer SW3 is equal to the number of layers of the insulation films forming the sidewall spacer SW4. Specifically, the sidewall spacer SW3 is formed of the insulation film Z1 and the sidewall spacer (sidewall insulation film) P3; and the sidewall spacer SW4 is formed of the insulation film Z1 and the sidewall spacer (sidewall insulation film) P3. In other words, the thickness W3 of the sidewall spacer SW3 corresponds to the total of the thickness of the insulation film Z1 and the thickness of the sidewall spacer P3; and the thickness W4 of the sidewall spacer SW4 corresponds to the total of the thickness of the insulation film Z1 and the thickness of the sidewall spacer P3.

Further, the width W6 of the sidewall spacer SW6 is larger than the width W5 of the sidewall spacer SW5. This is because the number of layers of insulation films forming the sidewall spacer SW6 is larger than the number of layers of insulation films forming the sidewall spacer SW5. Specifically, the sidewall spacer SW5 is formed of the insulation film Z1 and the sidewall spacer (sidewall insulation film) P3. The sidewall spacer SW6 is formed of the insulation film Z1, the sidewall spacer (sidewall insulation film) P1, the sidewall spacer (sidewall insulation film) P2, and the sidewall spacer (sidewall insulation film) P3. In other words, the width W5 of the sidewall spacer SW5 corresponds to the total of the thickness of the insulation film Z1 and the thickness of the sidewall spacer P3. The width W6 of the sidewall spacer SW6 corresponds to the total of the thickness of the insulation film Z1, the thickness of the sidewall spacer P1, the thickness of the sidewall spacer P2, and the thickness of the sidewall spacer P3. Accordingly, the width W6 is larger than the width W5 by the thicknesses of the sidewall spacers P1 and P2.

The difference between the width W1 of the sidewall spacer SW1 and the width W2 of the sidewall spacer SW2 can be set at, for example, about 10 to 30 nm. Whereas, the difference between the width W6 of the sidewall spacer SW6 and the width W5 of the sidewall spacer SW5 can be set at, for example, about 40 to 80 nm.

Further, reflecting the fact that the width W1 of the sidewall spacer SW1 is larger than the width W2 of the sidewall spacer SW2 (W1>W2), the dimension L1 of the n⁻ type semiconductor region E1 is larger than the dimension L2 of the n⁻ type semiconductor region E2 (L1>L2). Whereas, reflecting the fact that the width W3 of the sidewall spacer SW3 and the width W4 of the sidewall spacer SW4 are nearly equal to each other (W1=W2), the dimension L3 of the n⁻ type semiconductor region E3 and the dimension L4 of the n⁻ type semiconductor region E4 are nearly equal to each other (L3=L4). Further, reflecting the fact that the width W6 of the sidewall spacer SW6 is larger than the width W5 of the sidewall spacer SW5 (W6>W5), the dimension L6 of the n type semiconductor region E6 is larger than the dimension L5 of the n⁻ type semiconductor region E5 (L6>L5).

Herein, the dimension L1 of the n⁻ type semiconductor region E1 is the dimension (length) of the n⁻ type semiconductor region E1 in the gate length direction of the memory gate electrode MG, and corresponds to the dimension (length) of the n⁻ type semiconductor region E1 when measured in a direction in parallel with the gate length direction of the memory gate electrode MG (i.e., the channel length direction of the memory transistor). Whereas, the dimension L2 of the n⁻ type semiconductor region E2 is the dimension (length) of the n⁻ type semiconductor region E2 in the gate length direction of the control gate electrode CG, and corresponds to the dimension (length) of the n⁻ type semiconductor region E2 when measured in a direction in parallel with the gate length direction of the control gate electrode CG (i.e., the channel length direction of the control transistor). Further, the dimension L3 of the n⁻ type semiconductor region E3 and the dimension L4 of the n⁻ type semiconductor region E4 are respective dimensions (lengths) of the n⁻ type semiconductor regions E3 and E4 in the gate length direction of the gate electrode GE1, respectively, and correspond to respective dimensions (lengths) of the n⁻ type semiconductor region E3 and the n⁻ type semiconductor region E4 when measured in a direction in parallel with the gate length direction of the gate electrode GE1 (i.e., the channel length direction of the MISFET Q1), respectively. Further, the dimension L5 of the n⁻ type semiconductor region E5 and the dimension L6 of the n⁻ type semiconductor region E6 are respective dimensions (lengths) of the n⁻ type semiconductor regions E5 and E6 in the gate length direction of the gate electrode GE2, respectively, and correspond to respective dimensions (lengths) of the n⁻ type semiconductor region E5 and the n⁻ type semiconductor region E6 when measured in a direction in parallel with the gate length direction of the gate electrode GE2 (i.e., the channel length direction of the MISFET Q2), respectively.

<Regarding Operation of Semiconductor Device>

FIG. 7 is a table showing one example of the application conditions of voltages to respective sites of a selection memory cell at the times of "write", "erase", and "read". The table of FIG. 7 shows voltages (Vd, Vcg, Vmg, Vs, and Vb) to be applied to respective sites of the memory cell (selection memory cell) as shown in FIGS. 1, 3 and 6 at respective times of "write", "erase", and "read". Herein, the voltage Vmg is the voltage Vmg to be applied to the memory gate electrode MG. Whereas, the voltage Vs is the voltage Vs to be applied to the semiconductor region S1 (source region). Further, the voltage Vcg is the voltage Vcg to be applied to the control gate electrode CG. Still further, the voltage Vd is the voltage Vd to be applied to the semiconductor region D1 (drain region). Whereas, the base voltage Vb is the base voltage Vb to be applied to the p type well PW1.

Incidentally, in the memory cell MC, the voltage Vs to be applied to the semiconductor region S1 is actually applied via a plug (corresponding to a plug PG described later) arranged over the n⁺ type semiconductor region H1 to the high-concentration n⁺ type semiconductor region H1 forming the semiconductor region S1. Whereas, the voltage Vd to be applied to the semiconductor region D1 is actually applied via a plug (corresponding to a plug PG described later) arranged over the n⁺ type semiconductor region H2 to the high-concentration n⁺ type semiconductor region H2 forming the semiconductor region D1. Further, in the low breakdown voltage MISFET Q1, the voltage to be applied to the semiconductor region S2 is actually applied via a plug (corresponding to a plug PG described later) arranged over the n⁺ type semiconductor region H3 to the high-concentration n⁺ type semiconductor region H3 forming the semiconductor region S2. Still further, the voltage to be applied to the semiconductor region D2 is actually applied via a plug (corresponding to a plug PG described later) arranged over the n⁺ type semiconductor region H4 to the high-concentration n⁺ type semiconductor region H4 forming the semiconductor region D2. Whereas, in the high breakdown voltage MISFET Q2, the voltage to be applied to the semiconductor region S3 is actually applied via a plug (corresponding to a plug PG described later) arranged over the n⁺ type semiconductor region H5 to the high-concentration n⁺ type semiconductor region H5 forming the semiconductor region S3. Further, the voltage to be applied to the semiconductor region D3 is actually applied via a plug (corresponding to a plug PG described later) arranged over the n⁺ type semiconductor region H6 to the high-concentration n⁺ type semiconductor region H6 forming the semiconductor region D3.

Further, those shown in the table of FIG. 7 are preferable examples of the voltage application conditions, and are not exclusive, and can be variously changed, if required. Further, in the present embodiment, injection of electrons into the insulation film MZ2 (herein, the insulation film MZ2) in the insulation film MZ of the memory transistor is defined as "write", and injection of holes is defined as "erase".

For the write method, a write method referred to as a so-called SSI (Source Side Injection) method can be preferably used in which write is performed by hot electron injection by source side injection.

With write by the SSI method, for example, the voltages as shown in the row of "write" of FIG. 7 are applied to respective sites of the selection memory cell to perform write, and, electrons are injected into the charge accumulation part (herein, the insulation film MZ2) in the insulation film MZ of the selection memory cell. As a result, write is performed. The applied voltages at this step hold the relation that the voltage Vs is higher than the voltage Vd, and that the voltage Vmg is higher than the voltage Vs (Vmg>Vs>Vd). At this step, hot electrons are generated in the channel region (between the source and the drain) under between two gate electrodes (the memory gate electrode MG and the control gate electrode CG). The hot electrons are injected into the charge accumulation part (herein, the insulation film MZ2) in the insulation film MZ under the memory gate electrode MG. For this reason, with the SSI method, electrons are injected into the control gate electrode CG side of the insulation film MZ. Thus, with the SSI method, hot electrons are injected from the semiconductor substrate SB into the charge accumulation part (herein, the insulation film MZ2) of the insulation film MZ. As a result, write to the memory cell is performed. The injected hot electrons (electrons) are trapped by the trap level of the charge accumulation part (herein, the insulation film MZ2) in the insulation film MZ. As a result, the threshold voltage of the memory transistor increases. Namely, the memory transistor is rendered in a write state.

For the erase method, an erase method (tunneling erase method) referred to as a so-called FN method can be preferably used in which erase is performed by FN (Fowler Nordheim) tunneling.

For erase with the FN method, for example, the voltages (Vmg is a positive voltage, and Vd, Vcg, Vs, and Vb are each zero volt) as shown in the row of "Erase" of FIG. 7 are applied to respective sites of the selection memory cell to perform erase; thus, in the selection memory cell, holes are tunneled from the memory gate electrode MG, and injected into the charge accumulation part (herein, the insulation film MZ2) in the insulation film MZ, thereby to perform erase. At this step, holes are tunneled from the memory gate electrode MG through the insulation film MZ3 by the FN tunneling (FN tunneling effect), are injected into the insulation film MZ, and are trapped by the trap level in the charge accumulation part (herein, the insulation film MZ2) in the insulation film MZ. As a result, the memory transistor is reduced in threshold voltage (is rendered in an erase state).

At the time of read, for example, the voltages as shown in the row of "Read" of the table of FIG. 7 are applied to respective sites of the selection memory cell to perform read. The applied voltages at this step hold the relation that the voltage Vd is higher than the voltage Vs (Vd>Vs). The voltage Vmg to be applied to the memory gate electrode MG at the time of read is set at a value between the threshold voltage of the memory transistor in a write state and the threshold voltage of the memory transistor in an erase state. As a result, it is possible to discriminate the write state and the erase state.

Alternatively, as the erase method, an erase method (hot hole injection erase method) referred to as a so-called BTBT method in which erase is performed by hot hole injection by the BTBT (Band-To-Band Tunneling phenomenon) can also be adopted. For erase with the BTBT method, holes generated by BTBT (Band-To-Band Tunneling) are injected from the semiconductor substrate (SB) side into the charge accumulation part (herein, the insulation film MZ2) in the insulation film MZ, thereby to perform erase. For erase with the BTBT method, for example, voltages of Vmg=−6 V, Vs=6 V, Vcg=0 V, Vd=open, and Vb=0 V are applied to respective sites of the selection memory cell to perform erase.

However, as the erase method, the FN method (tunneling erase method) requires less current consumption (power consumption) at the time of erase than with the BTBT method (BTBT erase method), and hence is advantageous in reduction of the power consumption.

<Regarding Manufacturing Steps of Semiconductor Device>

Then, a description will be given to a method for manufacturing a semiconductor device of the present embodiment.

FIGS. 8 to 38 are each an essential part cross sectional view of the semiconductor device of the present embodiment during a manufacturing step. FIGS. 8 to 38 each show an essential part cross sectional view of the memory cell region 1A, the low breakdown voltage MISFET formation region 1B, and the high breakdown voltage MISFET formation region 1C. Incidentally, the memory cell region 1A, the low breakdown voltage MISFET formation region 1B, and the high breakdown voltage MISFET formation region 1C are not required to be adjacent to one another. However, for ease of understanding, in each cross sectional view of FIGS. 8 to 38, the low breakdown voltage MISFET formation region 1B is shown adjacent to the memory cell region 1A, and the high breakdown voltage MISFET formation region 1C is shown adjacent thereto.

Figure 8:
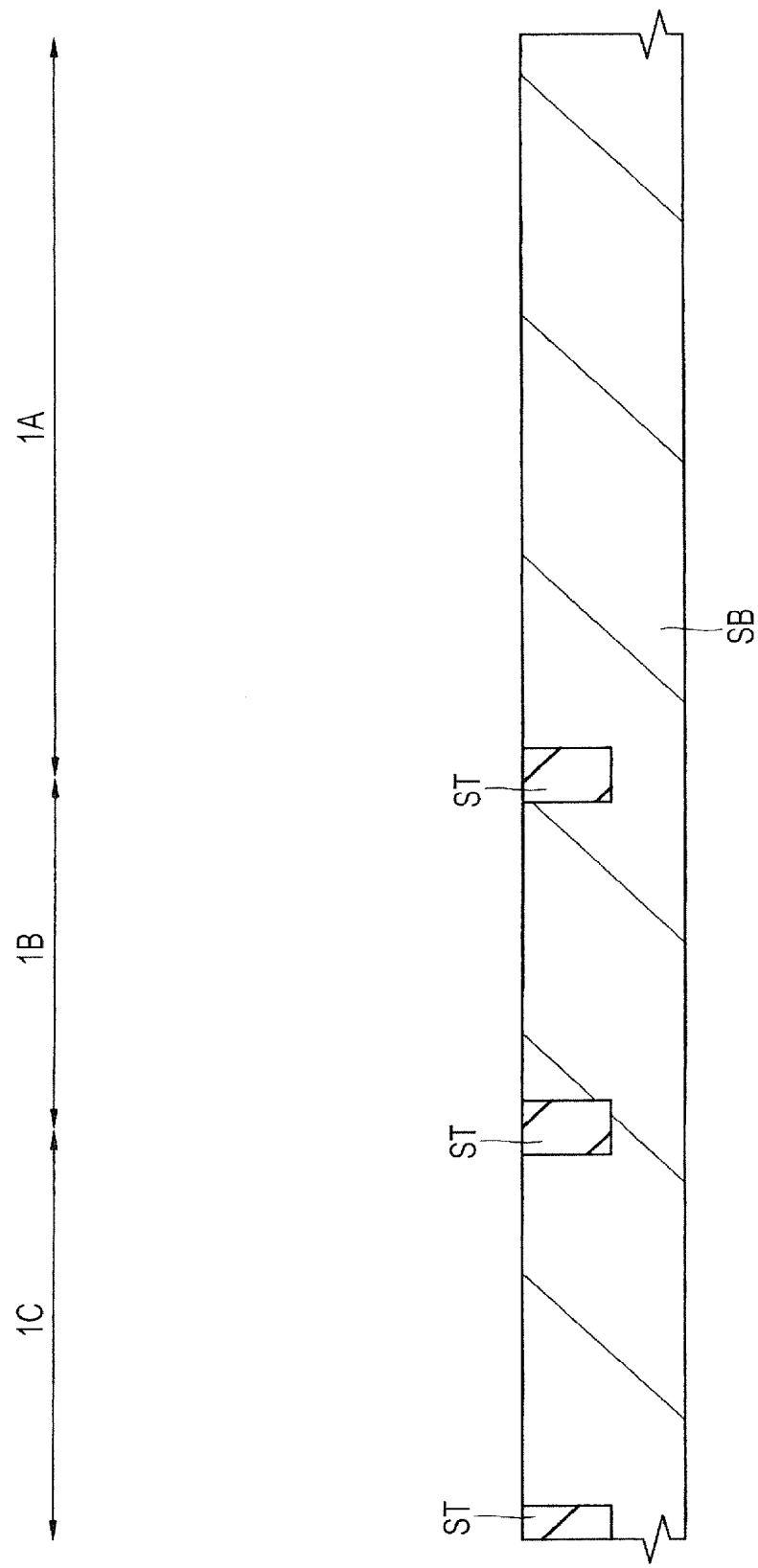
FIG. 8 is an essential part cross sectional view of the semiconductor device of one embodiment during a manufacturing step.

As shown in FIG. 8, first, a semiconductor substrate (semiconductor wafer) SB formed of, for example, a p type single crystal silicon having a specific resistance of about 1 to 10 Ωcm is prepared (provided). Then, at the main surface of the semiconductor substrate SB, element isolation regions (element isolation insulation regions) ST defining (partitioning) an active region are formed.

The element isolation region ST is formed of an insulator such as a silicon oxide, and can be formed by, for example, a STI (Shallow Trench Isolation) method or a LOCOS (Local Oxidization of Silicon) method. For example, a trench for element isolation is formed in the main surface of the semiconductor substrate SB. Then, an insulation film formed of, for example, a silicon oxide is embedded in the trench for element isolation. As a result, the element isolation region ST can be formed.

Figure 9:
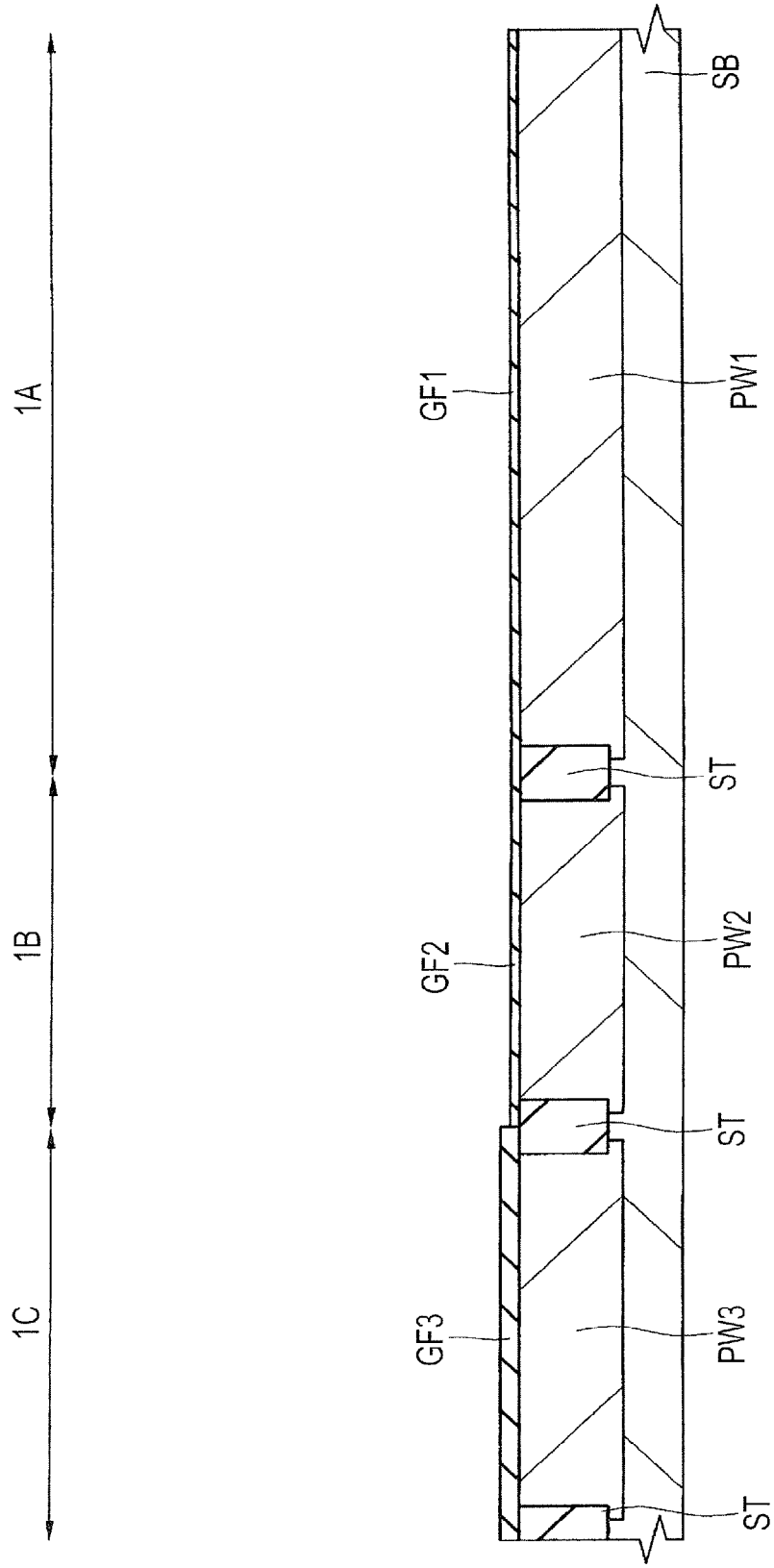
FIG. 9 is an essential part cross sectional view of the semiconductor device during a manufacturing step following FIG. 8.

Then, as shown in FIG. 9, in the memory cell region 1A of the semiconductor substrate SB, a p type well PW1 is formed; in the low breakdown voltage MISFET formation region 1B of the semiconductor substrate SB, a p type well PW2 is formed; and in the high breakdown voltage MISFET formation region 1C of the semiconductor substrate SB, a p type well PW3 is formed. The p type wells PW1, PW2, and PW3 can be each formed by ion implanting a p type impurity such as boron (B) into the semiconductor substrate SB, or other procedures. The p type wells PW1, PW2, and PW3 are each formed to a prescribed depth from the main surface of the semiconductor substrate SB.

Then, as shown in FIG. 9, at the main surface of the semiconductor substrate SB, insulation films GF1, GF2, and GF3 are formed. The insulation film GF1 is formed at the surface of the semiconductor substrate SB (i.e., the top surface of the p type well PW1) in the memory cell region 1A. The insulation film GF2 is formed at the surface of the semiconductor substrate SB (i.e., the top surface of the p type well PW2) in the low breakdown voltage MISFET formation region 1B. The insulation film GF3 is formed at the surface of the semiconductor substrate SB (i.e., the top surface of the p type well PW3) in the high breakdown voltage MISFET formation region 1C.

The formation step of the insulation films GF1, GF2, and GF3 can be performed, for example, in the following manner. Namely, first, the surface of the semiconductor substrate SB (the p type wells PW1, PW2, and PW3) is cleaned by diluted hydrofluoric acid cleaning, or the like. Then, at the main surface of the semiconductor substrate SB (i.e., the top surfaces of the p type wells PW1, PW2, and PW3) in the memory cell region 1A, the low breakdown voltage MISFET formation region 1B, and the high breakdown voltage MISFET formation region 1C, a silicon oxide film for the insulation film GF3 is formed using a thermal oxidation method, or the like. Then, using a photolithography technology and an etching technology, the silicon oxide film for the insulation film GF3 in the memory cell region 1A and the low breakdown voltage MISFET formation region 1B is removed; and the silicon oxide film for the insulation film GF3 in the high breakdown voltage MISFET formation region 1C is left. Then, a silicon oxide film serving both for the insulation film GF1 and for the insulation film GF2 is formed at the surface of the semiconductor substrate SB (i.e., the top surfaces of the p type wells PW1 and PW) in the memory cell region 1A and the low breakdown voltage MISFET formation region 1B using a thermal oxidation method. The thermal oxidation treatment at this step increases the thickness of the silicon oxide film for the insulation film GF3 in the high breakdown voltage MISFET formation region 1C. This results in the following structure: at the surface of the semiconductor substrate SB (p type well PW1) in the memory cell region 1A, an insulation film GF1 formed of a silicon oxide film is formed; and at the surface of the semiconductor substrate SB in the low breakdown voltage MISFET formation region 1B (p type well PW2), an insulation film GF2 formed of a silicon oxide film is formed; and at the surface of the semiconductor substrate SB (p type well PW3) in the high breakdown voltage MISFET formation region 1C, an insulation film GF3 is formed. Incidentally, FIG. 9 shows the case where the insulation films GF1, GF2, and GF3 are formed over the element isolation region ST. However, when the insulation films GF1, GF2, and GF3 are formed using a thermal oxidation method, the insulation films GF1, GF2, and GF3 are not formed over the element isolation region ST.

The thickness of the insulation film GF3 in the high breakdown voltage MISFET formation region 1C is larger than the thickness of the insulation film GF1 in the memory cell region 1A, and the thickness of the insulation film GF2 in the low breakdown voltage MISFET formation region 1B. The thickness of the insulation film GF1 in the memory cell region A, and the thickness of the insulation film GF2 in the low breakdown voltage MISFET formation region 1B are nearly equal to each other.

Figure 10:
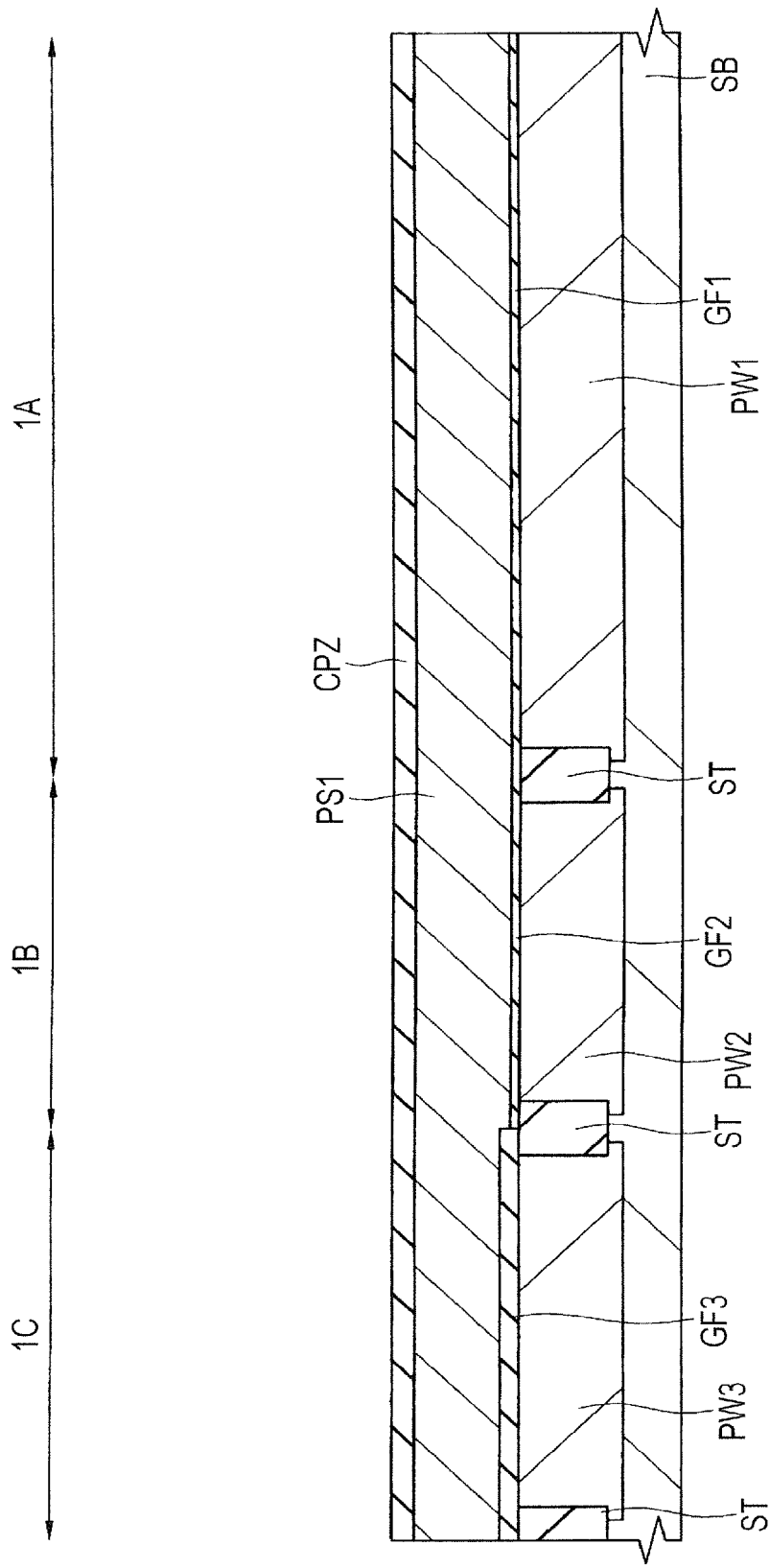
FIG. 10 is an essential part cross sectional view of the semiconductor device during a manufacturing step following FIG. 9.

Then, as shown in FIG. 10, entirely over the main surface of the semiconductor substrate SB, namely, over the insulation films GF1, GF2, and GF3, as a conductive film for forming the control gate electrode CG, a silicon film PS1 is formed (deposited).

The silicon film PS1 is formed of a polysilicon film, and can be formed using a CVD (Chemical Vapor Deposition) method, or the like. The following is also possible: during deposition, the silicon film PS1 is formed as an amorphous silicon film; then, by the subsequent heat treatment, the silicon film PS1 formed of an amorphous silicon film is changed into the silicon film PS1 formed of a polycrystal silicon film.

The silicon film PS1 is doped with an n type impurity by ion implantation after deposition, or doped with an n type impurity during deposition by a depositing gas, and thereby can be formed into a low-resistivity doped polysilicon film. The silicon film PS1 in the memory cell region 1A is doped with an n type impurity. However, the silicon film PS1 in the low breakdown voltage MISFET formation region 1B and the high breakdown voltage MISFET formation region 1C may each be a non-doped silicon film.

Then, as shown in FIG. 10, entirely over the main surface of the semiconductor substrate SB, namely, over the silicon film PS1, an insulation film CPZ is formed.

The insulation film CPZ is formed of, for example, a silicon nitride film. As the insulation film CPZ, a lamination film of a silicon oxide film, and a silicon nitride film formed over the silicon oxide film, and thicker than the silicon oxide film can also be used.

Figure 11:
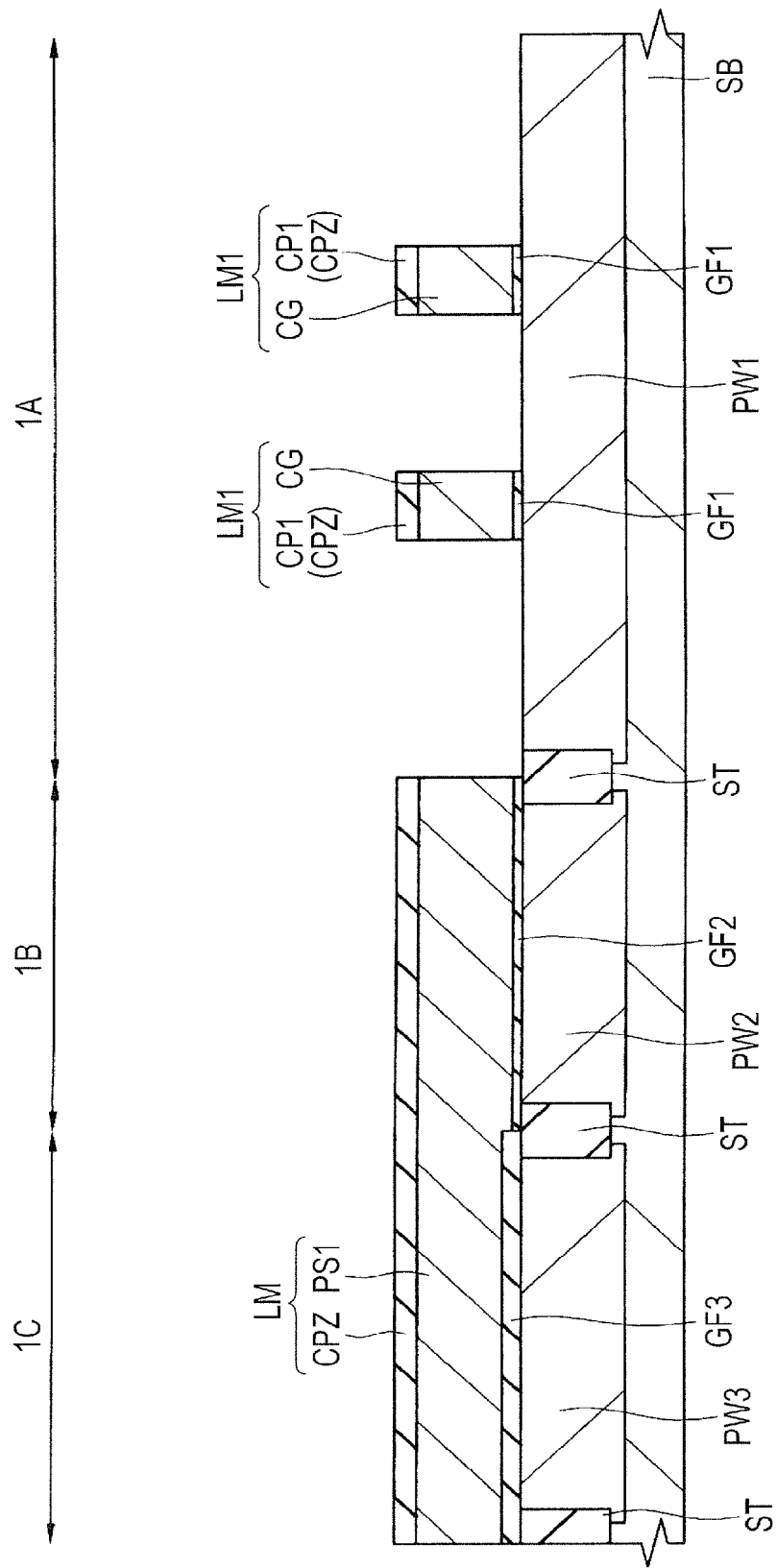
FIG. 11 is an essential part cross sectional view of the semiconductor device during a manufacturing step following FIG. 10.

Then, as shown in FIG. 11, the lamination film of the silicon film PS1 and the insulation film CPZ over the silicon film PS1 is patterned using a photolithography technology and an etching technology. This results in the formation of a lamination body LM1 formed of the control gate electrode CG and the cap insulation film CP1 over the control gate electrode CG.

The patterning step can be performed specifically, for example, in the following manner. Namely, a photoresist pattern (not shown) is formed over the lamination film of the silicon film PS1 and the insulation film CPZ using a photolithography method. Using the photoresist pattern as an etching mask, the insulation film CPZ and the silicon film PS1 in the memory cell region 1A are sequentially etched (dry etched), and are patterned. Although the photoresist pattern is herein not shown, it is formed in the control gate electrode CG forming region, the entire low breakdown voltage MISFET formation region 1B, and the entire high breakdown voltage MISFET formation region 1C. The lamination film of the silicon film PS1 and the insulation film CPZ is patterned. Then, the photoresist pattern is removed.

In this manner, as shown in FIG. 11, in the memory cell region 1A, the lamination body LM1 of the control gate electrode CG formed of the patterned silicon film PS1, and the cap insulation film CP1 formed of the patterned insulation film CPZ is formed. At this step, in the low breakdown voltage MISFET formation region 1B and the high breakdown voltage MISFET formation region 1C, as described above, the photoresist pattern has been formed. For this reason, the silicon film PS1 and the insulation film CPZ are not patterned, so that the lamination film of the silicon film PS1 and the insulation film CPZ is left as it is. The lamination film of the silicon film PS1 and the insulation film CPZ left in the low breakdown voltage MISFET formation region 1B and the high breakdown voltage MISFET formation region 1C is indicated with a reference sign LM, and is referred to as a lamination film LM.

In the memory cell region 1A, the insulation film GF1 left under the lamination body LM1 serves as the gate insulation film of the control transistor. Therefore, the control gate electrode CG formed of the patterned silicon film PS1 is formed over the semiconductor substrate SB (p type well PW1) via the insulation film GF1 as a gate insulation film. This results in a state in which the cap insulation film CP1 in almost the same planar shape as that of the control gate electrode is formed over the control gate electrode CG.

In the memory cell region 1A, the portions of the insulation film GF1 except for the portions covered with the control gate electrode CG can be removed by dry etching performed at the patterning step of the lamination film of the silicon film PS1 and the insulation film CPZ, or by performing wet etching after the dry etching.

Figure 12:
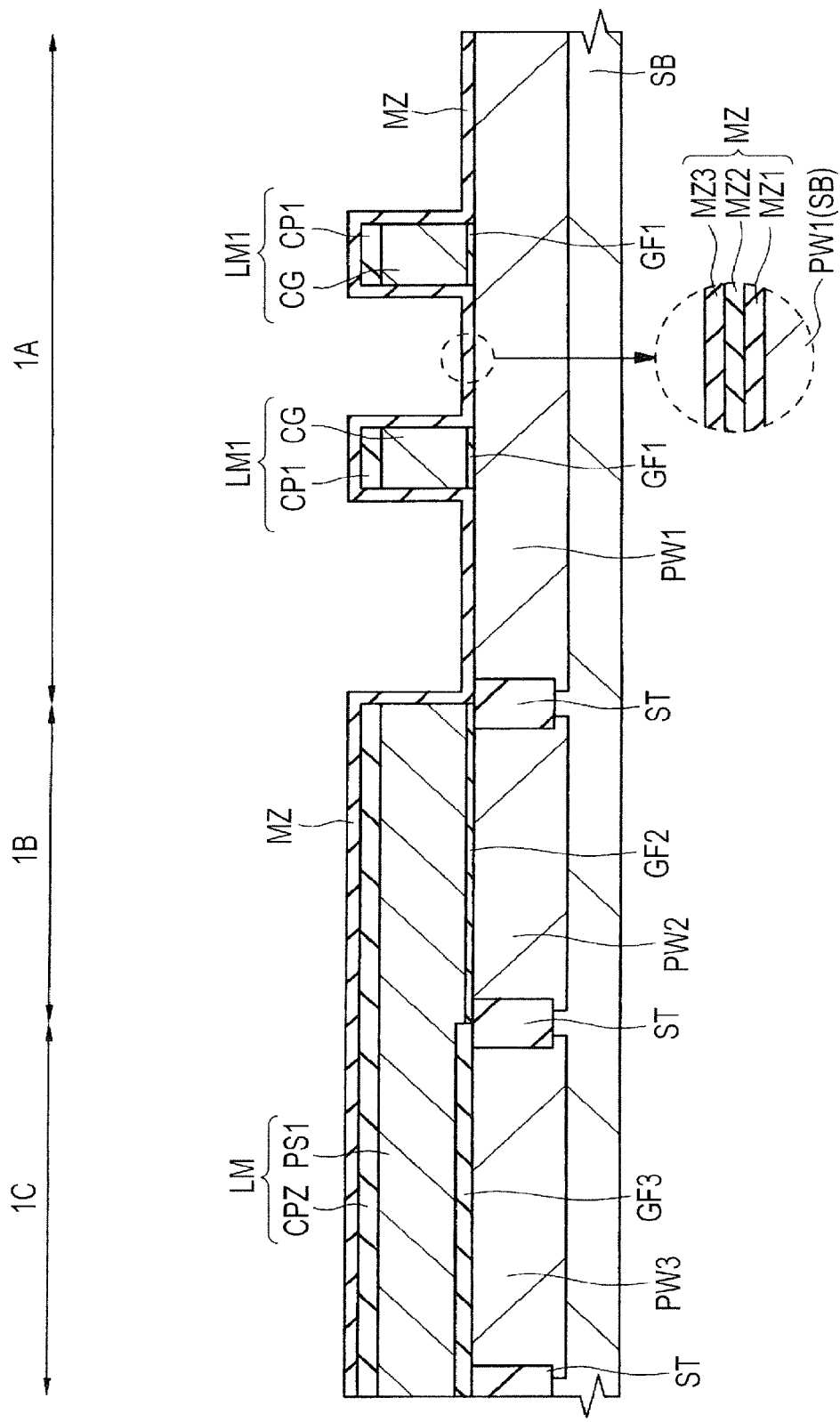
FIG. 12 is an essential part cross sectional view of the semiconductor device during a manufacturing step following FIG. 11.

Then, a cleaning treatment is performed, thereby to subject the main surface of the semiconductor substrate SB to a purification treatment. Then, as shown in FIG. 12, over the entire main surface of the semiconductor substrate SB, namely, over the main surface (front surface) of the semiconductor substrate SB, and over the surface (the top surface and the side surfaces) of the lamination body LM1, an insulation film MZ for the gate insulation film of the memory transistor is formed. At this step, in the low breakdown voltage MISFET formation region 1B and the high breakdown voltage MISFET formation region 1C, the lamination film LM has been left. Accordingly, the insulation film MZ can also be formed over the surface (the top surface and the side surfaces) of the lamination film LM. For this reason, the insulation film MZ is formed over the semiconductor substrate SB in such a manner as to cover the lamination body LM1 and the lamination film LM.

The insulation film MZ is an insulation film for the gate insulation film of the memory transistor, and is an insulation film having a charge accumulation part (charge accumulation layer) in the inside thereof. The insulation film MZ is formed of a lamination film having an insulation film MZ1, an insulation film MZ2 formed over the insulation film MZ1, and an insulation film MZ3 formed over the insulation film MZ2. Herein, the insulation film MZ1 and the insulation film MZ3 each can be formed of a silicon oxide film. The insulation film MZ2 can be formed of a silicon nitride film.

Incidentally, for ease of understanding of the drawing, in FIG. 12, the insulation film MZ formed of the insulation film MZ1, the insulation film MZ2, and the insulation film MZ3 is shown simply as the insulation film MZ. However, in actuality, as shown in the enlarged view of the region surrounded by a dotted circle in FIG. 12, the insulation film MZ is formed of the lamination film of the insulation film MZ1, the insulation film MZ2, and the insulation film MZ3.

For forming the insulation film MZ, for example, first, the insulation film MZ1 formed of a silicon oxide film is formed by a thermal oxidation method; then, over the insulation film MZ1, the insulation film MZ2 formed of a silicon nitride film is deposited by a CVD method; and further, over the insulation film MZ2, the insulation film MZ3 formed of a silicon oxide film is formed by a CVD method or a thermal oxidation method, or both thereof. As the thermal oxidation method, ISSG (In Situ Steam Generation) oxidation can also be used. As a result, it is possible to form the insulation film MZ having the insulation film MZ1 (silicon oxide film), the insulation film MZ2 (silicon nitride film), and the insulation film MZ3 (silicon oxide film).

Figure 13:
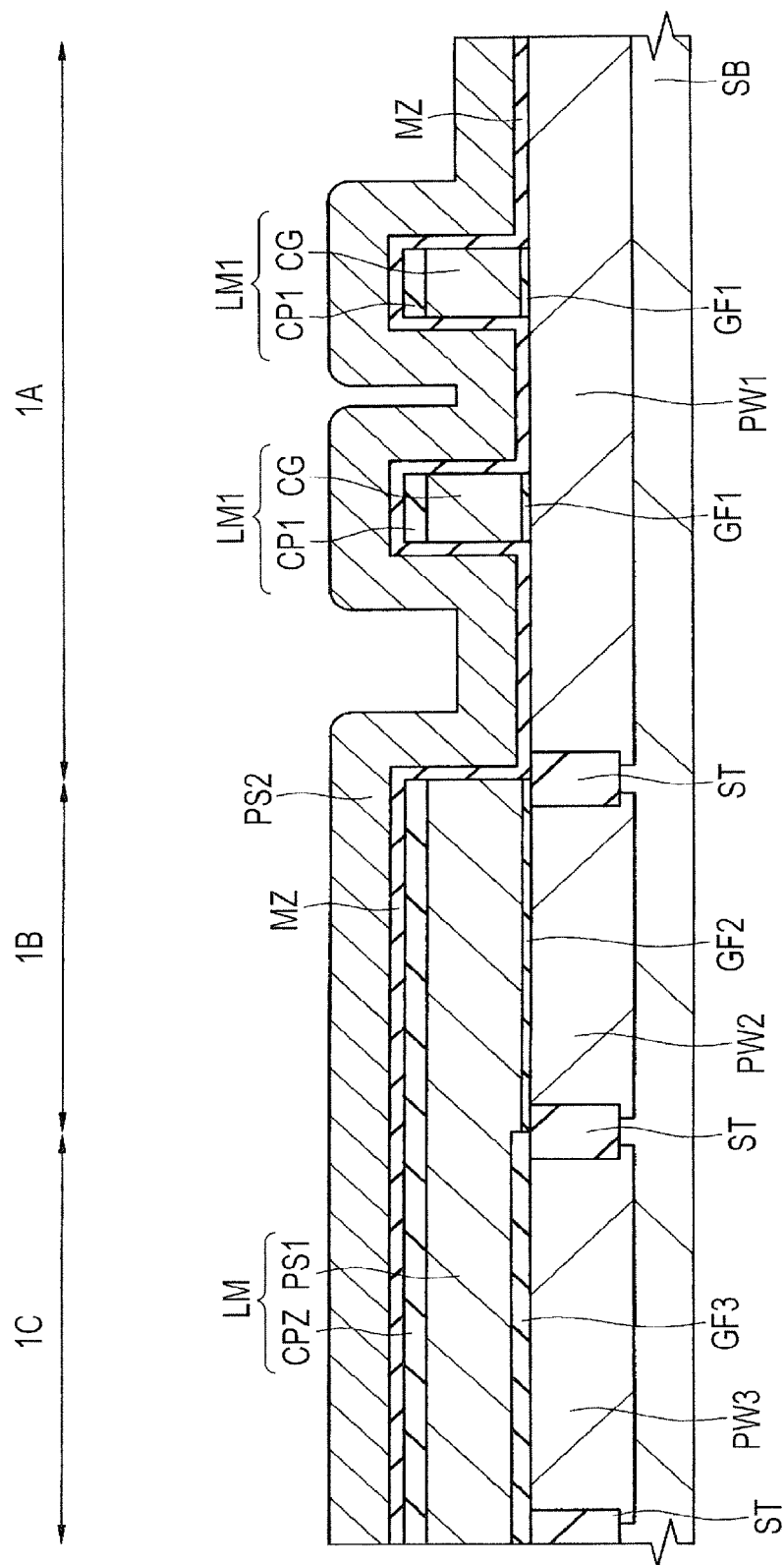
FIG. 13 is an essential part cross sectional view of the semiconductor device during a manufacturing step following FIG. 12.

Then, as shown in FIG. 13, entirely over the main surface of the semiconductor substrate SB, namely, over the insulation film MZ, a silicon film PS2 is formed (deposited) as a conductive film for forming the memory gate electrode MG in such a manner as to cover the lamination body LM1 in the memory cell region 1A, and in such a manner as to cover the lamination film LM in the low breakdown voltage MISFET formation region 1B and the high breakdown voltage MISFET formation region 1C.

The silicon film PS2 is formed of a polysilicon film, and can be formed using a CVD method, or the like. The following is also possible: during deposition, the silicon film PS2 is formed as an amorphous silicon film; then, by the subsequent heat treatment, the silicon film PS2 formed of an amorphous silicon film is changed into the silicon film PS2 formed of a polysilicon film.

The silicon film PS2 is doped with an n type impurity, thereby to be low in resistivity. The ion implantation after deposition of the silicon film PS2 can dope an n type impurity into the silicon film PS2. Alternatively, during deposition of the silicon film PS2, the silicon film PS2 can be doped with an n type impurity.

Figure 14:
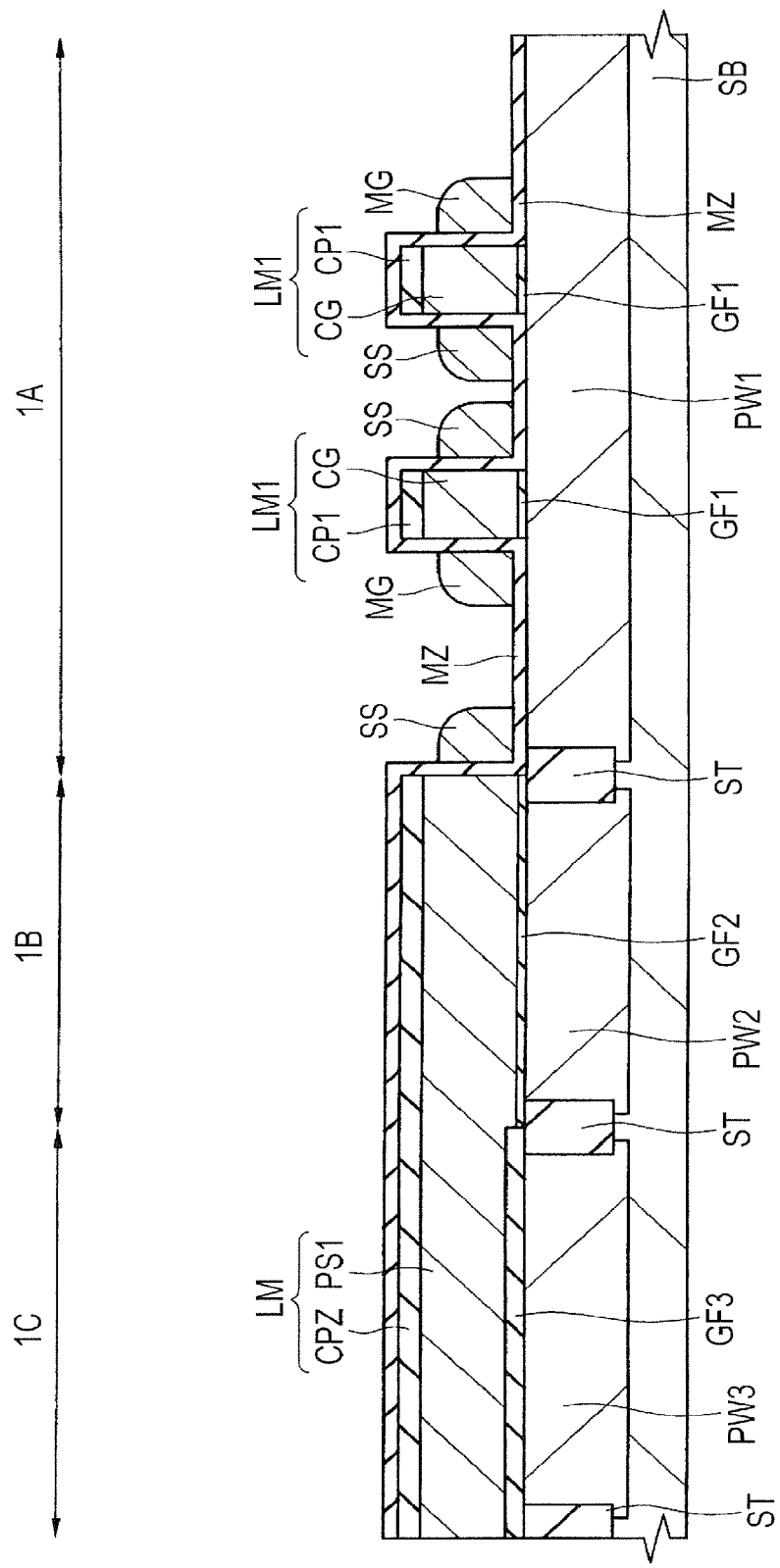
FIG. 14 is an essential part cross sectional view of the semiconductor device during a manufacturing step following FIG. 13.

Then, by an anisotropic etching technology, the silicon film PS2 is etched back (etched, dry etched, or anisotropically etched). In the etch back step of the silicon film PS2, the silicon film PS2 is anisotropically etched by the deposited film thickness of the silicon film PS2. As a result, the silicon film PS2 is left in a sidewall spacer shape over each opposite side surface of the lamination body LM1 (via the insulation film MZ), and the portions of the silicon film PS2 in other regions are removed. As a result, as shown in FIG. 14, in the memory cell region 1A, a memory gate electrode MG is formed by the silicon film PS2 left in a sidewall spacer shape via the insulation film MZ over one side surface of the opposite side surfaces of the lamination body LM1. Whereas, in the memory cell region 1A, a silicon spacer SS is formed by the silicon film PS2 left in a sidewall spacer shape via the insulation film MZ over the other side surface of the opposite side surfaces of the lamination body LM1. The memory gate electrode MG is formed over the insulation film MZ in such a manner as to be adjacent to the lamination body LM1 via the insulation film MZ.

The silicon spacer SS can also be regarded as a sidewall spacer formed of a conductor, namely, a conductor spacer. The memory gate electrode MG and the silicon spacer SS are formed over the side surfaces of the lamination body LM1 opposite to each other, and have a nearly symmetric structure with the lamination body LM1 interposed therebetween. Whereas, the silicon spacer SS can also be formed over the side surface of the lamination film LM left in the low breakdown voltage MISFET formation region 1B and the high breakdown voltage MISFET formation region 1C via the insulation film MZ.

At the step of having performed the etch back step of the silicon film PS2, the insulation film MZ in the region not covered with the memory gate electrode MG and the silicon spacer SS is exposed. The insulation film MZ is interposed between the memory gate electrode MG and the semiconductor substrate SB (p type well PW1), and between the memory gate electrode MG and the lamination body LM1 (control gate electrode CG). The insulation film MZ under the memory gate electrode MG in the memory cell region 1A serves as the gate insulation film of the memory transistor. By adjusting the deposited film thickness of the silicon film PS2 deposited in the step of FIG. 13, it is possible to adjust the gate length of the memory gate electrode MG.

Figure 15:
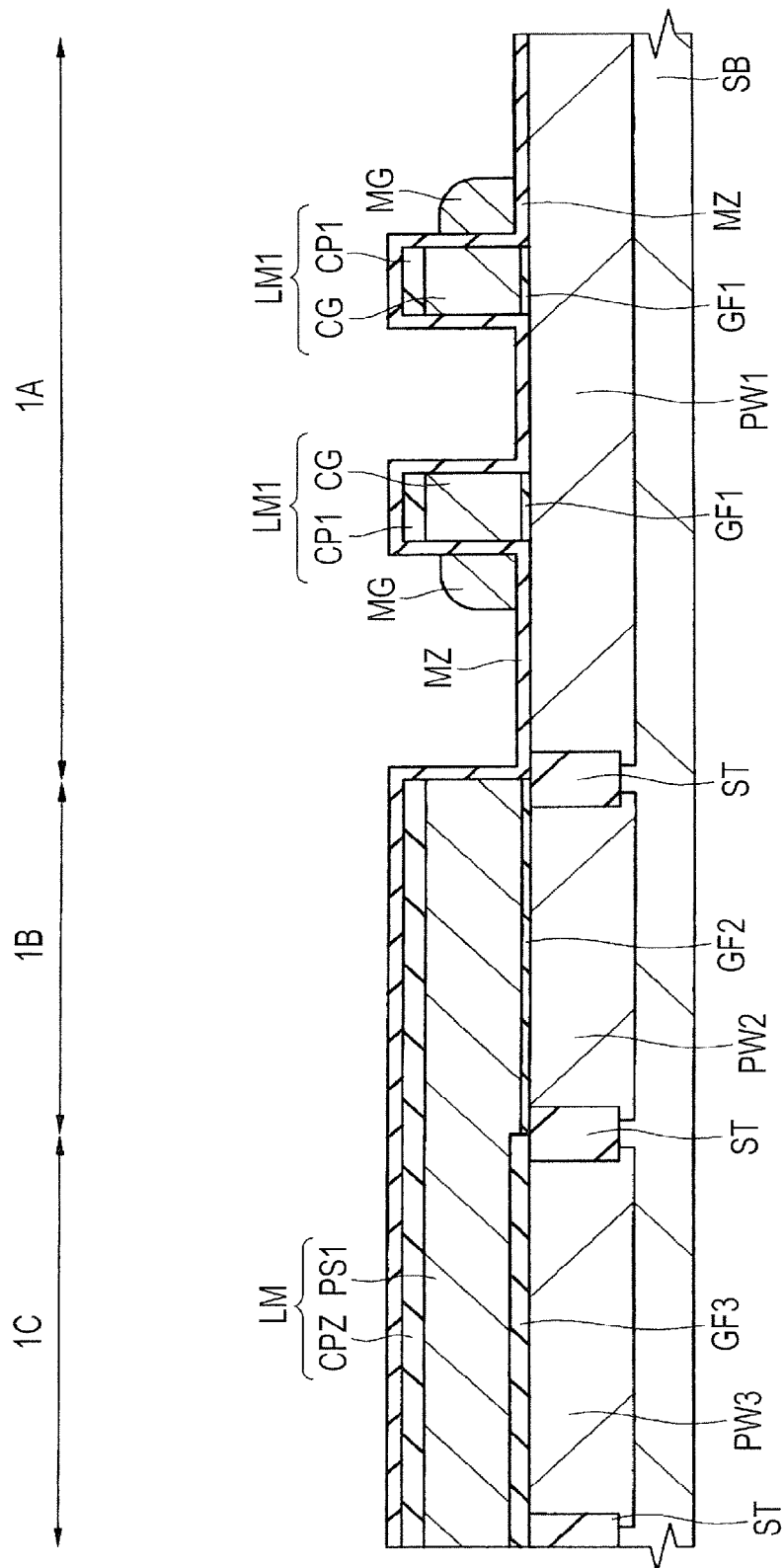
FIG. 15 is an essential part cross sectional view of the semiconductor device during a manufacturing step following FIG. 14.

Then, using a photolithography technology, such a photoresist pattern (not shown) as to cover the memory gate electrode MG, and to expose the silicon spacer SS is formed over the semiconductor substrate SB. Then, by dry etching using the photoresist pattern as an etching mask, the silicon spacer SS is removed. Then, the photoresist pattern is removed. FIG. 15 shows this stage. The silicon spacer SS is removed, but the memory gate electrode MG has been covered with the photoresist pattern, and hence is not etched, and is left.

Figure 16:
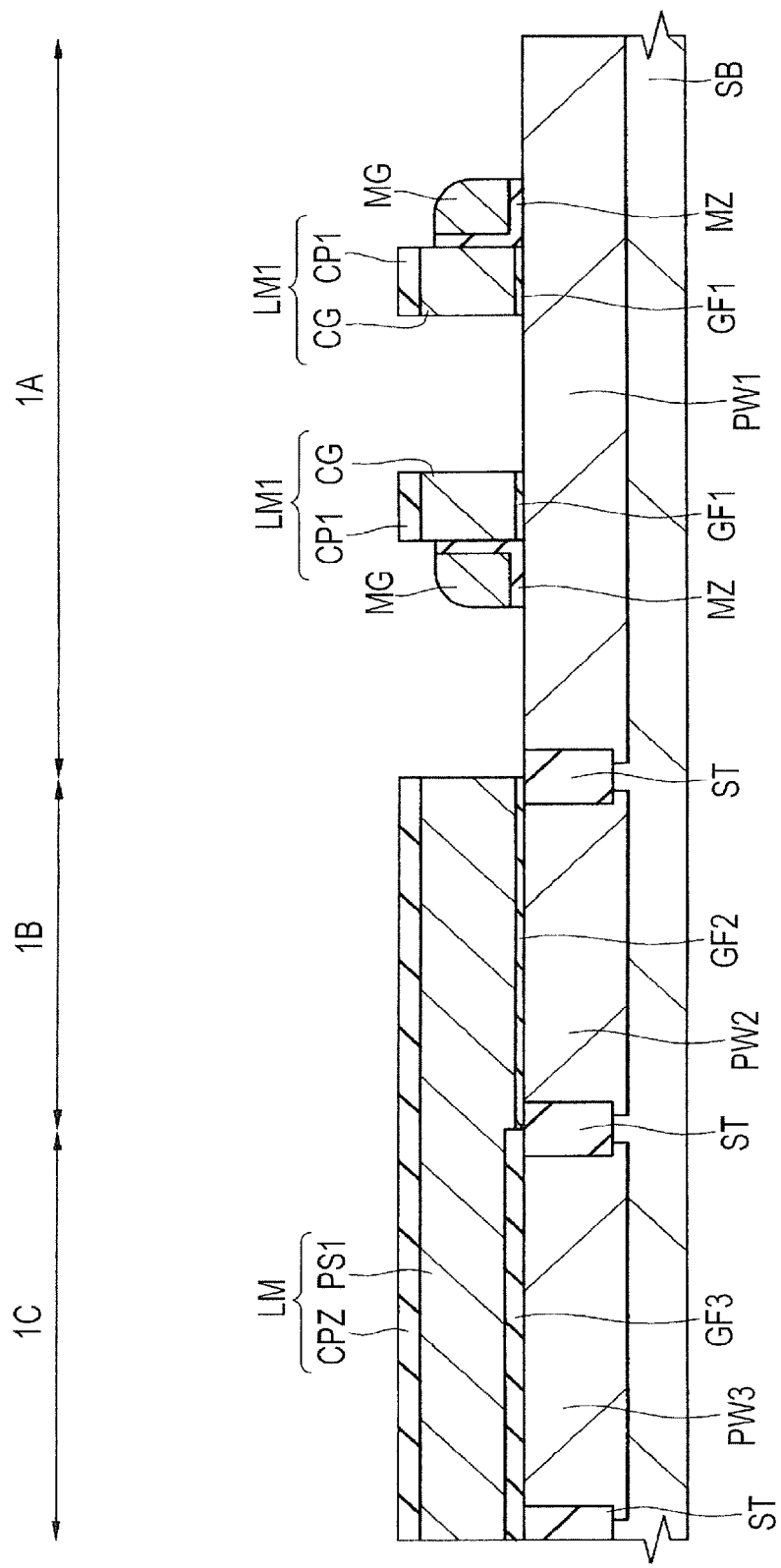
FIG. 16 is an essential part cross sectional view of the semiconductor device during a manufacturing step following FIG. 15.

Then, as shown in FIG. 16, the portions of the insulation film MZ not covered with the memory gate electrode MG, and exposed are removed by etching (e.g., wet etching). At this step, the insulation film MZ situated under the memory gate electrode MG and between the memory gate electrode MG and the lamination body LM1 in the memory cell region 1A is not removed, and is left, and the portions of the insulation film MZ in other regions are removed. As also indicated from FIG. 16, in the memory cell region 1A, the insulation film MZ continuously extends over both the regions of the region between the memory gate electrode MG and the semiconductor substrate SB (p type well PW1), and the region between the memory gate electrode MG and the lamination body LM1 (control gate electrode CG).

Figure 17:
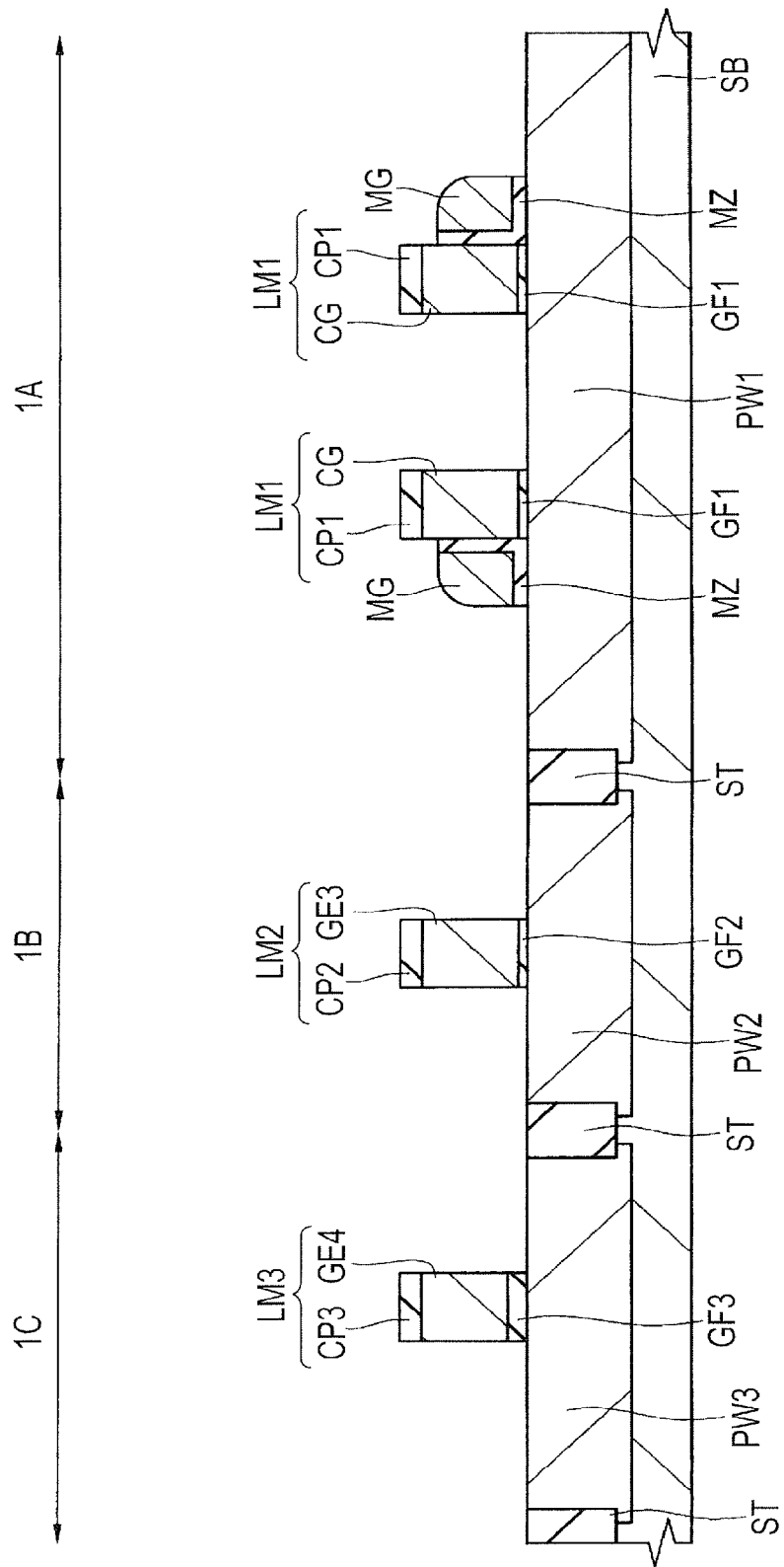
FIG. 17 is an essential part cross sectional view of the semiconductor device during a manufacturing step following FIG. 16.

Then, as shown in FIG. 17, the lamination film LM in the low breakdown voltage MISFET formation region 1B and the high breakdown voltage MISFET formation region 1C is patterned using a photolithography technology and an etching technology. This results in the formation of a lamination body LM2 formed of a gate electrode GE3 and a cap insulation film CP2, and a lamination body LM3 formed of a gate electrode GE4 and a cap insulation film CP3.

The patterning step of the lamination film LM can be performed specifically, for example, in the following manner. Namely, a photoresist pattern (not shown) is formed over the lamination film LM of the silicon film PS1 and the insulation film CPZ using a photolithography method. Using the photoresist pattern as an etching mask, the insulation film CPZ and the silicon film PS1 forming the lamination film LM are sequentially etched (dry etched), and patterned. Although the photoresist pattern is herein not shown, it is formed in the gate electrode GE3 forming region, the gate electrode GE4 forming region, and the whole memory cell region 1A. After patterning the lamination film LM, the photoresist pattern is removed.

In this manner, as shown in FIG. 16, in the low breakdown voltage MISFET formation region 1B, the lamination body LM2 formed of the patterned lamination film LM is formed, and in the high breakdown voltage MISFET formation region 1C, the lamination body LM3 formed of the patterned lamination film LM is formed. At this step, in the memory cell region 1A, the photoresist pattern has been formed as described above. Accordingly, the memory gate electrode MG and the lamination body LM1 are not etched, and are left as they are.

The lamination body LM2 is formed of a gate electrode GE3 and a cap insulation film CP2 over the gate electrode GE3. The gate electrode GE3 is formed of the patterned silicon film PS1. The cap insulation film CP2 is formed of the patterned insulation film CPZ. The lamination body LM3 is formed of a gate electrode GE4 and a cap insulation film CP3 over the gate electrode GE4. The gate electrode GE4 is formed of the patterned silicon film PS1. The cap insulation film CP3 is formed of the patterned insulation film CPZ.

In the low breakdown voltage MISFET formation region 1B, the insulation film GF2 is left under the lamination body LM2. In the high breakdown voltage MISFET formation region 1C, the insulation film GF3 is left under the lamination body LM3. In the low breakdown voltage MISFET formation region 1B, the insulation film GF2 except for the portion thereof covered with the gate electrode GE3 can be removed by dry etching performed in the patterning step of the lamination film LM, or performing wet etching after the dry etching. Similarly, in the high breakdown voltage MISFET formation region 1C, the insulation film GF3 except for the portion thereof covered with the gate electrode GE4 can be removed by dry etching performed in the patterning step of the lamination film LM, or performing wet etching after the dry etching. Therefore, in the low breakdown voltage MISFET formation region 1B, the gate electrode GE3 formed of the patterned silicon film PS1 is formed over the semiconductor substrate SB (p type well PW2) via the insulation film GF2; and the cap insulation film CP2 in almost the same planar shape as that of the gate electrode GE3 is formed over the gate electrode GE3. Whereas, in the high breakdown voltage MISFET formation region 1C, the gate electrode GE4 formed of the patterned silicon film PS1 is formed over the semiconductor substrate SB (p type well PW3) via the insulation film GF3; and the cap insulation film CP3 in almost the same planar shape as that of the gate electrode GE4 is formed over the gate electrode GE4.

Figure 18:
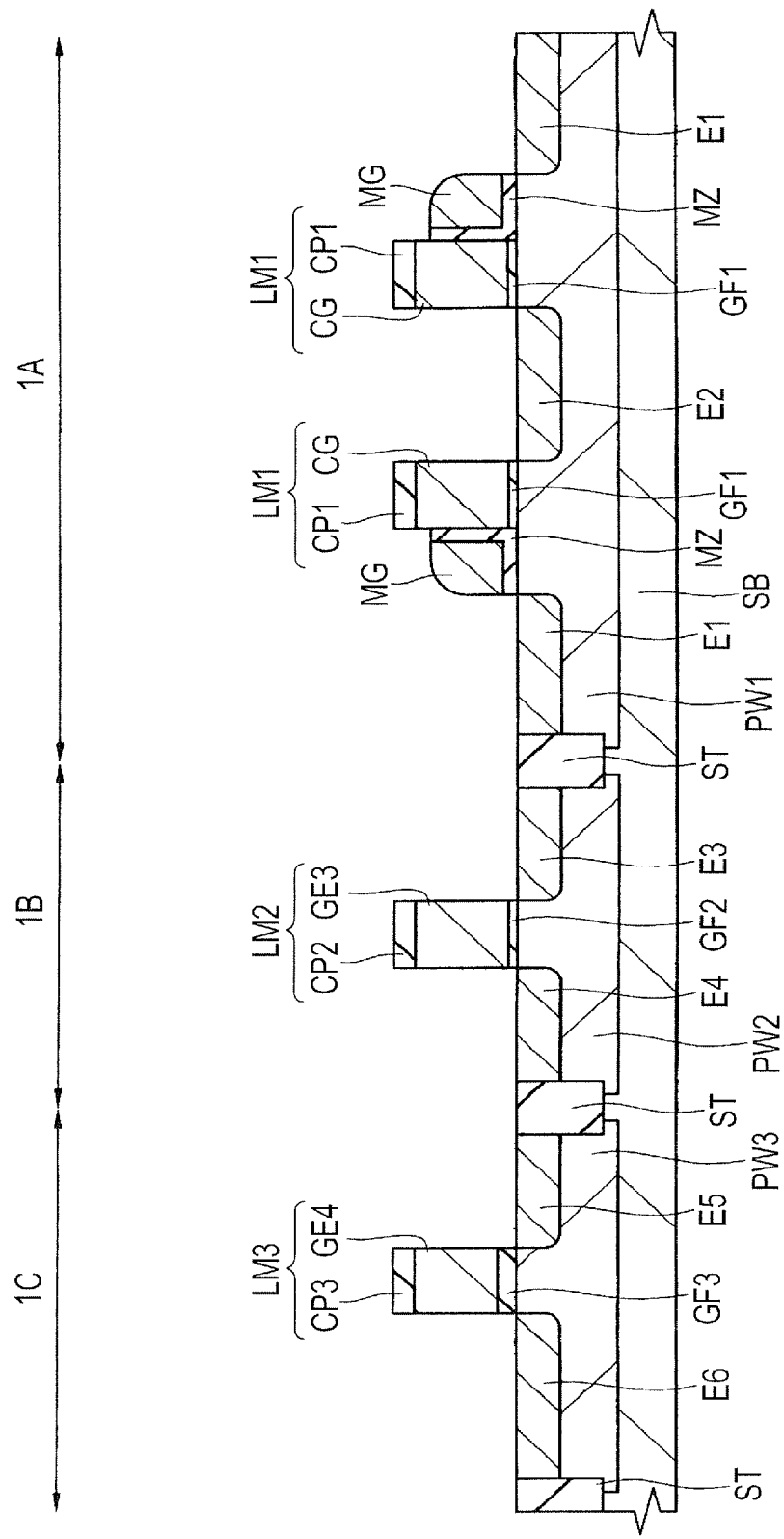
FIG. 18 is an essential part cross sectional view of the semiconductor device during a manufacturing step following FIG. 17.

Then, as shown in FIG. 18, $n^-$ type semiconductor regions (impurity diffusion layers) E1, E2, E3, E4, E5, and E6 are formed using an ion implantation method, or the like.

Specifically, an n type impurity such as arsenic (As) or phosphorus (P) is ion implanted into the semiconductor substrate SB (p type wells PW1, PW2, and PW3) using the lamination body LM1, the memory gate electrode MG, the lamination body LM2, and the lamination body LM3 as a mask (ion implantation inhibiting mask). As a result, the $n^-$ type semiconductor regions E1, E2, E3, E4, E5, and E6 can be formed.

At this step, the $n^-$ type semiconductor region E1 is formed in self-alignment with the side surface of the memory gate electrode MG (the side surface opposite to the side thereof adjacent to the lamination body LM1 via the insulation film MZ) in the memory cell region 1A. Whereas, the $n^-$ type semiconductor region E2 is formed in self-alignment with the side surface of the lamination body LM1 (the side surface opposite to the side thereof adjacent to the memory gate electrode MG via the insulation film MZ) in the memory cell region 1A. Further, in the low breakdown voltage MISFET formation region 1B, the $n^-$ type semiconductor region E3 is formed in self-alignment with one side surface (the side surface on the source side) of the lamination body LM2, and the $n^-$ type semiconductor region E4 is formed in self-alignment with the other side surface (the side surface on the drain side) of the lamination body LM2. Further, in the high breakdown voltage MISFET formation region 1C, the $n^-$ type semiconductor region E5 is formed in self-alignment with one side surface (the side surface on the source side) of the lamination body LM3, and the $n^-$ type semiconductor region E6 is formed in self-alignment with the other side surface (the side surface on the drain side) of the lamination body LM3. The $n^-$ type semiconductor region E1, the $n^-$ type semiconductor region E2, the $n^-$ type semiconductor region E3, the $n^-$ type semiconductor region E4, the $n^-$ type semiconductor region E5, and the $n^-$ type semiconductor region E6 can be formed by the same ion implantation step, but can also be formed by different ion implantation steps.

Figure 19:
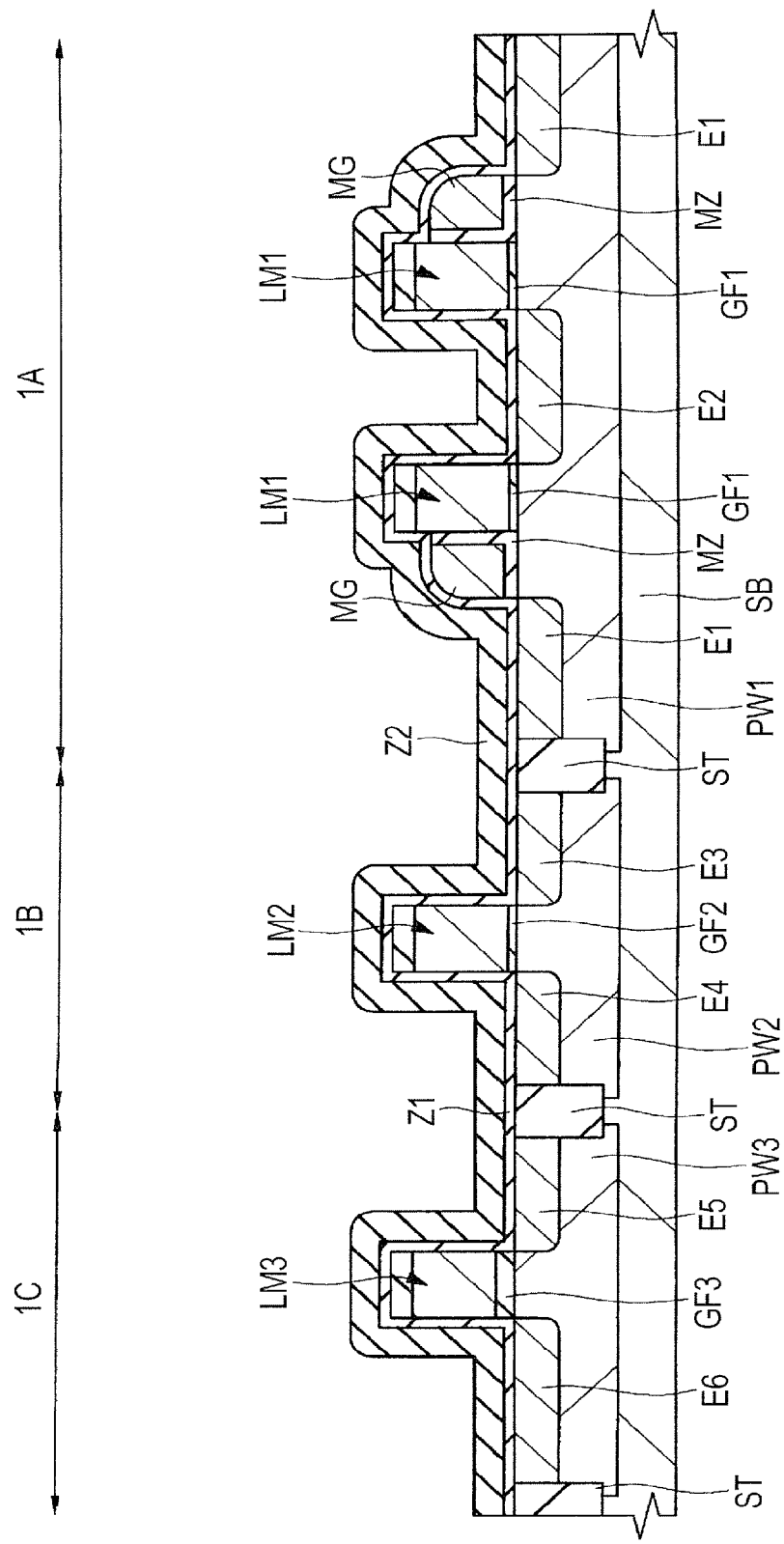
FIG. 19 is an essential part cross sectional view of the semiconductor device during a manufacturing step following FIG. 18.

Then, as shown in FIG. 19, entirely over the main surface of the semiconductor substrate SB, an insulation film Z1 is formed in such a manner as to cover the lamination bodies LM1, LM2, and LM3, and the memory gate electrode MG. Then, entirely over the main surface of the semiconductor substrate SB, namely, over the insulation film Z1, an insulation film Z2 is formed.

The insulation film Z1 and the insulation film Z2 are formed of mutually different insulation materials. This is for the following reason: when the insulation film Z1 is etched, the insulation film Z2 is allowed to function as an etching stopper film. For example, as the insulation film Z1, a silicon nitride film can be preferably used. As the insulation film Z2, a silicon oxide film can be preferably used. The formed film thickness of the insulation film Z2 can be set larger than the formed film thickness of the insulation film Z1.

Figure 20:
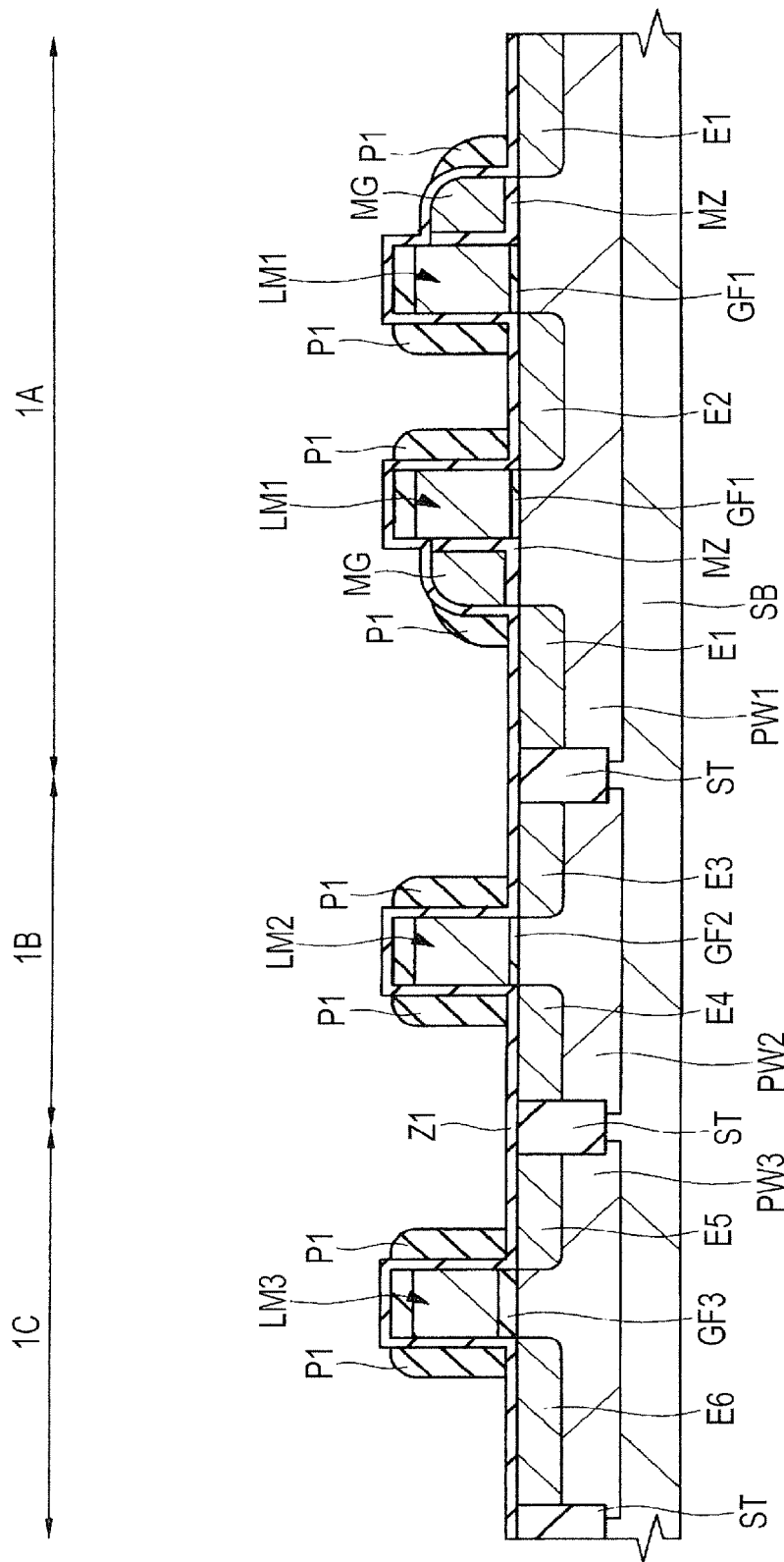
FIG. 20 is an essential part cross sectional view of the semiconductor device during a manufacturing step following FIG. 19.

Then, as shown in FIG. 20, the insulation film Z2 is etched back (anisotropically etched). As a result, the insulation film Z2 is selectively left over the side surfaces of the lamination body LM1 and the memory gate electrode MG (the side surfaces thereof opposite to the side surfaces thereof adjacent to each other via the insulation film MZ), over the side surfaces of the lamination body LM2, and over the side surfaces of the lamination body LM3. As a result, sidewall spacers (sidewall insulation films) P1 are formed. This step will be hereinafter referred to as an "etch back step of the insulation film Z2".

The sidewall spacers P1 are formed over the opposite side surfaces of the lamination body LM2, over the opposite side surfaces of the lamination body LM3, over the side surface of the lamination body LM1 opposite to the side surface on the side thereof adjacent to the memory gate electrode MG via the insulation film MZ, of the side surfaces of the lamination body LM1, and over the side surface the memory gate electrode MG opposite to the side surface on the side thereof adjacent to the control gate electrode CG via the insulation film MZ, of the side surfaces of the memory gate electrode MG. However, the insulation film Z1 is interposed between the respective side surfaces the memory gate electrode MG and of the lamination bodies LM41, LM242, and LM3, and the sidewall spacers P1. Accordingly, the sidewall spacers P1 are formed over the opposite side surfaces of the lamination body LM2 via the insulation film MZ1, respectively. The sidewall spacers P1 are formed over the opposite side surfaces of the lamination body LM3 via the insulation film MZ1, respectively. The sidewall spacer P1 is formed over the side surface of the lamination body LM1 via the insulation film MZ1. The sidewall spacer P1 is formed over the side surface of the memory gate electrode MG via the insulation film MZ1.

In the etch back step of the insulation film Z2, the insulation film Z2 is left as the sidewall spacer P1 over the insulation film Z1, and the portions of the insulation film Z2 in other regions are removed. For this reason, when the etch back step of the insulation film Z2 is performed, the insulation film Z2 is locally left over the insulation film Z1, resulting in the sidewall spacer P1. As a result, the insulation film Z1 except for the portion thereof covered with the sidewall spacer P1 is exposed.

In the etch back step of the insulation film Z2, etch back is preferably performed under etching conditions such that the insulation film Z1 is less likely to be etched than the insulation film Z2. As a result, in the etch back step of the insulation film Z2, the insulation film Z1 can be allowed to function as an etching stopper. This can suppress or prevent the insulation film Z1 from being etched. At the stage upon completion of the etch back step of the insulation film Z2, the insulation film Z1 is preferably left in a layer shape over the main surface of the semiconductor substrate SB. This can prevent the semiconductor substrate SB, the memory gate electrode MG, and the like from being etched in the etch back step of the insulation film Z2.

Incidentally, "B is less likely to be etched than A" corresponds to "the etching rate of B is smaller than the etching rate of A".

Figure 21:
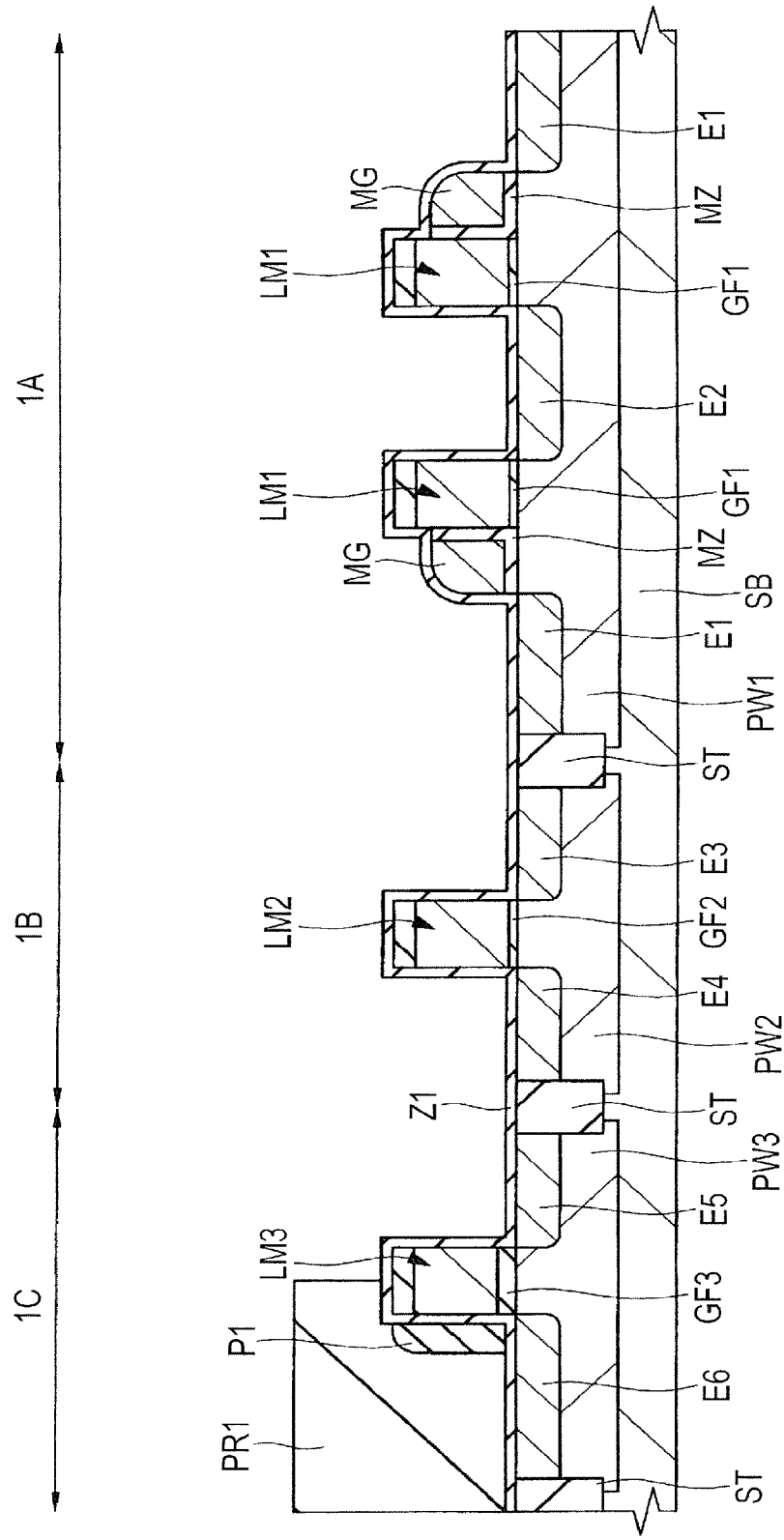
FIG. 21 is an essential part cross sectional view of the semiconductor device during a manufacturing step following FIG. 20.

Then, as shown in FIG. 21, the sidewall spacers P1 in the memory cell region 1A, the sidewall spacers P1 in the low breakdown voltage MISFET formation region 1B, and the sidewall spacers P1 on the source side in the high breakdown voltage MISFET formation region 1C are removed by etching. The sidewall spacer P1 on the drain side in the high breakdown voltage MISFET formation region 1C is not removed, and is left. This step will be hereinafter referred to as "the removal step of the sidewall spacer P1 of FIG. 21".

Herein, the sidewall spacer P1 on the drain side in the high breakdown voltage MISFET formation region 1C corresponds to the sidewall spacer P1 formed on the side on which the drain region (semiconductor region D3) is formed of the sidewall spacers P1 formed on the opposite sides of the lamination body LM3. Whereas, the sidewall spacer P1 on the source side in the high breakdown voltage MISFET formation region 1C corresponds to the sidewall spacer P1 formed on the side on which the source region (semiconductor region S3) is formed of the sidewall spacers P1 formed on the opposite sides of the lamination body LM3.

The removal step of the sidewall spacer P1 of FIG. 21 can be performed specifically in the following manner. Namely, as shown in FIG. 21, first, over the main surface of the semiconductor substrate SB, a photoresist pattern PR1 is formed as a mask layer using a photolithography technology. The photoresist pattern PR1 covers the sidewall spacer P1 on the drain side in the high breakdown voltage MISFET formation region 1C, and exposes the sidewall spacer P1 on the source side in the high breakdown voltage MISFET formation region 1C, and exposes the entire memory cell region 1A and the entire low breakdown voltage MISFET formation region 1B. Then, the sidewall spacers P1 not covered with the photoresist pattern PR1, and exposed are removed by etching. FIG. 21 shows this stage. Subsequently, the photoresist pattern PR1 is removed. The removal step of the sidewall spacer P1 of FIG. 21 is performed in this manner, thereby to remove the sidewall spacer P1 over the side surface of the lamination body LM1, the sidewall spacer P1 over the side surface of the memory gate electrode MG, the sidewall spacers P1 over the opposite side surfaces of the lamination body LM2, and the sidewall spacer P1 over the side surface of the lamination body LM3 on the source side. The sidewall spacer P1 over the side surface of the lamination body LM3 on the drain side has been covered with the photoresist pattern PR1, and hence is not removed, and is left.

In the removal step of the sidewall spacer P1 of FIG. 21, etching is preferably performed under the etching conditions such that the insulation film Z1 is less likely to be etched than the sidewall spacer P1. As a result, in the removal step of the sidewall spacer P1 of FIG. 21, the insulation film Z1 can be allowed to function as an etching stopper. This can suppress or prevent the insulation film Z1 from being etched. In the removal step of the sidewall spacer P1 of FIG. 21, at the stage upon completion of the etching step, the insulation film Z1 is preferably left in a layer shape over the main surface of the semiconductor substrate SB. This can prevent the semiconductor substrate SB, the memory gate electrode MG, and the like from being etched in the removal step of the sidewall spacer P1 of FIG. 21.

In the removal step of the sidewall spacer P1 of FIG. 21, in order to remove the sidewall spacer P1 with precision while suppressing the etching of the exposed insulation film Z1, isotropic etching is preferable, and wet etching is in particular preferable.

Figure 22:
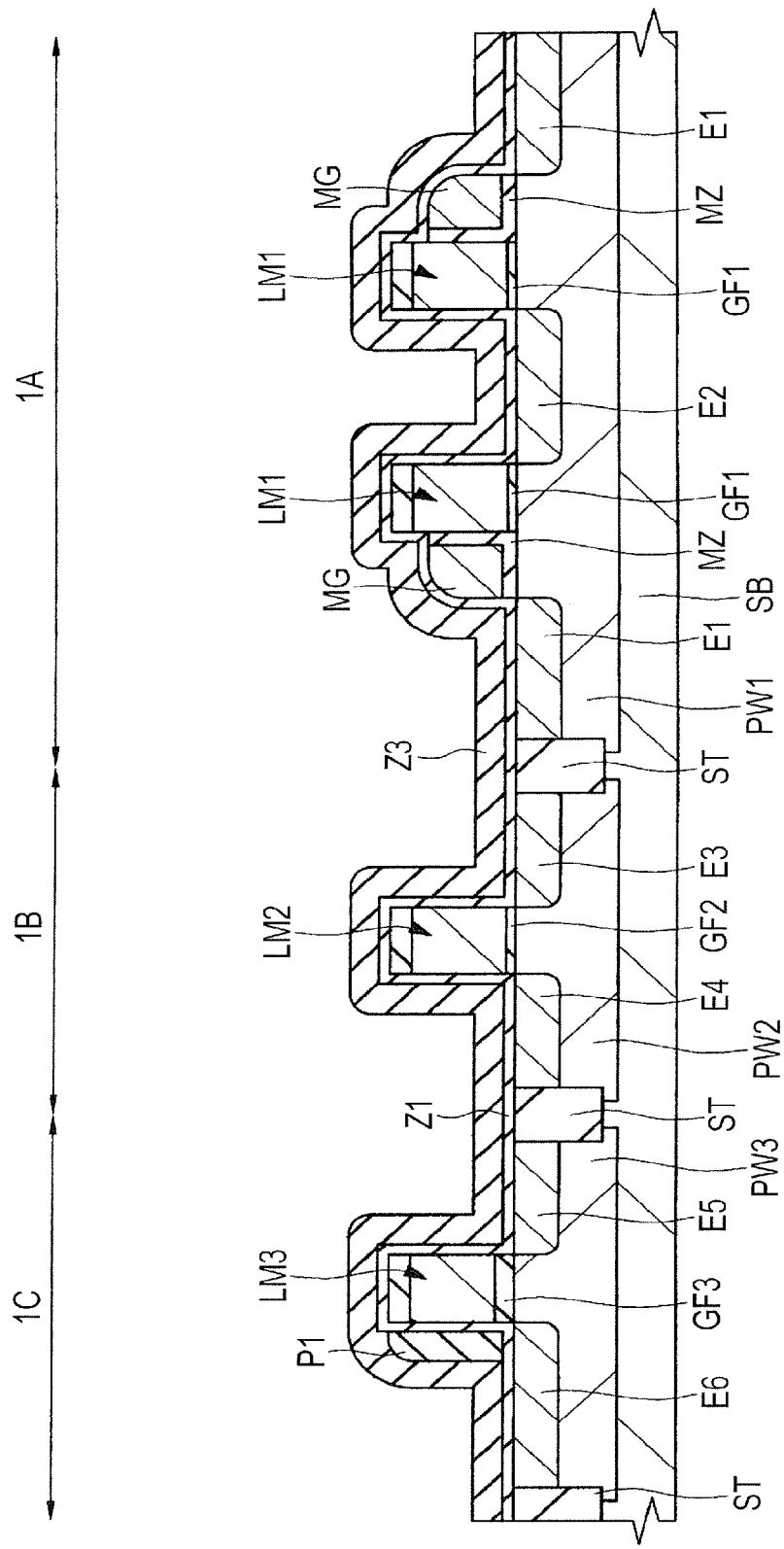
FIG. 22 is an essential part cross sectional view of the semiconductor device during a manufacturing step following FIG. 21.

Then, as shown in FIG. 22, entirely over the main surface of the semiconductor substrate SB, namely, over the insulation film Z1, an insulation film Z3 is formed in such a manner as to cover the sidewall spacer P1.

The insulation film Z3 and the insulation film Z1 are formed of mutually different insulation materials. This is for the following reason: when the insulation film Z3 is etched, the insulation film Z1 is allowed to function as an etching stopper film. For example, as the insulation film Z1, a silicon nitride film can be preferably used. As the insulation film Z3, a silicon oxide film can be preferably used. The formed film thickness of the insulation film Z3 can be set larger than the formed film thickness of the insulation film Z1.

Figure 23:
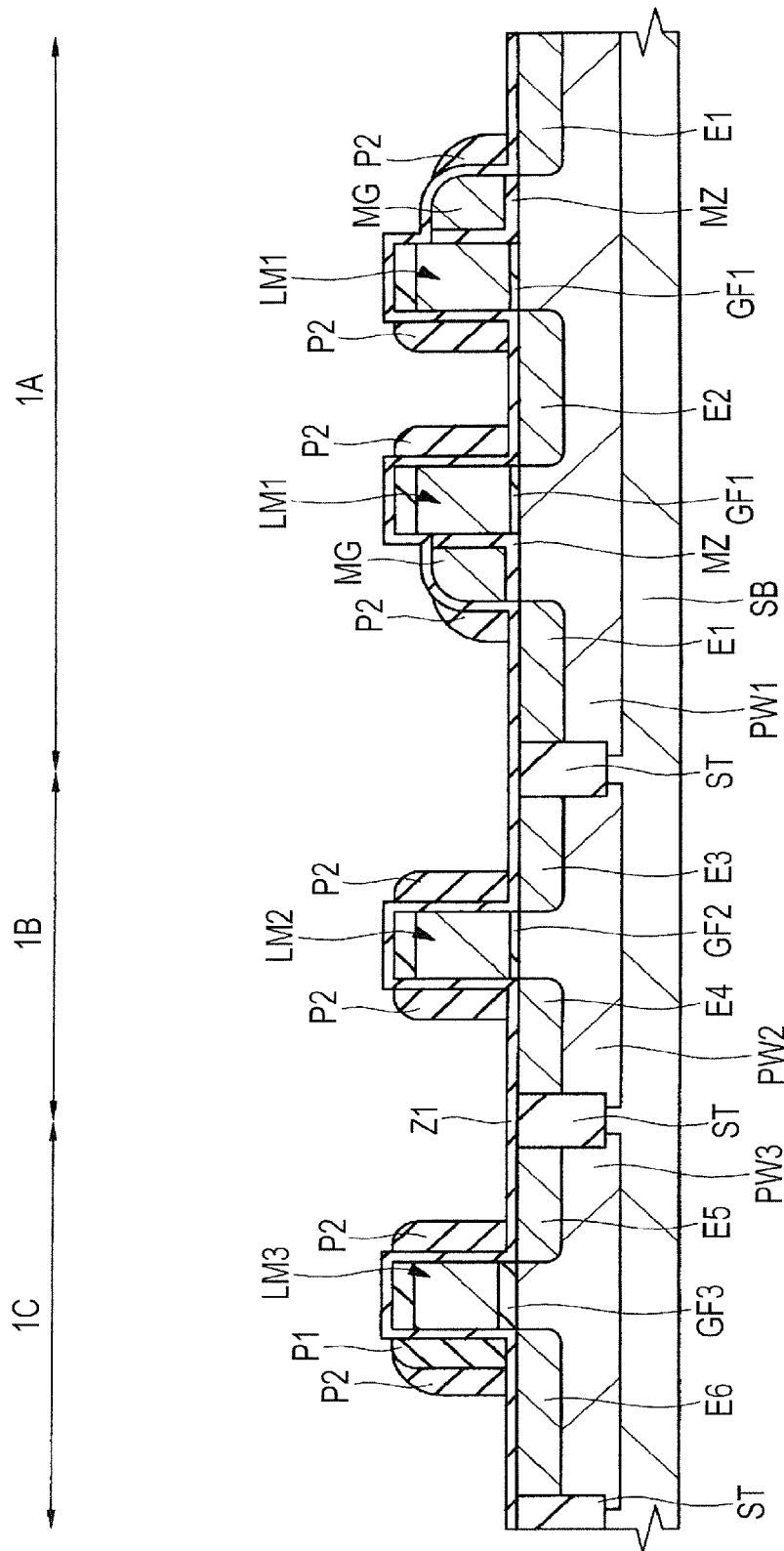
FIG. 23 is an essential part cross sectional view of the semiconductor device during a manufacturing step following FIG. 22.

Then, as shown in FIG. 23, the insulation film Z3 is etched back (anisotropically etched). As a result, over the side surfaces of the lamination body LM1 and the memory gate electrode MG (the side surfaces thereof opposite to the side surfaces thereof adjacent to each other via the insulation film MZ), over the side surfaces of the lamination body LM2, and over the side surfaces of the lamination body LM3, the insulation film Z3 is selectively left, thereby to form sidewall spacers (sidewall insulation films) P2. This step will be hereinafter referred to as "the etch back step of the insulation film Z3".

The sidewall spacers P2 are formed over the opposite side surfaces of the lamination body LM2, over the opposite side surfaces of the lamination body LM3, over the side surface of the lamination body LM1 opposite to the side surface on the side thereof adjacent to the memory gate electrode MG via the insulation film MZ, of the side surfaces of the lamination body LM1, and over the side surface of the memory gate electrode MG opposite to the side surface on the side thereof adjacent to the control gate electrode CG via the insulation film MZ, of the side surfaces of the memory gate electrode MG.

However, the sidewall spacers P2 are formed over the opposite side surfaces of the lamination body LM2 via the insulation film MZ1. The sidewall spacer P2 is formed over the side surface of the lamination body LM3 on the source side via the insulation film MZ1. The sidewall spacer P2 is formed over the side surface of the lamination body LM3 on the drain side via the insulation film MZ1 and the sidewall spacer P1. Whereas, the sidewall spacer P2 is formed over the side surface of the lamination body LM1 via the insulation film MZ1, and the sidewall spacer P2 is formed over the side surface of the memory gate electrode MG via the insulation film MZ1.

In the etch back step of the insulation film 23, the insulation film Z3 is left as the sidewall spacer P2 over the insulation film Z1, and the portions of the insulation film Z3 in other regions are removed. For this reason, when the etch back step of the insulation film Z3 is performed, the insulation film Z3 is locally left over the insulation film Z1, resulting in the sidewall spacer P2. As a result, the insulation film Z1 except for the portions thereof covered with the sidewall spacers P1 and P2 is exposed.

In the etch back step of the insulation film Z3, etch back is preferably performed under etching conditions such that the insulation film Z1 is less likely to be etched than the insulation film Z3. As a result, in the etch back step of the insulation film Z3, the insulation film Z1 can be allowed to function as an etching stopper. This can suppress or prevent the insulation film Z1 from being etched. At the stage upon completion of the etch back step of the insulation film Z3, the insulation film Z1 is preferably left in a layer shape over the main surface of the semiconductor substrate SB. This can prevent the semiconductor substrate SB, the memory gate electrode MG, and the like from being etched in the etch back step of the insulation film Z3.

Figure 24:
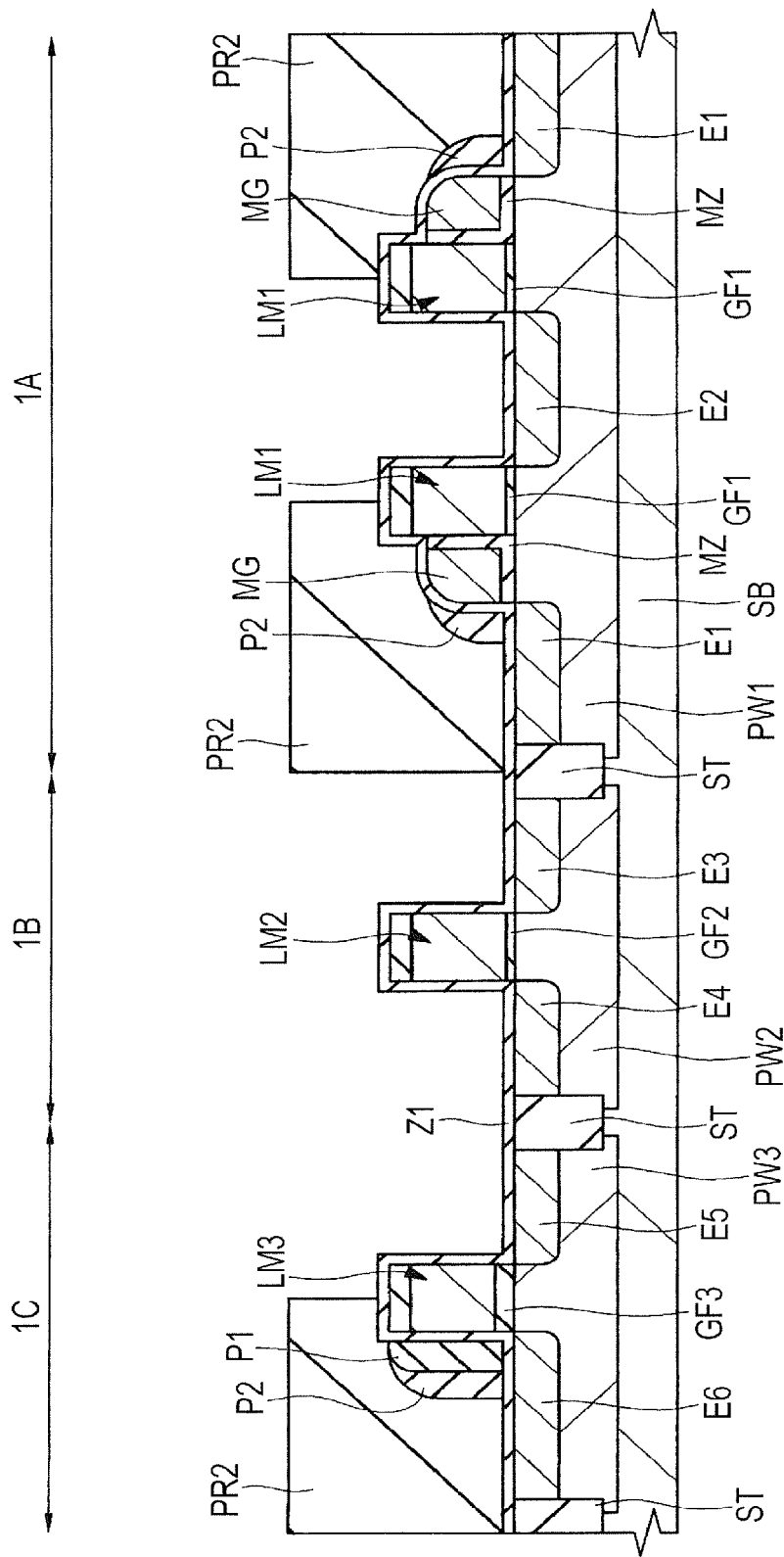
FIG. 24 is an essential part cross sectional view of the semiconductor device during a manufacturing step following FIG. 23.

Then, as shown in FIG. 24, the sidewall spacer P2 in the low breakdown voltage MISFET formation region 1B, the sidewall spacer P2 on the source side in the high breakdown voltage MISFET formation region 1C, and the sidewall spacer P2 on the drain side in the memory cell region 1A are removed. At this step, the sidewall spacer P2 on the drain side in the high breakdown voltage MISFET formation region 1C, and the sidewall spacer P2 on the source side in the memory cell region 1A are not removed, and are left. This step will be hereinafter referred to as the "removal step of the sidewall spacer P2 of FIG. 24".

Herein, the sidewall spacer P2 on the drain side in the high breakdown voltage MISFET formation region 1C corresponds to the sidewall spacer P2 formed on the side on which the drain region (semiconductor region D3) is formed, of the sidewall spacers P2 formed on the opposite sides of the lamination body LM3. Whereas, the sidewall spacer P2 on the source side in the high breakdown voltage MISFET formation region 1C corresponds to the sidewall spacer P2 formed on the side on which the source region (semiconductor region S3) is formed, of the sidewall spacers P2 formed on the opposite sides of the lamination body LM3. Further, the sidewall spacer P2 on the drain side in the memory cell region 1A corresponds to the sidewall spacer P2 on the side on which the semiconductor region D1 for drain is formed of the sidewall spacers P2 formed on the side surfaces of the lamination body LM1 and the memory gate electrode MG, namely, the sidewall spacer P2 formed over the side surface of the lamination body LM1. Whereas, the sidewall spacer P2 on the source side in the memory cell region 1A corresponds to the sidewall spacer P2 on the side on which the semiconductor region S1 for source is formed, of the sidewall spacers P2 formed over the side surfaces of the lamination body LM1 and the memory gate electrode MG, namely, the sidewall spacer P2 formed over the side surface of the memory gate electrode MG.

The removal step of the sidewall spacer P2 of FIG. 24 can be performed specifically in the following manner. Namely, as shown in FIG. 24, first, over the main surface of the semiconductor substrate SB, a photoresist pattern PR2 is formed as a mask layer using a photolithography technology. The photoresist pattern PR2 covers the sidewall spacers P1 and P2 on the drain side in the high breakdown voltage MISFET formation region 1C, and exposes the sidewall spacer P2 on the source side in the high breakdown voltage MISFET formation region 1C, and covers the sidewall spacer P2 on the source side in the memory cell region 1A, and exposes the sidewall spacer P2 on the drain side in the memory cell region 1A. Whereas, the entire low breakdown voltage MISFET formation region 1B is not covered with the photoresist pattern PR2, and is exposed. Then, the sidewall spacers P2 not covered with the photoresist pattern PR2, and exposed are removed by etching. FIG. 24 shows this stage. Subsequently, the photoresist pattern PR2 is removed. The removal step of the sidewall spacer P2 of FIG. 24 is performed in this manner, thereby to remove the sidewall spacer P1 over the side surface of the lamination body LM1, the sidewall spacers P1 over the opposite side surfaces of the lamination body LM2, and the sidewall spacer P1 over the side surface of the lamination body LM3 on the source side. The sidewall spacer P1 over the side surface of the memory gate electrode MG, and the sidewall spacer P1 over the side surface of the lamination body LM3 on the drain side have been covered with the photoresist pattern PR2, and hence are not removed, and are left.

In the removal step of the sidewall spacer P2 of FIG. 24, etching is preferably performed under the etching conditions such that the insulation film Z1 is less likely to be etched than the sidewall spacer P2. As a result, in the removal step of the sidewall spacer P2 of FIG. 24, the insulation film Z1 can be allowed to function as an etching stopper. This can suppress or prevent the insulation film Z1 from being etched. At the stage upon completion of the removal step of the sidewall spacer P2 of FIG. 24, the insulation film Z1 is preferably left in a layer shape over the main surface of the semiconductor substrate SB. This can prevent the semiconductor substrate SB, the memory gate electrode MG, and the like from being etched in the removal step of the sidewall spacer P2 of FIG. 24.

Figure 25:
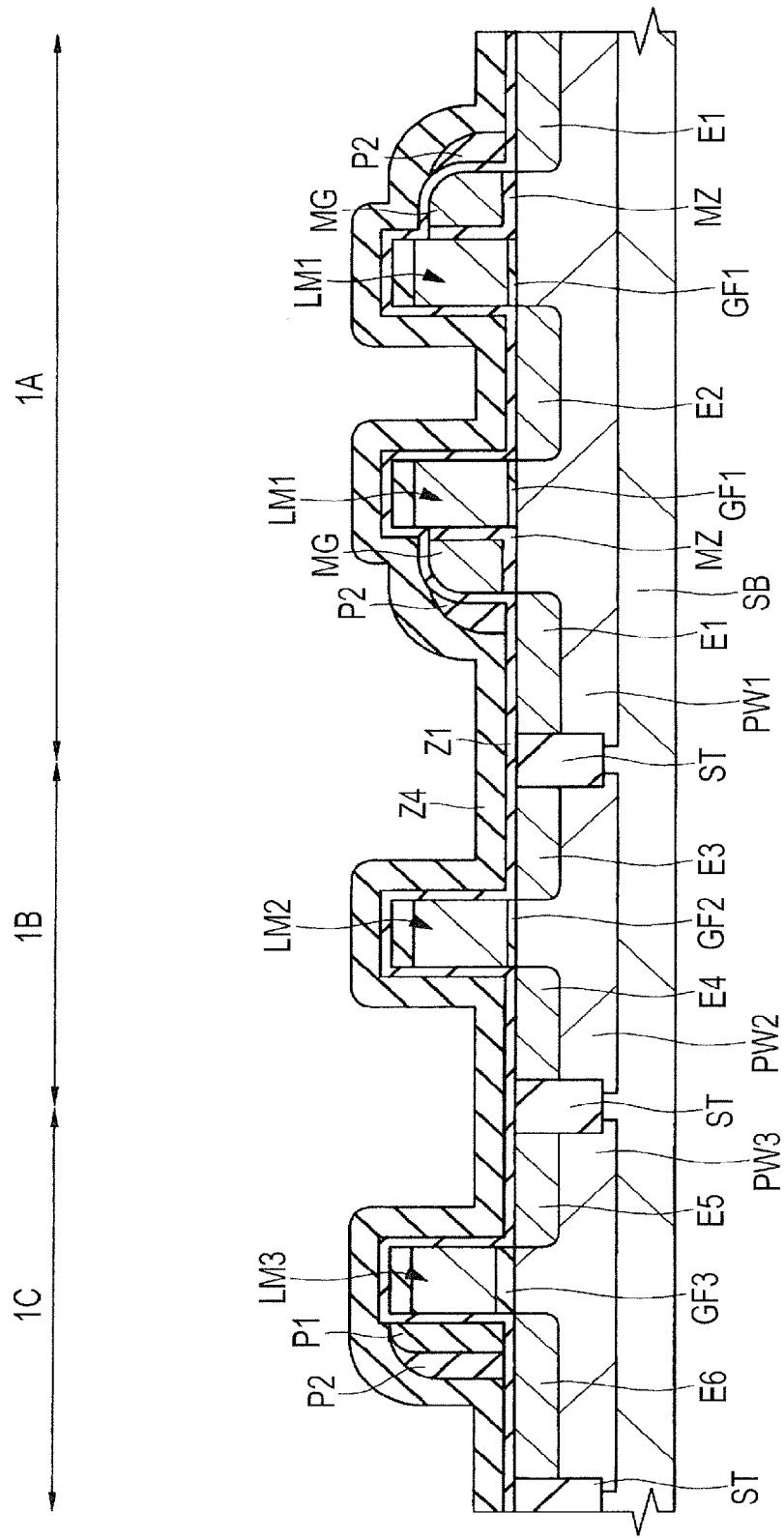
FIG. 25 is an essential part cross sectional view of the semiconductor device during a manufacturing step following FIG. 24.

Then, as shown in FIG. 25, entirely over the main surface of the semiconductor substrate SB, namely, over the insulation film Z1, the insulation film Z4 is formed in such a manner as to cover the sidewall spacers P1 and P2.

The insulation film Z4 and the insulation film Z1 are formed of mutually different insulation materials. This is for the following reason: when the insulation film Z4 is etched, the insulation film Z1 is allowed to function as an etching stopper film. For example, as the insulation film Z1, a silicon nitride film can be preferably used. As the insulation film Z4, a silicon oxide film can be preferably used. The formed film thickness of the insulation film Z4 can be set larger than the formed film thickness of the insulation film Z1.

Figure 26:
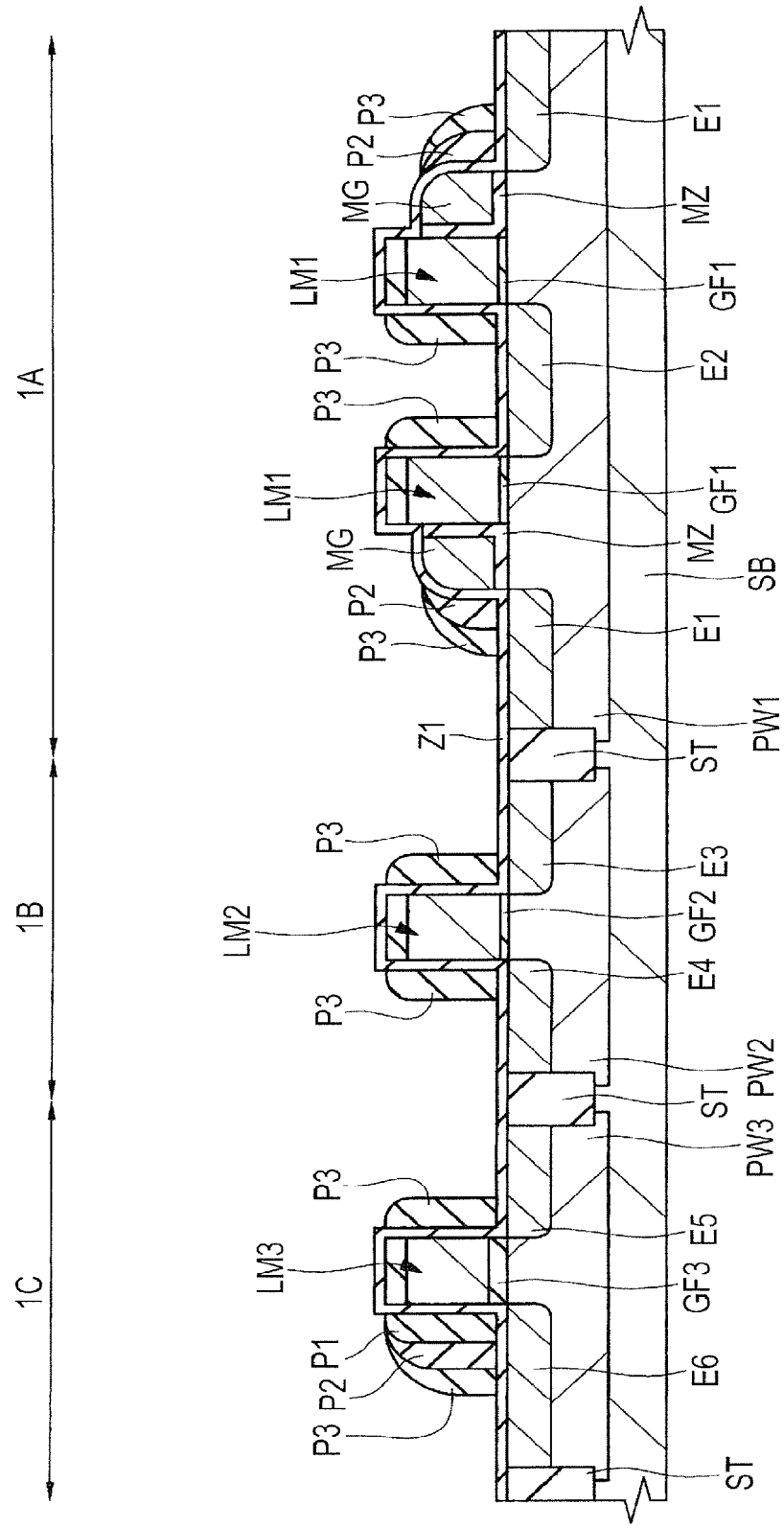
FIG. 26 is an essential part cross sectional view of the semiconductor device during a manufacturing step following FIG. 25.

Then, as shown in FIG. 26, the insulation film Z4 is etched back (anisotropically etched). As a result, the insulation film Z3 is selectively left over the side surfaces of the lamination body LM1 and the memory gate electrode MG (the side surfaces thereof opposite to the side surfaces thereof adjacent to each other via the insulation film MZ), over the side surfaces of the lamination body LM2, and over the side surfaces of the lamination body LM3. As a result, sidewall spacers (sidewall insulation films) P3 are formed. This step will be hereinafter referred to as "the etch back step of the insulation film Z4".

The sidewall spacers P3 are formed over opposite side surfaces of the lamination body LM2, over the opposite side surfaces of the lamination body LM3, over the side surface of the lamination body LM1 opposite to the side surface on the side thereof adjacent to the memory gate electrode MG via the insulation film MZ, of the side surfaces of the lamination body M1, and over the side surface of the memory gate electrode MG opposite to the side surface on the side thereof adjacent to the control gate electrode CG via the insulation film MZ, of the side surfaces of the memory gate electrode MG.

However, the sidewall spacers P2 are formed over the opposite side surfaces of the lamination body LM2 via the insulation film MZ1. The sidewall spacer P3 is formed over the side surface of the lamination body LM3 on the source side via the insulation film MZ1; and the sidewall spacer P3 is formed over the side surface of the lamination body LM3 on the drain side via the insulation film MZ1, the sidewall spacer P1, and the sidewall spacer P2. Whereas, the sidewall spacer P3 is formed over the side surface of the lamination body LM1 via the insulation film MZ1, and the sidewall spacer P3 is formed over the side surface of the memory gate electrode MG via the insulation film MZ1 and the sidewall spacer P2.

In the etch back step of the insulation film Z4, the insulation film Z4 is left as the sidewall spacer P3 over the insulation film Z1, and the portions of the insulation film Z4 in other regions are removed. For this reason, when the etch back step of the insulation film Z4 is performed, the insulation film Z4 is locally left over the insulation film Z1, resulting in the sidewall spacer P2. As a result, the insulation film Z1 except for the portions thereof covered with the sidewall spacers P1, P2 and P3 is exposed.

In the etch back step of the insulation film Z4, etch back is preferably performed under the etching conditions such that the insulation film Z1 is less likely to be etched than the insulation film Z4. As a result, in the etch back step of the insulation film Z4, the insulation film Z1 can be allowed to function as an etching stopper. This can suppress or prevent the insulation film Z1 from being etched.

Figure 27:
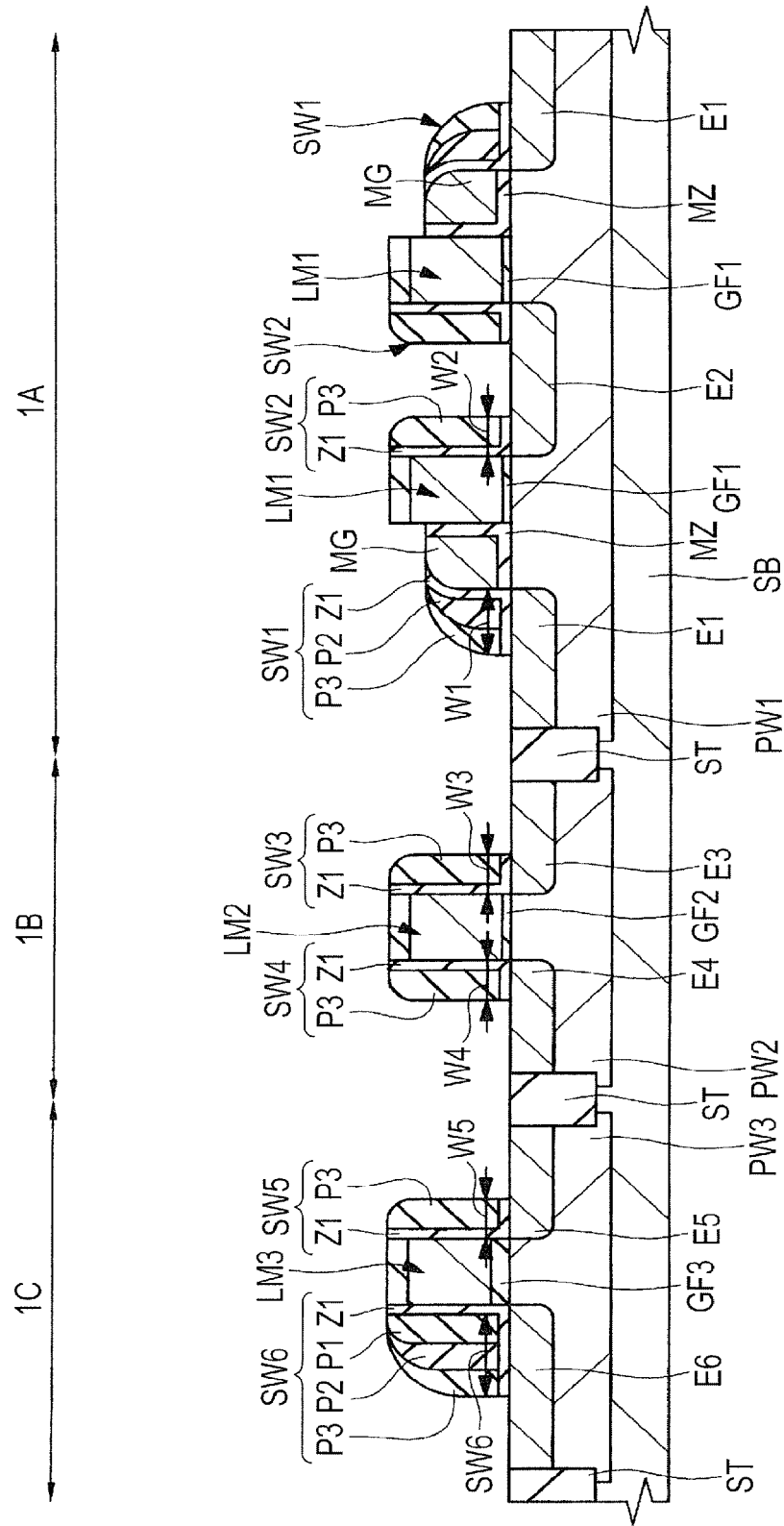
FIG. 27 is an essential part cross sectional view of the semiconductor device during a manufacturing step following FIG. 26.

Then, as shown in FIG. 27, of the insulation film MZ1, the portions not covered with the sidewall spacers P1, P2, and P3, and exposed are removed by etching. This step will be hereinafter referred to as the "removal step of the insulation film Z1 of FIG. 27".

In the removal step of the insulation film Z1 of FIG. 27, etching is preferably performed under the etching conditions such that the sidewall spacers P1, P2, and P3, the memory gate electrode MG, and the semiconductor substrate SB are less likely to be etched than the insulation film Z1. This can suppress or prevent the sidewall spacers P1, P2, and P3, the memory gate electrode MG, and the semiconductor substrate SB from being etched in the removal step of the insulation film Z1 of FIG. 27.

By performing the steps of FIGS. 19 to 27 in this manner, it is possible to form the sidewall spacers SW1, SW2, SW3, SW4, SW5, and SW6 over the side surfaces of the lamination body LM1 and the memory gate electrode MG (the side surfaces opposite to the sides thereof adjacent to each other via the insulation film MZ), over the side surfaces of the lamination body LM2, and over the side surfaces of the lamination body LM3.

Namely, the insulation film Z1, the sidewall spacer P2, and the sidewall spacer P3 formed over the side surface (sidewall) of the memory gate electrode MG form a sidewall spacer SW1. Whereas, the insulation film Z1 and the sidewall spacer P3 formed over the side surface (sidewall) of the lamination body LM1 form a sidewall spacer SW2. Further, the insulation film Z1 and the sidewall spacer P3 formed over the side surface (sidewall) of the lamination body LM2 on the source side form a sidewall spacer SW3. Still further, the insulation film Z1 and sidewall spacer P3 formed over the side surface (sidewall) of the lamination body LM2 on the drain side form a sidewall spacer SW4. Furthermore, the insulation film Z1 and the sidewall spacer P3 formed over the side surface (sidewall) of the lamination body LM3 on the source side form a sidewall spacer SW5. Still further, the insulation film Z1, the sidewall spacer P1, the sidewall spacer P2, and the sidewall spacer P3 formed over the side surface (sidewall) of the lamination body LM3 on the drain side form a sidewall spacer SW6.

Accordingly, the sidewall spacer SW1 is formed adjacent to the side surface of the memory gate electrode MG, and the sidewall spacer SW2 is formed adjacent to the side surface of the lamination body LM1 (control gate electrode CG). Whereas, the sidewall spacer SW3 is formed adjacent to the side surface of the lamination body LM1 (gate electrode GE3) on the source side, and the sidewall spacer SW4 is formed adjacent to the side surface of the lamination body LM1 (gate electrode GE3) on the drain side. Further, the sidewall spacer SW5 is formed adjacent to the side surface of the lamination body LM2 (gate electrode GE4) on the source side, and the sidewall spacer SW6 is formed adjacent to the side surface of the lamination body LM2 (gate electrode GE4) on the drain side.

The width W6 of the sidewall spacer SW6 formed over the side surface of the lamination body LM3 on the drain side is larger than the width W5 of the sidewall spacer SW5 formed over the side surface of the lamination body LM3 on the source side (W6>W5). Whereas, the width W1 of the sidewall spacer SW1 formed over the side surface of the memory gate electrode MG is larger than the width W2 of the sidewall spacer SW2 formed over the side surface of the lamination body LM1 (W1>W2). On the other hand, the width W3 of the sidewall spacer SW3 formed over the side surface of the lamination body LM2 on the source side and the width W4 of the sidewall spacer SW4 formed over the side surface of the lamination body LM2 on the drain side are nearly equal to each other (W3=W4).

Figure 28:
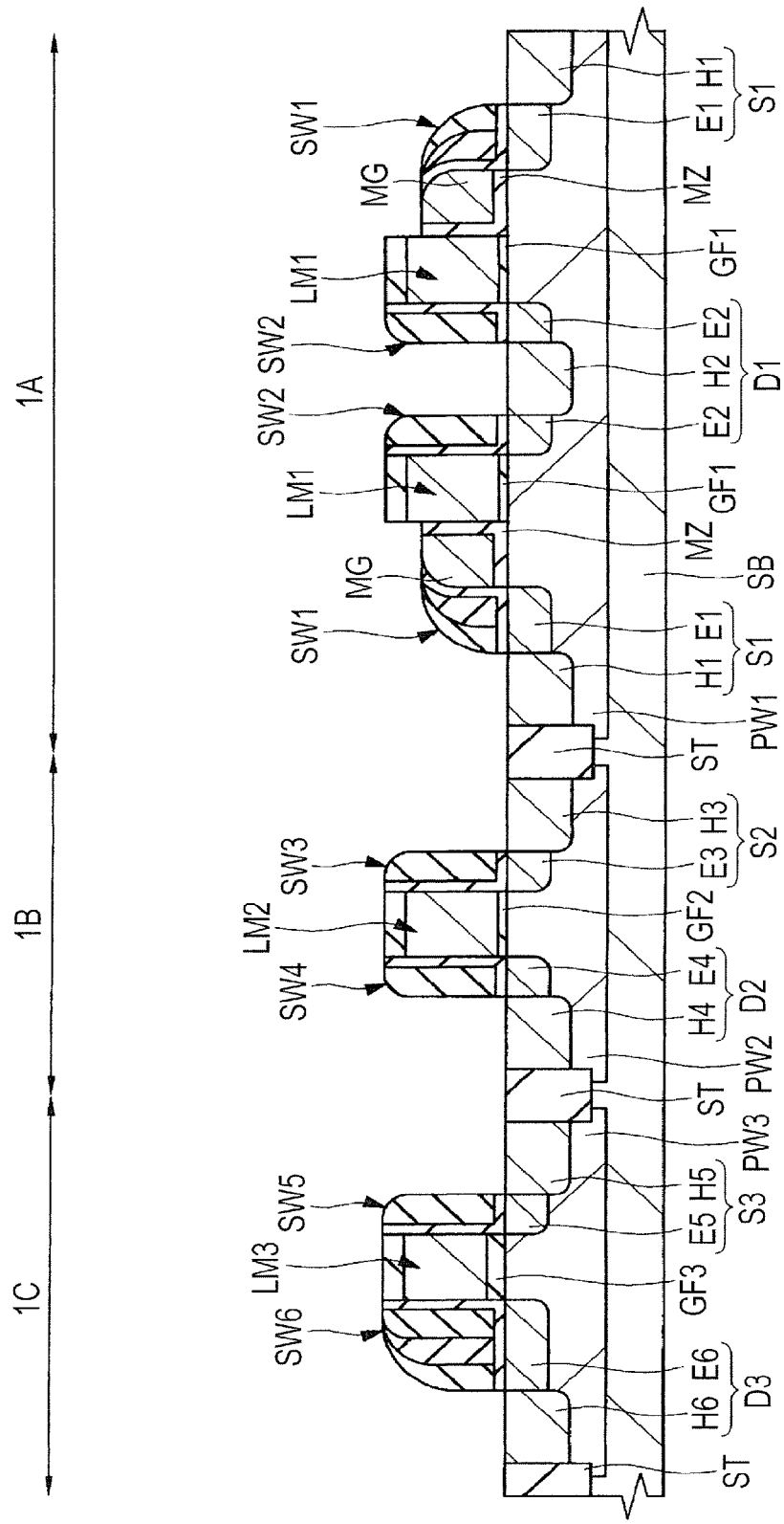
FIG. 28 is an essential part cross sectional view of the semiconductor device during a manufacturing step following FIG. 27.

Then, as shown in FIG. 28, $n^+$ type semiconductor regions (impurity diffusion layers) H1, H2, H3, H4, H5, and H6 are formed using an ion implantation method, or the like.

Specifically, an n type impurity such as arsenic (As) or phosphorus (P) is ion implanted into the semiconductor substrate SB (p type wells PW1, PW2, and PW3) using the memory gate electrode MG, and the lamination bodies LM1, LM2, and LM3, and the sidewall spacers SW over their respective side surfaces as a mask (an ion implantation inhibiting mask). As a result, it is possible to form the $n^+$ type semiconductor regions H1, H2, H3, H4, H5, and H6. At this step, the $n^+$ type semiconductor region H1 is formed in self-alignment with the sidewall spacer SW1 over the side surface of the memory gate electrode MG in the memory cell region 1A, and the $n^+$ type semiconductor region H2 is formed in self-alignment with the sidewall spacer SW2 over the side surface of the lamination body LM1 (control gate electrode CG) in the memory cell region 1A. Whereas, in the low breakdown voltage MISFET formation region 1B, the $n^+$ type semiconductor region H3 is formed in self-alignment with the sidewall spacer SW3 over the side surface of the lamination body LM2 (gate electrode GE3) on the source side, and the $n^+$ type semiconductor region H4 is formed in self-alignment with the sidewall spacer SW4 over the side surface of the lamination body LM2 (gate electrode GE3) on the drain side. Further, in the high breakdown voltage MISFET formation region 1C, the $n^+$ type semiconductor region H5 is formed in self-alignment with the sidewall spacer SW5 over the side surface of the lamination body LM3 (gate electrode GE4) on the source side, and the $n^+$ type semiconductor region H6 is formed in self-alignment with the sidewall spacer SW6 over the side surface of the lamination body LM3 (gate electrode GE4) on the drain side. As a result, a LDD structure is formed. The $n^+$ type semiconductor region H1, the $n^+$ type semiconductor region H2, the $n^+$ type semiconductor region H3, the $n^+$ type semiconductor region H4, the $n^+$ type semiconductor region H5, and the $n^+$ type semiconductor region H6 can be formed by the same ion implantation step, but can also be formed by different ion implantation steps.

In this manner, the $n^-$ type semiconductor region E1, and the $n^+$ type semiconductor region H1 with a higher impurity concentration than that thereof form an n type semiconductor region S1 functioning as the source region of the memory transistor; the $n^-$ type semiconductor region E2, and the $n^+$ type semiconductor region H2 with a higher impurity concentration than that thereof form an n type semiconductor region D1 functioning as the drain region of the control transistor. Whereas, the $n^-$ type semiconductor region E3, and the $n^+$ type semiconductor region H3 with a higher impurity concentration than that thereof form an n type semiconductor region S2 functioning as the source region of the low breakdown voltage MISFET Q1. The $n^-$ type semiconductor region E4, and the $n^+$ type semiconductor region H4 with a higher impurity concentration than that thereof form an n type semiconductor region D2 functioning as the drain region of the low breakdown voltage MISFET Q1. Further, the $n^-$ type semiconductor region E5, and the $n^+$ type semiconductor region H5 with a higher impurity concentration than that thereof form an n type semiconductor region S3 functioning as the source region of the high breakdown voltage MISFET Q2. The $n^-$ type semiconductor region E6, and the $n^+$ type semiconductor region H6 with a higher impurity concentration than that thereof form an n type semiconductor region D3 functioning as the drain region of the high breakdown voltage MISFET Q2.

The distance (space) between the $n^+$ type semiconductor region H1 and the channel region of the memory transistor is defined by the sidewall spacer SW1, and the distance (space) between the $n^+$ type semiconductor region H2 and the channel region of the control transistor is defined by the sidewall spacer SW2. Thus, the distances between the high-concentration regions (H1, H2, H3, H4, H5, and H6) and their respective corresponding channel regions are defined by the sidewall spacers (SW1, SW2, SW3, SW4, SW5, and SW6), respectively. This also holds for the sidewall spacers SW3, SW4, SW5, and SW6. For this reason, reflecting the fact that the width W1 of the sidewall spacer SW1 is larger than the width W2 of the sidewall spacer SW2 (W1>W2), the dimension L1 of the $n^-$ type semiconductor region E1 is larger than the dimension L2 of the $n^-$ type semiconductor region E2 (L1>L2). Whereas, reflecting the fact that the width W3 of the sidewall spacer SW3 and the width W4 of the sidewall spacer SW4 are nearly equal to each other (W1=W2), the dimension L3 of the $n^-$ type semiconductor region E3 and the dimension L4 of the $n^-$ semiconductor region E4 are nearly equal to each other (L3=L4). Further, reflecting the fact that the width W6 of the sidewall spacer SW6 is larger than the width W5 of the sidewall spacer SW5 (W6>W5), the dimension L6 of the $n^-$ type semiconductor region E6 is larger than the dimension L5 of the $n^-$ type semiconductor region E5 (L6>L5). Herein, the dimensions L1 and L2 are shown in FIG. 3; the dimensions L3 and L4 are shown in FIG. 4; and the dimensions L5 and L6 are shown in FIG. 5.

Then, activation annealing is performed which is a heat treatment for activating each impurity doped into the semiconductor regions for source and drain (the $n^-$ type semiconductor regions E1, E2, E3, E4, E5, and E6, and the $n^+$ type semiconductor regions H1, H2, H3, H4, H5, and H6), and the like.

Figure 29:
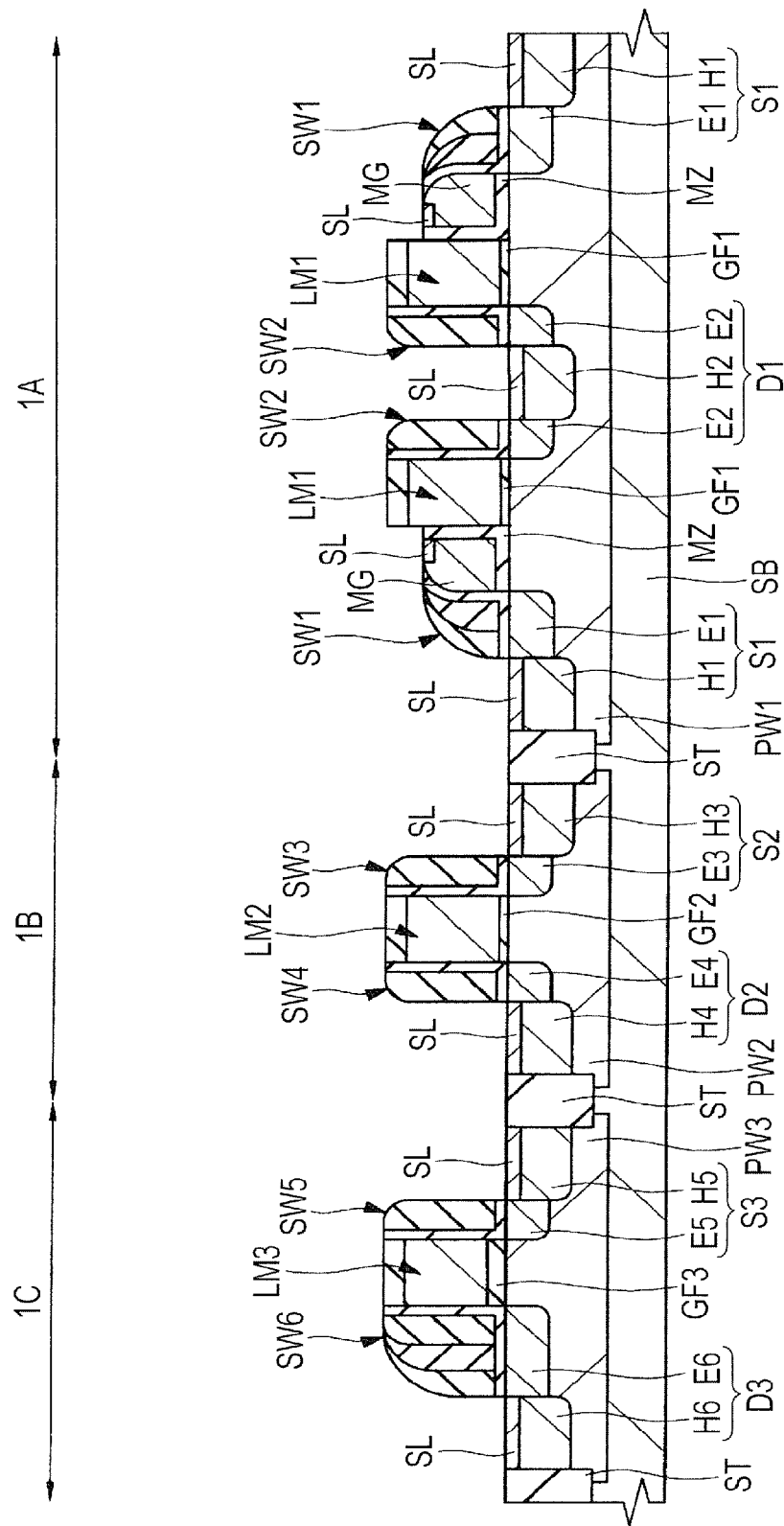
FIG. 29 is an essential part cross sectional view of the semiconductor device during a manufacturing step following FIG. 28.

Then, as shown in FIG. 29, metal silicide layers SL are formed over the top surfaces of the $n^+$ type semiconductor regions H1, H2, H3, H4, H5, and H6, and over the top surface of each memory gate electrode MG using a salicide technology.

The metal silicide layer SL can be formed specifically in the following manner. Namely, entirely over the main surface of the semiconductor substrate SB, a metal film for forming the metal silicide layer SL is formed in such a manner as to cover the memory gate electrodes MG, the lamination bodies LM1, LM2, and LM3, and the sidewall spacers SW1, SW2, SW3, SW4, SW5, and SW6. The metal film is formed of, for example, a cobalt (Co) film, a nickel (Ni) film, or a nickel platinum alloy film. Then, the semiconductor substrate SB is subjected to a heat treatment. As a result, each top of the $n^+$ type semiconductor regions H1, H2, H3, H4, H5, and H6, and the memory gate electrodes MG is allowed to react with the metal film. This results in the formation of the metal silicide layers SL at respective tops of the $n^+$ type semiconductor regions H1, H2, H3, H4, H5, and H6, and the memory gate electrodes MG as shown in FIG. 29. Then, the unreacted portions of the metal film are removed. FIG. 29 shows the cross sectional view at this stage.

Figure 30:
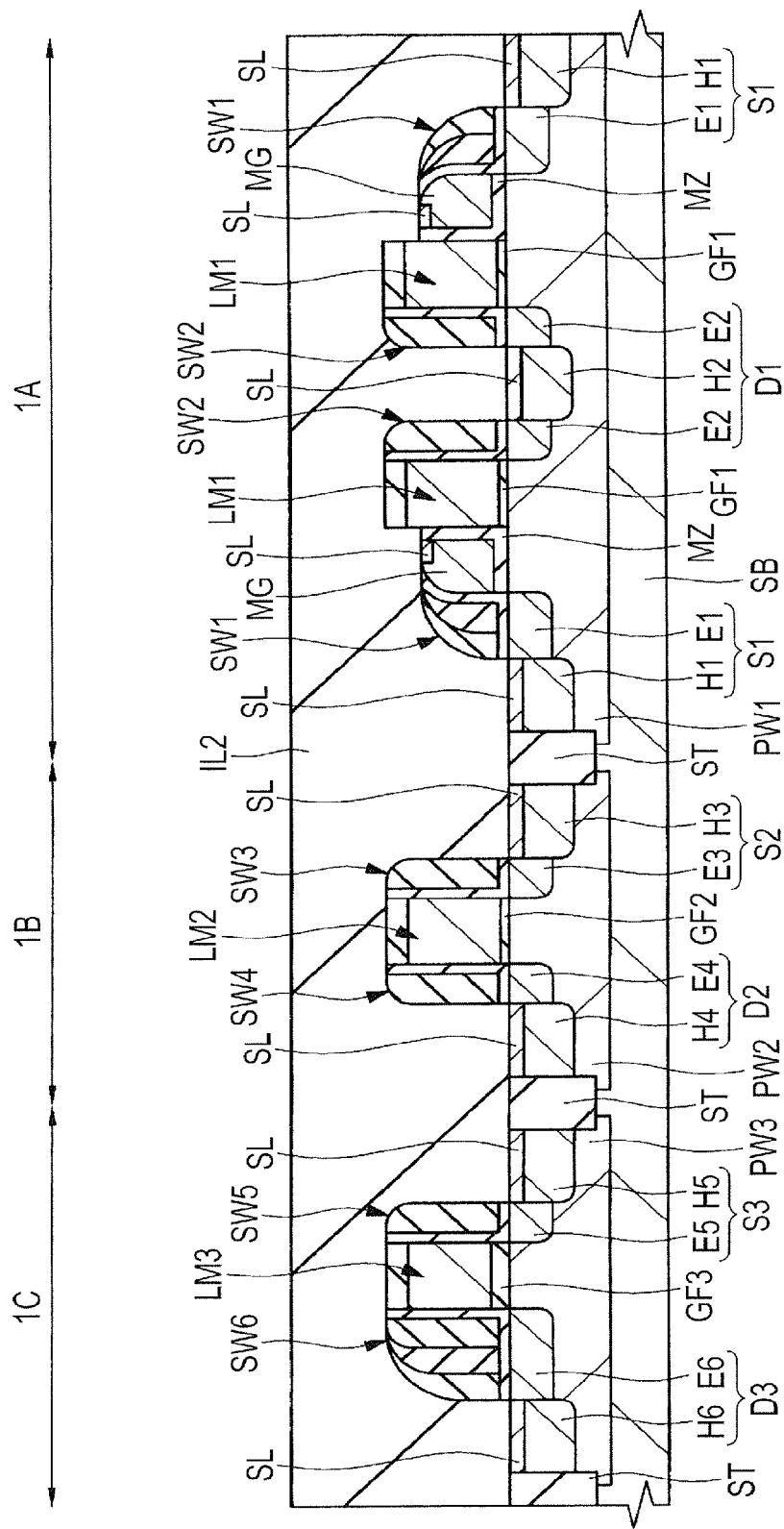
FIG. 30 is an essential part cross sectional view of the semiconductor device during a manufacturing step following FIG. 29.

Then, as shown in FIG. 30, entirely over the main surface of the semiconductor substrate SB, an insulation film (interlayer insulation film) IL2 is formed (deposited) in such a manner as to cover the memory gate electrodes MG, the lamination bodies LM1, LM2, and LM3, and the sidewall spacers SW.

The insulation film IL2 is formed of a single film of a silicon oxide film, a lamination film of a silicon nitride film, and a silicon oxide film formed thicker than the silicon nitride film over the silicon nitride film, or the like, and can be formed using, for example, a CVD method.

Then, the top surface of the insulation film IL2 is polished using a CMP (Chemical Mechanical Polishing) method, or the like. By this polishing step, respective top surfaces of the gate electrode GE3, the gate electrode GE4, and the control gate electrode CG are exposed. This polishing step will be hereinafter referred to as "the polishing step of the insulation film IL2 of FIG. 31".

Figure 31:
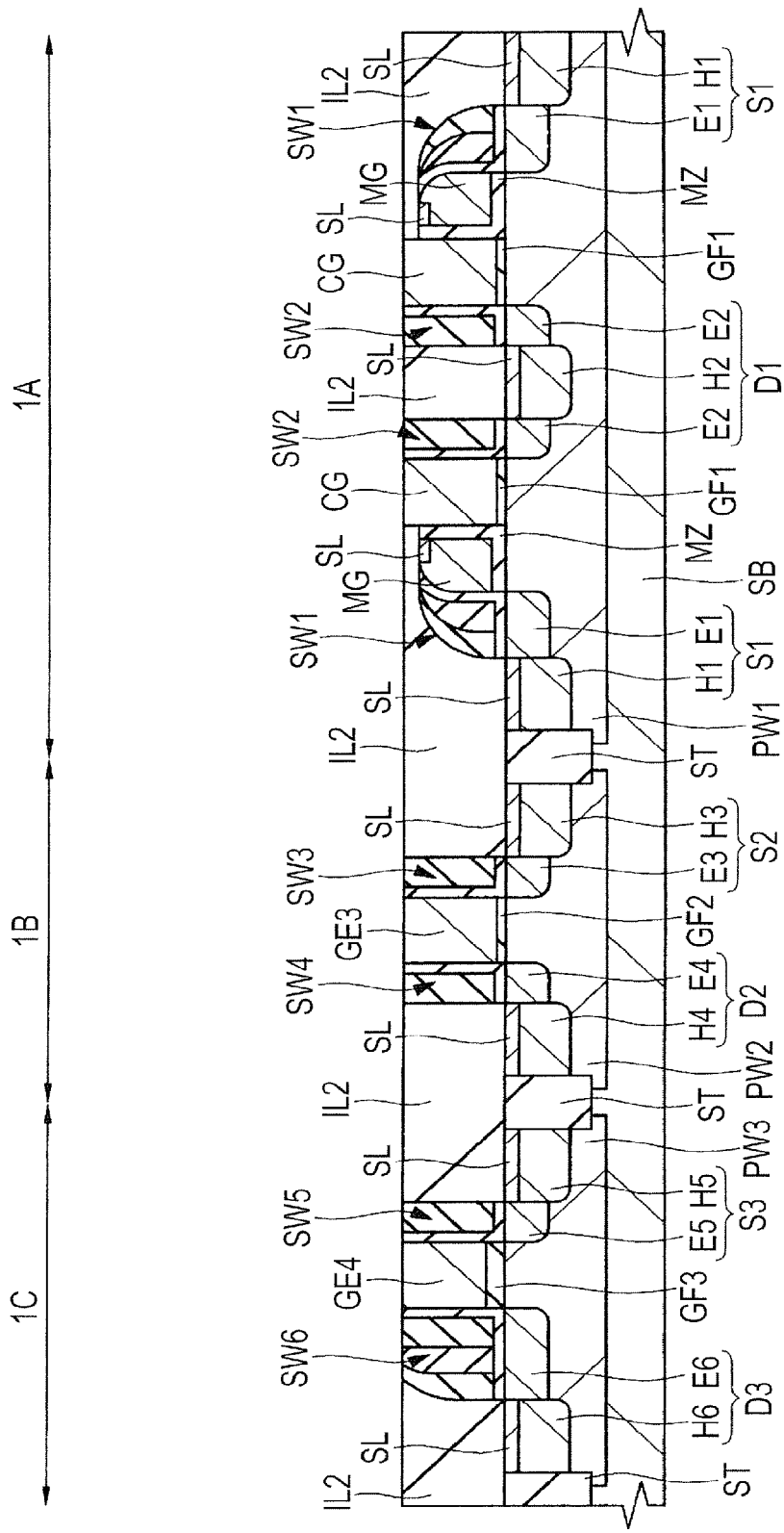
FIG. 31 is an essential part cross sectional view of the semiconductor device during a manufacturing step following FIG. 30.

In the polishing step of the insulation film IL2 of FIG. 31, the insulation film IL2 is polished until respective top surfaces of the gate electrode GE3 and the gate electrode GE4 are exposed. However, the height of the control gate electrode CG is equal to each height of the gate electrodes GE3 and GE4. For this reason, when respective top surfaces of the gate electrodes GE3 and GE4 are exposed, the top surface of the control gate electrode CG is also exposed. Accordingly, in the polishing step of the insulation film IL2 of FIG. 31, the cap insulation films CP1, CP2, and CP3 are also polished and removed. Further, respective tops of the sidewall spacers SW2, SW3, SW4, SW5, and SW6 can also polished.

Incidentally, the following is also possible: when the silicon film PS2 is etched back to form the memory gate electrode MG in the step of FIG. 14, the height (the height of the topmost part) of the memory gate electrode MG is set lower than the height (the height of the top surface) of the control gate electrode CG; as a result, in the polishing step of the insulation film IL2 of FIG. 31, respective top surfaces of the gate electrodes GE3 and GE4, and the control gate electrode CG are exposed, but the memory gate electrode MG is prevented from being exposed. This eliminates the necessity of polishing of the metal silicide layer SL over the memory gate electrode MG in the polishing step of the insulation film IL2 of FIG. 31. Accordingly, the polishing step becomes more likely to be performed.

Figure 32:
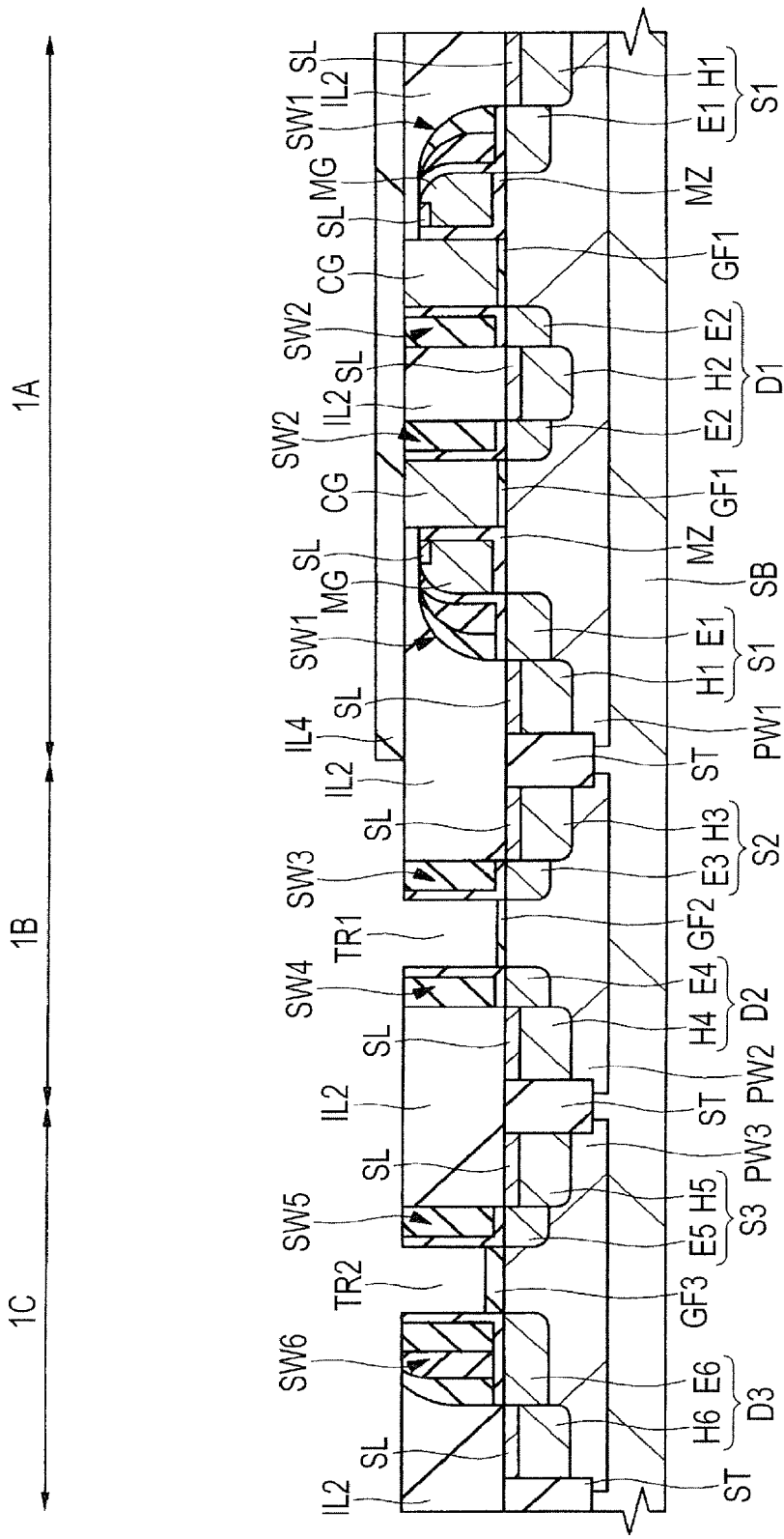
FIG. 32 is an essential part cross sectional view of the semiconductor device during a manufacturing step following FIG. 31.

Then, as shown in FIG. 32, an insulation film IL4 is formed over the insulation film IL2 in such a manner as to cover the memory cell region 1A, and to expose the low breakdown voltage MISFET formation region 1B and the high breakdown voltage MISFET formation region 1C. The insulation film IL4 can be formed in the following manner. An insulation film is formed over the insulation film IL2 including the memory cell region 1A, the low breakdown voltage MISFET formation region 1B, and the high breakdown voltage MISFET formation region 1C; then, the insulation film is patterned using a photolithography technology and an etching technology. The formation of the insulation film IL4 results in the following state. The control gate electrode CG and the memory gate electrode MG are covered with the insulation film IL4, and hence are not exposed; on the other hand, respective top surfaces of the gate electrodes GE3 and GE4 are not covered with the insulation film IL4, and are exposed.

Then, as shown in FIG. 32, the gate electrode GE3 and the gate electrode GE4 are etched and removed. This step will be hereinafter referred to as "the etching step of the gate electrodes GE3 and GE4 of FIG. 32".

In the etching step of the gate electrodes GE3 and GE4 of FIG. 32, etching is preferably performed under the conditions such that the insulation film IL4, the insulation film IL2, the sidewall spacers SW, the insulation film MZ, the insulation film GF2, and the insulation film GF3 are less likely to be etched than the gate electrodes GE3 and GE4. As a result, in the etching step of the gate electrodes GE3 and GE4 of FIG. 32, the gate electrode GE3 and the gate electrode GE4 can be selectively etched. The gate electrodes GE3 and GE4 are each formed of silicon. For this reason, in the etching step of the gate electrodes GE3 and GE4 of FIG. 32, it is easy to ensure a high etching selectivity for the gate electrodes GE3 and GE4. The etching step of the gate electrodes GE3 and GE4 of FIG. 32 is performed with respective top surfaces of the gate electrodes GE3 and GE4 exposed, and with the control gate electrode CG and the memory gate electrode MG not exposed. Accordingly, the gate electrodes GE3 and GE4 are selectively etched and removed, and the control gate electrode CG and the memory gate electrode MG are not etched, and are left as they are.

In the etching step of the gate electrodes GE3 and GE4 of FIG. 32, the gate electrodes GE3 and GE4 were removed. As a result, trenches (concave parts or pit parts) TR1 and TR2 are formed. The trench TR1 is a region obtained by removing the gate electrode GE3, and corresponds to the region in which the gate electrode GE3 was present until the gate electrode GE3 was removed. Whereas, the trench TR2 is a region obtained by removing the gate electrode GE4, and corresponds to the region in which the gate electrode GE4 was present until the gate electrode GE4 was removed. The bottom surface of the trench TR1 is formed of the top surface of the insulation film GF2, and the side surface of the trench TR1 is formed of the insulation film Z1 forming the sidewall spacers SW3 and SW4. The bottom surface of the trench TR2 is formed of the top surface of the insulation film GF3, and the side surface of the trench TR2 is formed of the insulation film Z1 forming the sidewall spacers SW5 and SW6.

Figure 33:
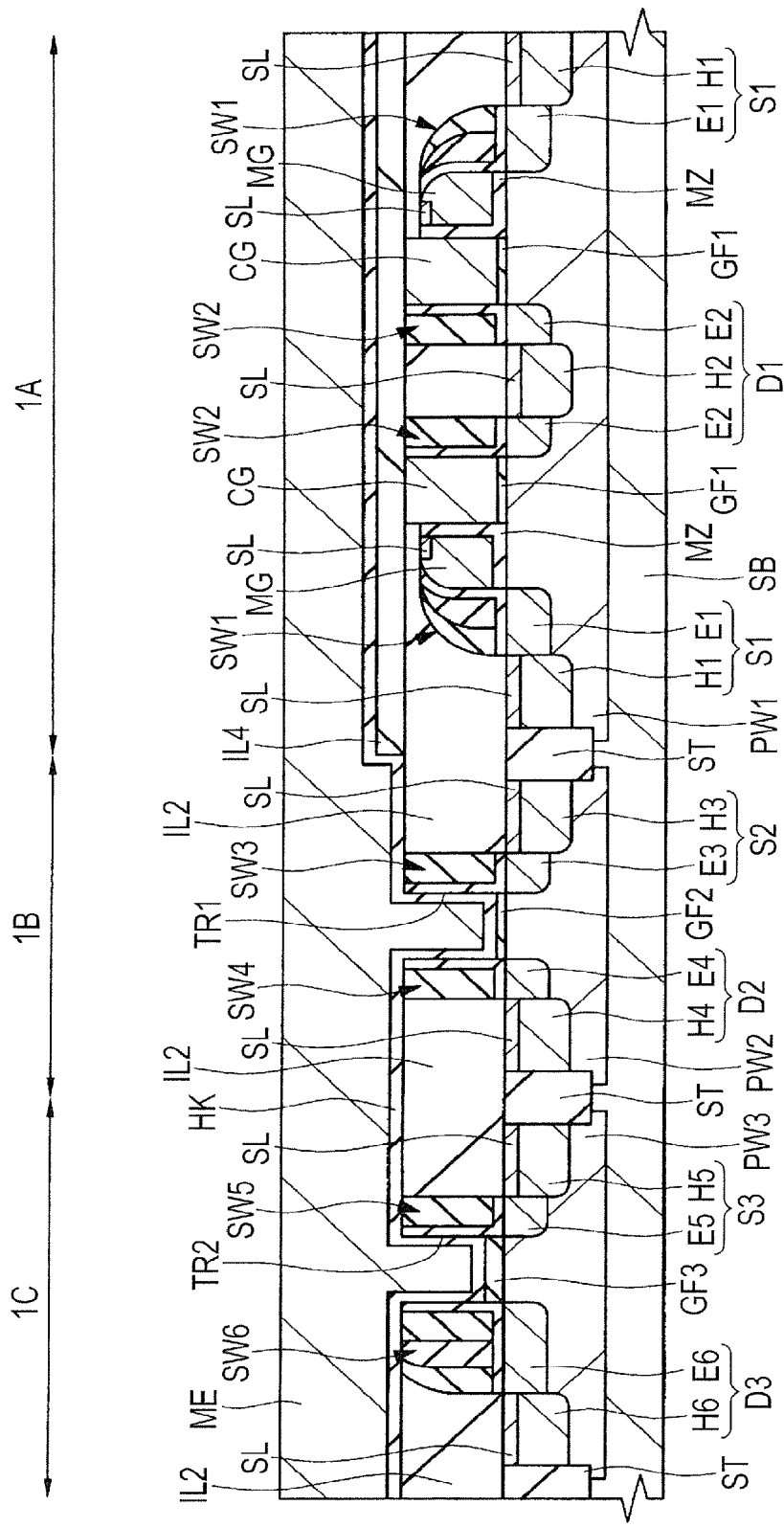
FIG. 33 is an essential part cross sectional view of the semiconductor device during a manufacturing step following FIG. 32.

Then, as shown in FIG. 33, over the semiconductor substrate SB, namely, over the insulation films IL2 and IL4 including the inner surfaces (the bottom surfaces and the side surfaces) of the trenches TR1 and TR2, respectively, an insulation film HK is formed as an insulation film for a high dielectric constant gate insulation film. The insulation film HK is formed of a high dielectric constant insulation film. Then, over the semiconductor substrate SB, namely, over the insulation film HK, a metal film ME is formed as a conductive film for a metal gate electrode in such a manner as to fill the insides of the trenches TR1 and TR2. The metal film ME is a conductive film showing a metal conduction. Examples of the metal film ME may include a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbon nitride (TaCN) film, a titanium (Ti) film, a tantalum (Ta) film, a titanium aluminum (TiAl) film, or an aluminum (Al) film.

Figure 34:
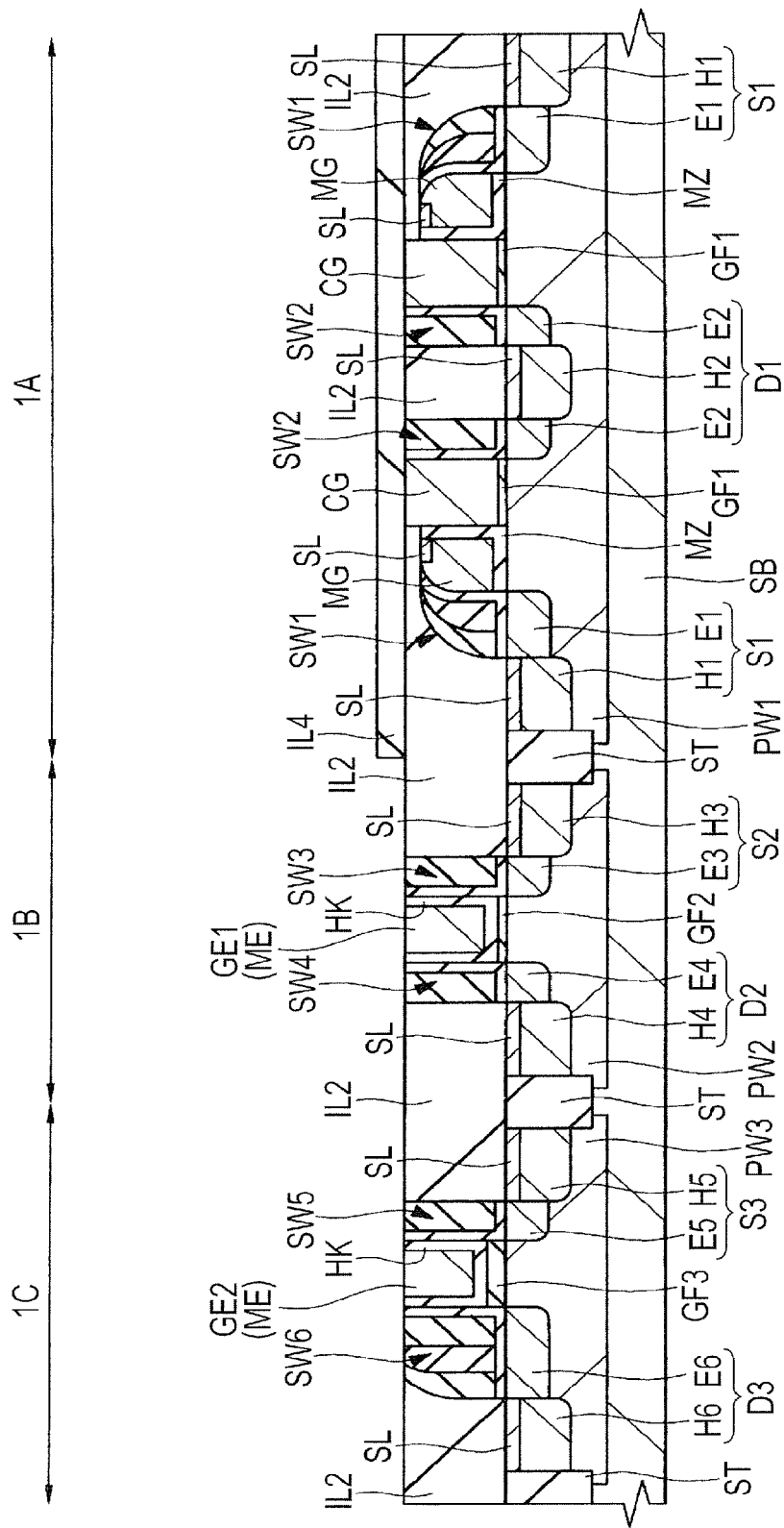
FIG. 34 is an essential part cross sectional view of the semiconductor device during a manufacturing step following FIG. 33.

Then, as shown in FIG. 34, the unnecessary portions of the metal film ME and the insulation film HK outside the trenches TR1 and TR2 are removed by a CMP method, or the like. As a result, the insulation film HK and the metal film ME are embedded in the trenches TR1 and TR2. Namely, the portions of the metal film ME and the insulation film HK outside the trenches TR1 and TR2 are removed, so that the insulation film HK and the metal film ME are left in the trenches TR1 and TR2. This results in a state in which the metal film ME is embedded in the trenches TR1 and TR2 via the insulation film HK.

In this manner, in the trench TR1 of the region from which the gate electrode GE3 was removed, the gate electrode GE1 of a metal gate electrode is formed via the insulation film HK of a high dielectric constant insulation film. Whereas, in the trench TR2 of the region from which the gate electrode GE4 was removed, the gate electrode GE2 of a metal gate electrode is formed via the insulation film HK of a high dielectric constant insulation film.

The metal film ME embedded in the trench TR1 becomes the gate electrode GE1 of the low breakdown voltage MISFET Q1; the insulation film HK embedded in the trench TR1 becomes the insulation film HK1; and the lamination body of the insulation film HK1 (HK) and the insulation film GF2 present under the gate electrode GE1 functions as the gate insulation film of the low breakdown voltage MISFET Q1. Further, the metal film ME embedded in the trench TR2 becomes the gate electrode GE2 of the high breakdown voltage MISFET Q2; the insulation film HK embedded in the trench TR2 becomes the insulation film HK2; and the lamination body of the insulation film HK2 (HK) and the insulation film GF3 present under the gate electrode GE2 functions as the gate insulation film of the high breakdown voltage MISFET Q2.

In the present embodiment, the gate electrode GE3 is removed, and is replaced with the gate electrode GE1. The gate electrode GE1 is used as the gate electrode of the MISFET Q1 in the low breakdown voltage MISFET formation region 1B. For this reason, the gate electrode GE3 is a dummy gate electrode (pseudo gate electrode), and can be regarded as a replacement gate electrode or a gate electrode for substitution. The gate electrode GE1 can be regarded as a gate electrode forming the MISFET.

Whereas, the gate electrode GE4 is removed, and is replaced with the gate electrode GE2. The gate electrode GE2 is used as the gate electrode of the MISFET Q2 in the high breakdown voltage MISFET formation region 1C. For this reason, the gate electrode GE4 is a dummy gate electrode (pseudo gate electrode), and can be regarded as a replacement gate electrode or a gate electrode for substitution. The gate electrode GE2 can be regarded as a gate electrode forming the MISFET.

Further, in the present embodiment, the gate electrode GE1 and the gate electrode GE2 are formed using the metal film ME. For this reason, the gate electrode GE1 and the gate electrode GE2 can be each formed as a metal gate electrode. Thus, the gate electrode GE1 and the gate electrode GE2 are each formed as a metal gate electrode. This can produce advantages of suppressing the depletion phenomenon of the gate electrode GE1 and the gate electrode GE2, and being able to eliminate the parasitic capacitance. Further, another advantage can be obtained that the size reduction of each transistor element (the reduction of the thickness of the gate insulation film) also becomes possible.

Further, for each of the insulation films HK1 and HK2, a high dielectric constant insulation film is used. As a result, the physical film thickness of the gate insulation film can be increased while suppressing the EOT (Equivalent Oxide Thickness) of the gate insulation film. This can produce an advantage of being able to reduce the leakage current.

Figure 35:
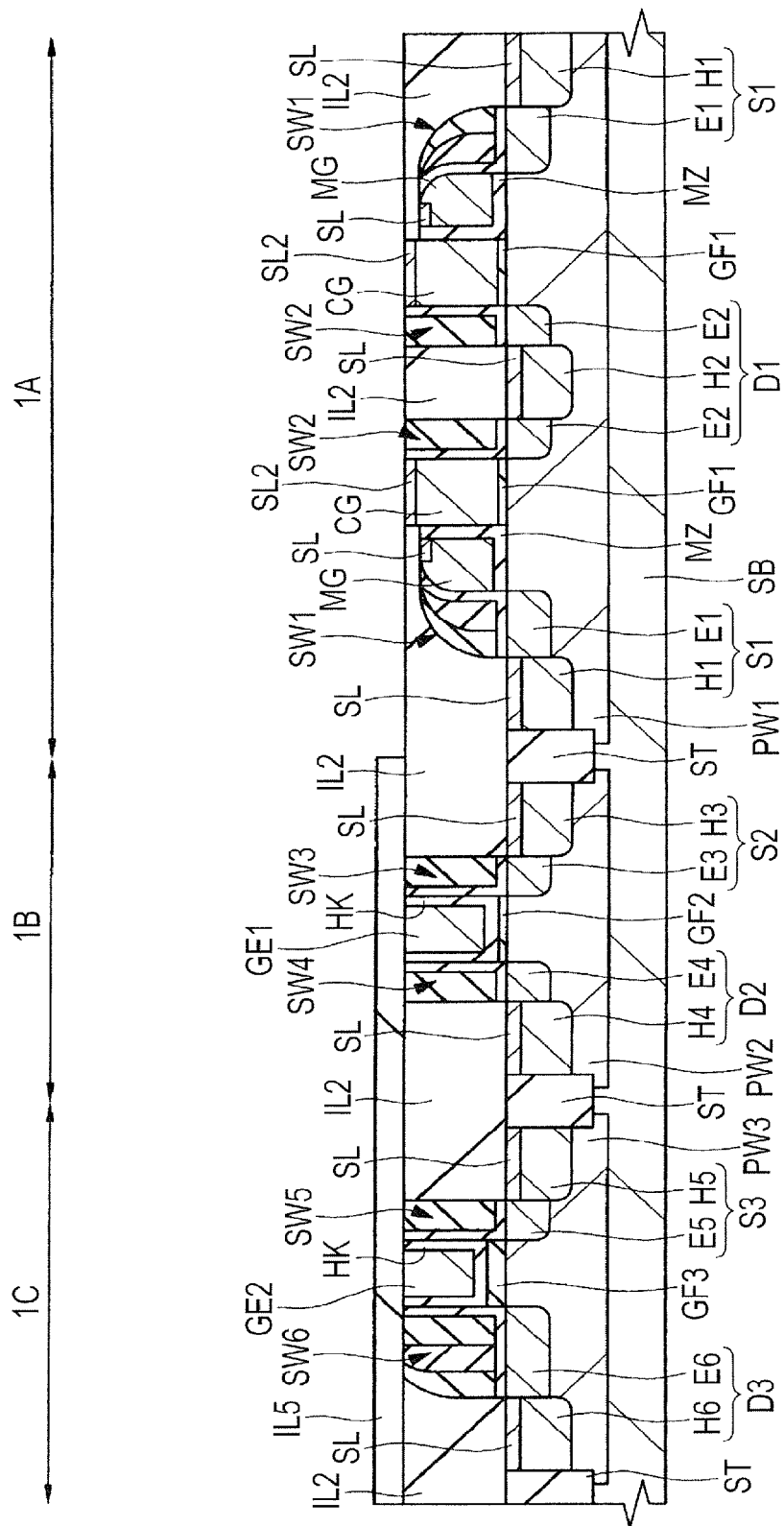
FIG. 35 is an essential part cross sectional view of the semiconductor device during a manufacturing step following FIG. 34.

Then, as shown in FIG. 35, the insulation film IL4 is removed. Then, over the insulation film IL2, an insulation film IL5 is formed which covers the low breakdown voltage MISFET formation region 1B and the high breakdown voltage MISFET formation region 1C, and exposes the memory cell region 1A. The insulation film IL5 can be formed in the following manner: an insulation film is formed over the insulation film IL2 including the memory cell region 1A, the low breakdown voltage MISFET formation region 1B, and the high breakdown voltage MISFET formation region 1C; then, the insulation film is patterned using a photolithography technology and an etching technology. The formation of the insulation film IL5 results in the following state. The gate electrodes GE3 and GE4 are covered with the insulation film IL5, and hence are not exposed; on the other hand, the top surface of the control gate electrode CG is not covered with the insulation film IL5, and hence is exposed. The memory gate electrode MG is covered with the insulation film IL2, and hence is not exposed.

Then, at the top of the control gate electrode CG, a metal silicide layer SL2 is formed using a salicide technology.

The metal silicide layer SL2 can be formed specifically in the following manner. Namely, over the insulation film IL2 and the insulation film IL5 including over the top surface of the control gate electrode CG, a metal film for forming the metal silicide layer SL2 is formed. The metal film is formed of, for example, a cobalt (Co) film, a nickel (Ni) film, or a nickel platinum alloy film. Then, the semiconductor substrate SB is subjected to a heat treatment. As a result, the top of the control gate electrode CG is allowed to react with the metal film. This results in the formation of a metal silicide layer SL2 at the top of the control gate electrode CG as shown in FIG. 35. Then, the unreacted portions of the metal film are removed. FIG. 35 shows the cross sectional view at this stage. By forming the metal silicide layer SL2 at the top of the control gate electrode CG, it is possible to reduce the resistance of the control gate electrode CG.

Herein, a description has been given to the following case: in the step of FIG. 29, the metal silicide layer SL is not formed at the top of the control gate electrode CG; and in the step of FIG. 35, a metal silicide layer SL2 is formed at the top of the control gate electrode CG. In this case, the metal silicide layer SL formed at the top of the control gate electrode CG in FIG. 3 corresponds to the metal silicide layer SL2 formed in the step of FIG. 35.

Further, in the present embodiment, a description has been given to the case where the metal silicide layer SL2 is formed at the top of the control gate electrode CG. As another form, the metal silicide layer SL2 may not be formed at the top of the control gate electrode CG. When the metal silicide layer SL2 is not formed at the top of the control gate electrode CG, the insulation film IL5 formation step and the step of forming the metal silicide layer SL2 by a salicide process may desirably be omitted.

Figure 36:
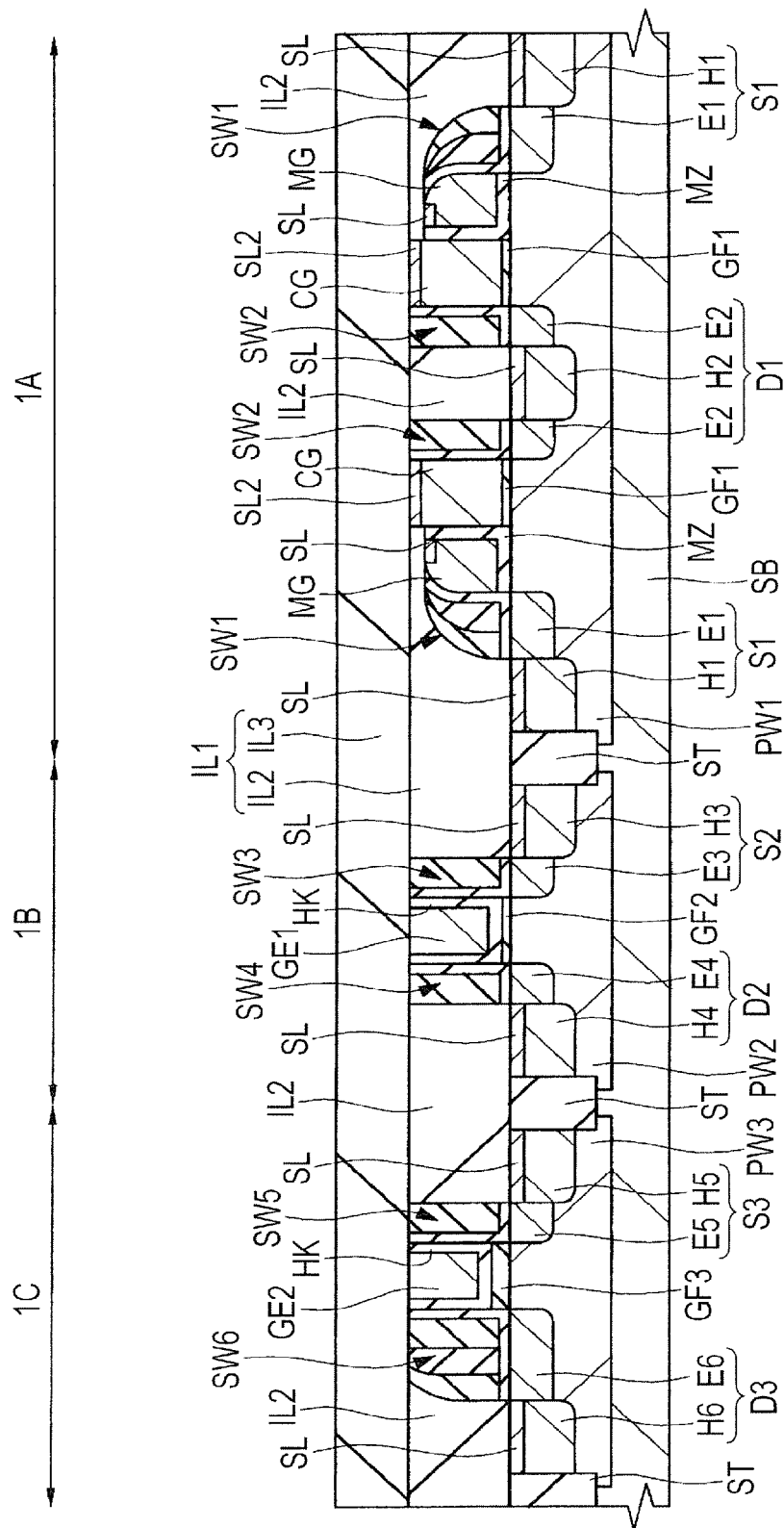
FIG. 36 is an essential part cross sectional view of the semiconductor device during a manufacturing step following FIG. 35.

Then, as shown in FIG. 36, entirely over the main surface of the semiconductor substrate SB, an insulation film (interlayer insulation film) IL3 is formed (deposited).

Incidentally, FIG. 36 shows the following case: the insulation film IL5 is removed by etching, or the like; then, the insulation film IL3 is formed over the insulation film IL2. As another form, without removing the insulation film IL5, the insulation film IL3 can be formed. As the insulation film IL3, for example, a silicon oxide type insulation film mainly including a silicon oxide can be used. The following is also possible: after the formation of the insulation film IL3, the top surface of the insulation film IL3 is polished by a CMP method; as a result of this, or the like, the flatness of the top surface of the insulation film IL3 is enhanced. The insulation film IL2 and the insulation film IL3 form the interlayer insulation film IL1.

Figure 37:
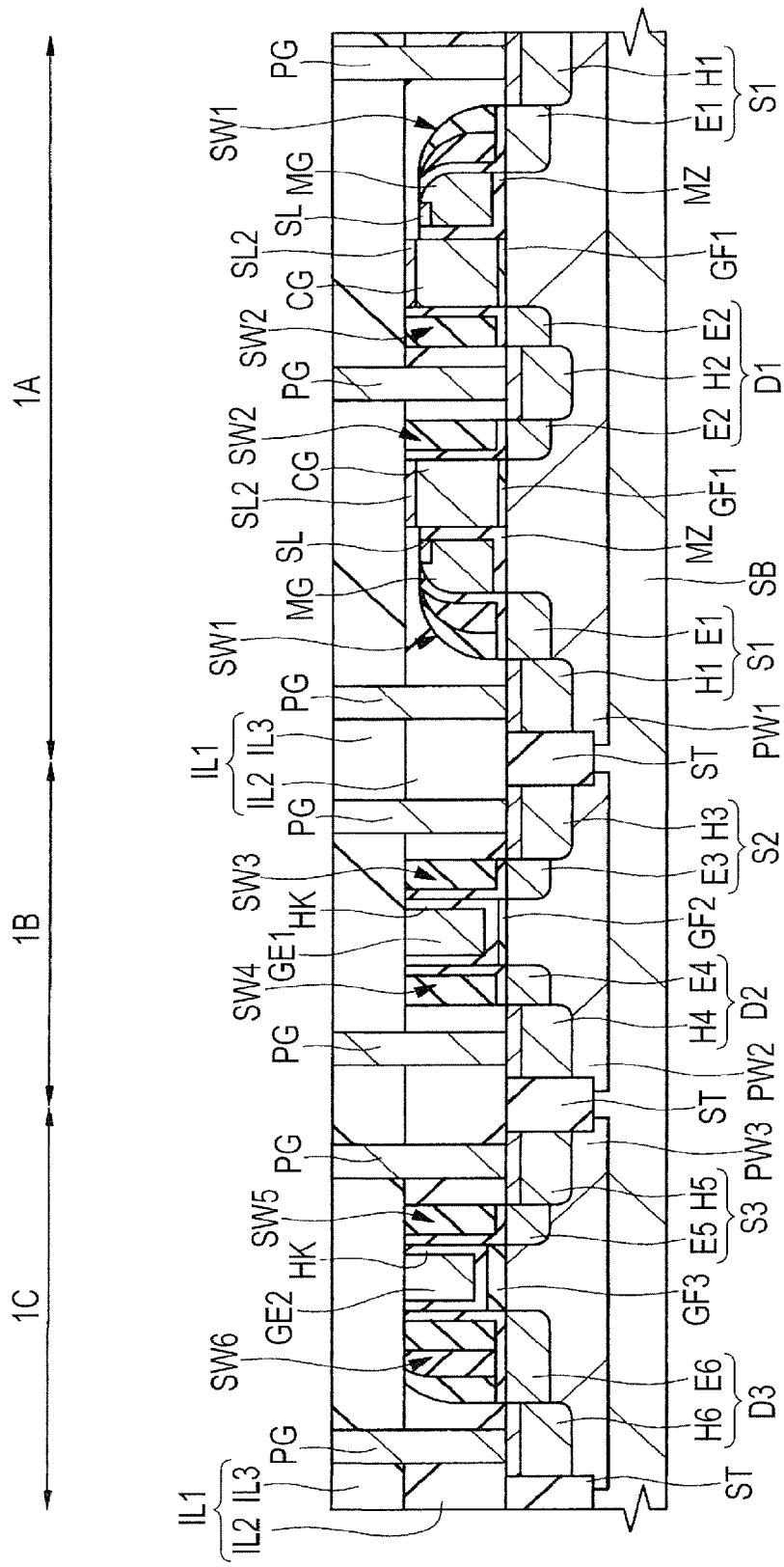
FIG. 37 is an essential part cross sectional view of the semiconductor device during a manufacturing step following FIG. 36.

Then, using the photoresist pattern (not shown) formed over the interlayer insulation film IL1 (IL3) using a photolithography method as an etching mask, the interlayer insulation film IL1 (IL3 and IL2) is dry etched. As a result, as shown in FIG. 37, contact holes (openings or through holes) are formed in the interlayer insulation film IL1 (IL3 and IL2). Then, in each contact hole, a conductive plug (contact plug) PG formed of tungsten (W) or the like is formed as a coupling conductor part.

For forming the plug PG, for example, over the interlayer insulation film IL1 including the inner surface (over the bottom surface and the side surface) of the contact hole, a barrier conductor film is formed. As the barrier conductor film, for example, a titanium film, a titanium nitride film, or a lamination film thereof can be used. Then, over the barrier conductor film, a main conductor film formed of a tungsten film, or the like is formed in such a manner as to fill the inside of the contact hole. Then, the unnecessary portions of the main conductor film and the barrier conductor film outside the contact hole are removed by a CMP method, an etch back method, or the like. As a result, the plug PG can be formed. The plug PG is formed of the barrier conductor film and the main conductor film embedded in the contact hole. However, for simplification of the drawing, in FIG. 37, the barrier conductor film and the main conductor film forming the plug PG are integrally shown.

The contact holes, and the plugs PG embedded therein are formed over the $n^+$ type semiconductor regions H1, H2, H3, H4, H5, and H6, the control gate electrode CG, the memory gate electrode MG, and the like. The plug PG arranged over the $n^+$ type semiconductor region H1 is electrically coupled with the $n^+$ type semiconductor region H1; and the plug PG arranged over the $n^+$ type semiconductor region H2 is electrically coupled with the $n^+$ type semiconductor region H2. The voltage Vs is applied from the plug PG arranged over the $n^+$ type semiconductor region H1 to the $n^+$ type semiconductor region H1; and the voltage Vd is applied from the plug PG arranged over the $n^+$ type semiconductor region H2 to the $n^+$ type semiconductor region H2. Whereas, the plug PG arranged over the $n^+$ type semiconductor region H3 is electrically coupled with the $n^+$ type semiconductor region H3; and the plug PG arranged over the $n^+$ type semiconductor region H4 is electrically coupled with the $n^+$ type semiconductor region H4. Whereas, the plug PG arranged over the $n^+$ type semiconductor region H5 is electrically coupled with the $n^+$ type semiconductor region H5; and the plug PG arranged over the $n^+$ type semiconductor region H6 is electrically coupled with the $n^+$ type semiconductor region H6. Further, although not shown, the plug PG arranged over the control gate electrode CG is electrically coupled with the control gate electrode CG, and the plug PG arranged over the memory gate electrode MG is electrically coupled with the memory gate electrode MG.

Then, over the interlayer insulation film IL1 including the plugs PG embedded therein, a wire M1 of a first-layer wire is formed. A description will be given to the case where the wire M1 is formed using a damascene technology (herein, a single damascene technology).

Figure 38:
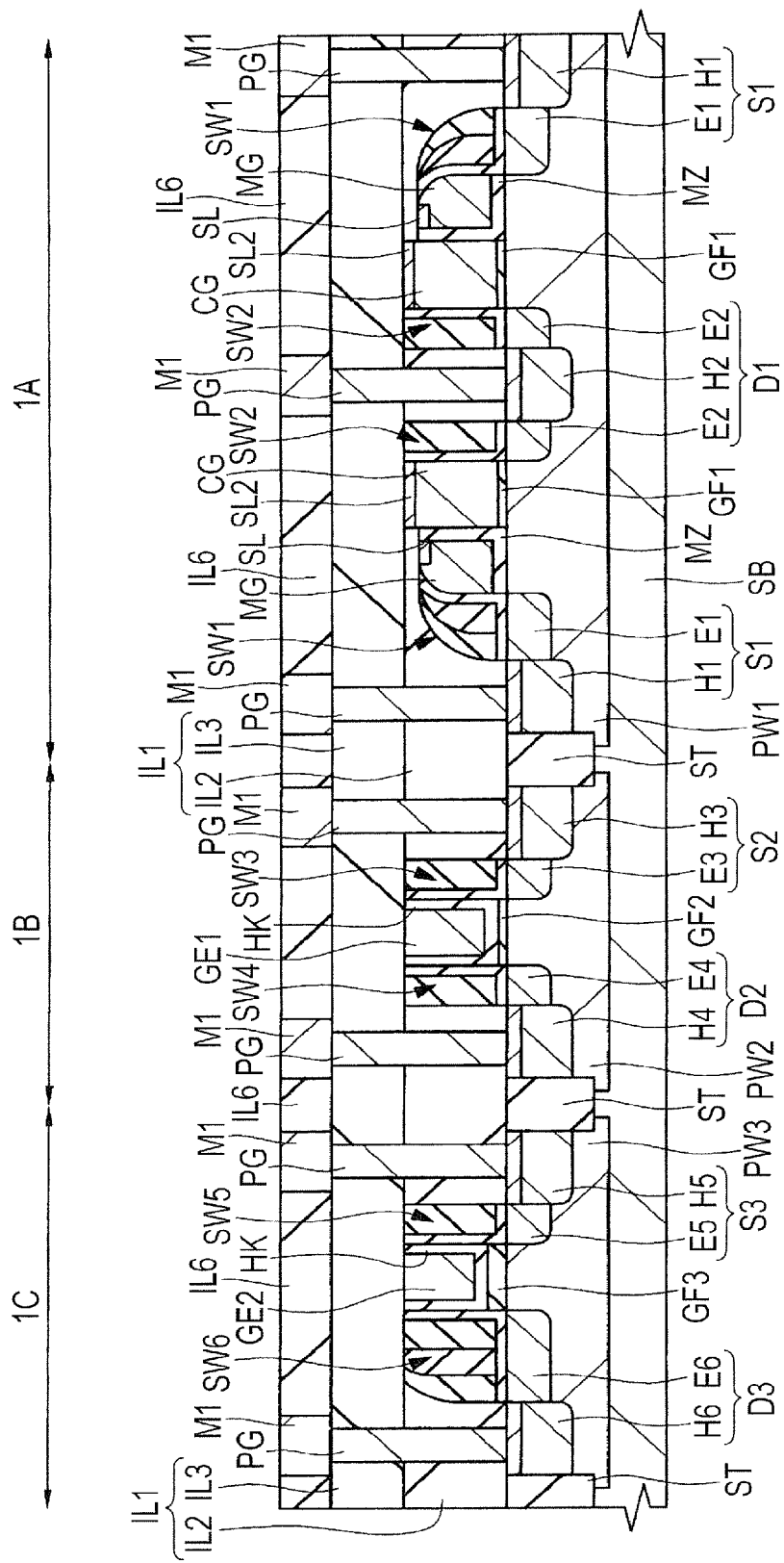
FIG. 38 is an essential part cross sectional view of the semiconductor device during a manufacturing step following FIG. 37.

First, as shown in FIG. 38, over the interlayer insulation film IL1 including the plugs PG embedded therein, an insulation film IL6 is formed. The insulation film IL6 can also be formed of a lamination film of a plurality of insulation films. Then, by dry etching using a photoresist pattern (not shown) as an etching mask, wire trenches are formed in respective prescribed regions of the insulation film IL6. Then, over the insulation film IL6 including over the bottom surface and the side surface of each wire trench, a barrier conductor film is formed. Then, by a CVD method, a sputtering method, or the like, a seed layer of copper is formed over the barrier conductor film. Further, using an electrolytic plating method, or the like, a copper plating film is formed over the seed layer, so that the copper plating film fills the inside of each wire trench. Then, the portions of the main conductor film (the copper plating film and the seed layer) and the barrier conductor film in other regions than the wire trenches are removed by a CMP method. This results in the formation of each first-layer wire M1 including the copper embedded in the wire trench as a main conductive material.

The wires M1 are electrically coupled via respective plugs PG with the $n^+$ type semiconductor regions H1, H2, H3, H4, H5, and H6, the control gate electrode CG, the memory gate electrode MG, the gate electrode GE1, the gate electrode GE2, or the like.

Then, second- or higher-layer wires are formed by a dual damascene method, or the like, but herein are not shown and not described. Alternatively, the wire M1 and wires at higher layers than that are not limited to damascene wires, and can also be formed by patterning a conductor film for each wire, and can also be each formed as, for example, a tungsten wire or an aluminum wire.

In the manner up to this point, the semiconductor device of the present embodiment is manufactured.

Further, in the present embodiment, a description has been given to the case where the cap insulation film CP1, the cap insulation film CP2, and the cap insulation film CP3 are formed over the control gate electrode CG, the gate electrode GE3, and the gate electrode GE4, respectively. As another form, the formation of the cap insulation film CP1, the cap insulation film CP2, and the cap insulation film CP3 can also be omitted. In that case, the metal silicide layers SL can also be formed at respective tops of the control gate electrode CG, the gate electrode GE3, and the gate electrode GE4.

Further, in the present embodiment, a description has been given to the case where the gate electrodes GE3 and GE4 are replaced with the gate electrodes GE1 and GE2 of metal gate electrodes. As another form, without being replaced with metal gate electrodes, the gate electrodes GE3 and GE4 can also be used as the gate electrodes of the MISFETs. In this case, the low breakdown voltage MISFET Q1 and the high breakdown voltage MISFET Q2 have the configuration shown in FIG. 29. The gate electrode GE3 functions as the low breakdown voltage MISFET Q1, and the gate electrode GE4 functions as the low breakdown voltage MISFET Q2. In this case, the gate electrodes GE3 and GE4 are each a silicon gate electrode formed of doped polysilicon. In this case, the following may be adopted. After obtaining the structure of FIG. 29, the insulation film (interlayer insulation film) IL2 is formed. Then, the top surface of the insulation film IL2 is planarized by a CMP method, or the like. However, before the lamination bodies LM1, LM2, and LM3 are exposed, polishing of the insulation film IL2 is completed. Then, contact holes are formed in the insulation film IL2. Then, the plugs PG are formed in the contact holes, respectively. Subsequently, over the insulation film IL2, the insulation film IL6 is formed. Then, wire trenches are formed in the insulation film IL6, and the wires M1 are formed in the wire trenches, respectively. Further, this case results in the structure in which the cap insulation film C1 is formed over the control gate electrode CG, the cap insulation film CP2 is formed over the gate electrode GE3, and the cap insulation film CP3 is formed over the gate electrode GE4. However, the formation of the cap insulation films CP1, CP2, and CP3 can also be omitted.

<Regarding Study Example>

Figure 39:
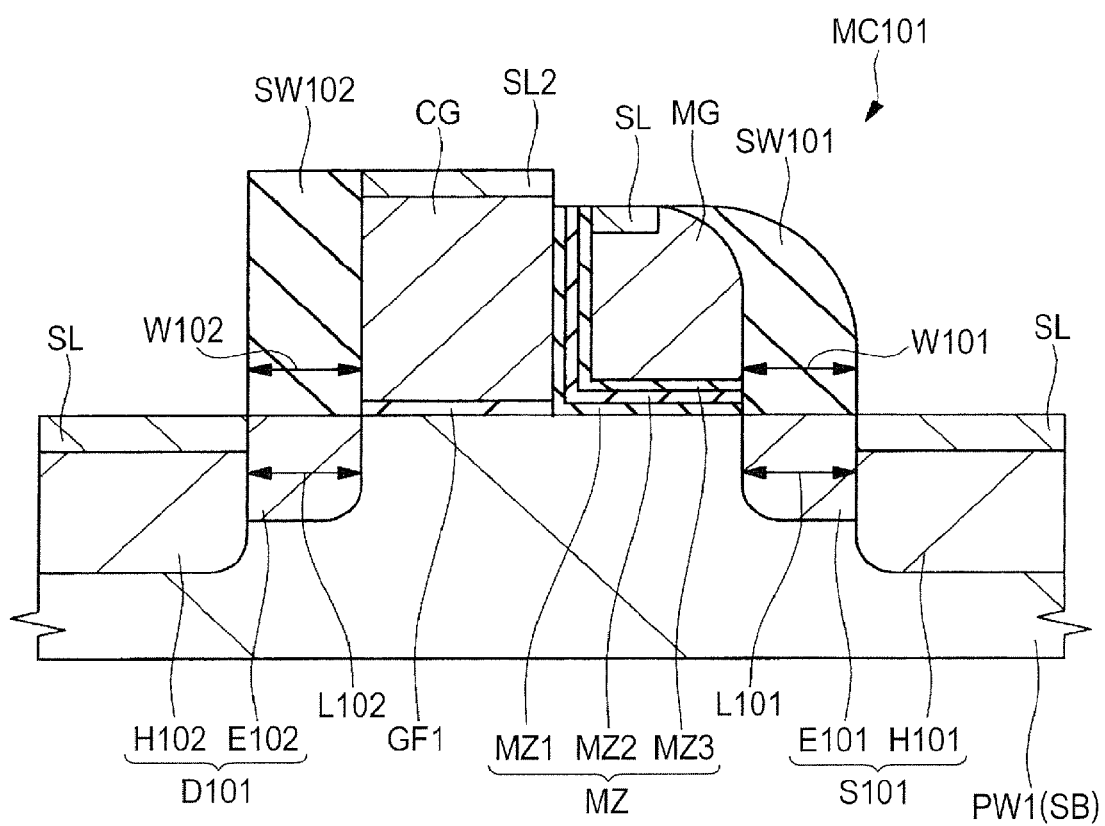
FIG. 39 is an essential part cross sectional view of a semiconductor device of First Study Example.

Then, Study Example studied by the present inventors will be described. FIG. 39 is an essential part cross sectional view of a semiconductor device of First Study Example studied by the present inventors, and corresponds to FIG. 3 of the present embodiment.

The memory cell MC101 of a nonvolatile memory in the First Study Example in FIG. 39 is different from the memory cell MC of FIG. 3 in the following points.

Namely, in the memory cell MC101 in First Study Example shown in FIG. 39, over the side surface of the memory gate electrode MG opposite to the side thereof adjacent via the insulation film MZ to the control gate electrode CG, a sidewall spacer SW101 formed of an insulator is formed. Whereas, over the side surface of the control gate electrode CG opposite to the side thereof adjacent via the insulation film MZ to the memory gate electrode MG, a sidewall spacer SW102 formed of an insulator is formed. Further, the semiconductor region S101 for source of the memory cell MC101 is formed of an n⁻ type semiconductor region E101, and an n⁺ type semiconductor region H101 having a higher impurity concentration than that of the n⁻ type semiconductor region E101. Whereas, the semiconductor region D101 for drain is formed of an n⁻ type semiconductor region E102, and an n⁺ type semiconductor region H102 having a higher impurity concentration than that of the n⁻ type semiconductor region E102. The n⁻ type semiconductor region E101 is formed under the sidewall spacer SW101, and the n⁻ type semiconductor region E102 is formed under the sidewall spacer SW102.

In the case of First Study Example shown in FIG. 39, the width W101 of the sidewall spacer SW101 formed over the side surface of the memory gate electrode MG, and the width W102 of the sidewall spacer SW102 formed over the side surface of the control gate electrode CG are equal to each other (i.e., W101=W102). Reflecting this, the dimension L101 of the n⁻ type semiconductor region E101 with a low impurity concentration of the extension region of the source region (semiconductor region S101), and the dimension L102 of the n⁻ type semiconductor region E102 with a low impurity concentration of the extension region of the drain region (semiconductor region D101) are equal to each other (i.e., L101=L102).

Also for the memory cell of a nonvolatile memory, it is important for improving the reliability of the semiconductor device to increase the breakdown voltage. For the breakdown voltage improvement, it is effective to increase the width (the width in the gate length direction) of the sidewall spacer, and to increase the dimension (the dimension in the gate length direction) of the extension region with a low impurity concentration in a source/drain region. For this reason, for the memory cell MC101 of First Study Example of FIG. 39, the breakdown voltage improvement requires an increase in the widths W101 and W102 while holding the relation that the width W101 of the sidewall spacer SW101 and the dimension L101 of the n⁻ type semiconductor region E101 are equal to each other (W101=W102). However, an increase in respective widths W101 and W102 of the sidewall spacers SW101 and SW102 leads to an increase in cell size of the memory cell MC101. This causes an increase in area of the semiconductor device, which is disadvantageous for size reduction of the semiconductor device.

For this reason, in the case of First Study Example of FIG. 39, it is difficult to combine the improvement of the reliability of the semiconductor device due to the breakdown voltage improvement, and the size reduction of the semiconductor device.

Incidentally, an increase in width (the width in the gate length direction) of the sidewall spacer results in an increase in distance between the high impurity concentration semiconductor region and the channel region in the source/drain region having a LDD structure. This results in an increase in dimension (the dimension in the gate length direction) of the low impurity concertation extension region interposed between the high impurity concentration semiconductor region and the channel region. For this reason, the breakdown voltage can be increased.

<Regarding Main Features and Effects>

The semiconductor device of the present embodiment is a semiconductor device having a memory cell of a nonvolatile memory. The semiconductor device of the present embodiment has a semiconductor substrate SB, a semiconductor region D1 (first semiconductor region) and a semiconductor region S1 (second semiconductor region) formed in the semiconductor substrate SB, and a control gate electrode CG (first gate electrode) formed over the semiconductor substrate SB between the semiconductor region D1 and the semiconductor region S1 via an insulation film GF1 (first gate insulation film). The semiconductor device of the present embodiment further has a memory gate electrode MG (second gate electrode) formed over the semiconductor substrate SB between the semiconductor region D1 and the semiconductor region S1 via an insulation film MZ (second gate insulation film) having a charge accumulation part. The semiconductor device of the present embodiment further has a sidewall spacer SW2 (first sidewall spacer) formed adjacent to the side surface of the control gate electrode CG opposite to the side thereof adjacent to the memory gate electrode MG, and a sidewall spacer SW1 (second sidewall spacer) formed adjacent to the side surface of the memory gate electrode MG opposite to the side thereof adjacent to the control gate electrode CG. Of the control gate electrode CG and the memory gate electrode MG, the control gate electrode CG is arranged on the semiconductor region D1 side, and the memory gate electrode MG is arranged on the semiconductor region S1 side. At the time of the read operation of the memory cell MC, the semiconductor region D1 functions as the drain region of the memory cell MC, and the semiconductor region S1 functions as the source region of the memory cell MC.

One of the mains features of the present embodiment resides in that the memory cell MC is not a single gate type memory cell, but a split gate type memory cell.

Another of the main features of the present embodiment resides in the following: at the time of the write operation of the memory cell MC, write to the memory cell MC is performed by injecting electric charges (herein, electrons) into the charge accumulation part (herein, the insulation film MZ2) of the insulation film MZ by source side injection.

Still another of the main features of the present embodiment resides in the following: the width W1 (the second width) of the sidewall spacer SW1 in the gate length direction of the memory gate electrode MG is larger than the width W2 (the first width) of the sidewall spacer SW2 in the gate length direction of the control gate electrode CG.

The case is assumed where as distinct from the present embodiment, the memory cell of the nonvolatile memory is of a single gate type. In the case of the memory cell of a single gate type, a tunneling method in which write and erase are performed by tunneling is generally used for the write method and the erase method. For this reason, in the case of the memory cell of a single gate type, a voltage is not applied to the source/drain regions at the time of write and at the time of erase. On the other hand, at the time of read, a higher voltage is applied to the drain region than that to the source region. Accordingly, in the case of the memory cell of a single gate type, it is important for improving the breakdown voltage to increase the breakdown voltage on the drain side to be applied with a high voltage at the time of read.

In contrast, in the present embodiment, the memory cell MC of the nonvolatile memory is not a single gate type memory cell, but a split gate type memory cell. Also for the split gate type memory cell, when a tunneling method in which write and erase are performed by tunneling is used for the write method and the erase method, a voltage is not applied to the source/drain regions at the time of write and at the time of erase. On the other hand, at the time of read, a higher voltage is applied to the drain region than that to the source region. For this reason, when the tunneling method is used for the write method and the erase method, not only in the case of the single gate type memory cell, but also in the case of the split gate type memory cell, it is important for improving the breakdown voltage to increase the breakdown voltage on the drain side to be applied with a high voltage at the time of read.

However, the present inventors conducted a study on the write method for the split gate type memory cell. As a result, the present inventors found that it is more advantageous to adopt the SSI method than to adopt the tunneling method. For example, when the tunneling method is adopted, in the insulation film having a charge accumulation part (herein, the insulation film MZ), electrons are tunneled through the charge block film, and are injected into the charge accumulation part (herein, the insulation film MZ2). This requires the reduction of the thickness of the charge block film (herein, the insulation film MZ1 or the insulation film MZ3). However, the reduction of the thickness of the charge block film leads to the reduction of the retention characteristic (charge holding characteristic) of the nonvolatile memory. Accordingly, when the tunneling method is adopted for the write method, the retention characteristic becomes less likely to be improved. In contrast, when the SSI method is adopted for the write method, hot electrons are injected into the charge accumulation part (herein, the insulation film MZ2) in the insulation film. For this reason, as compared with the case where the tunneling method is adopted for the write method, the thickness of the charge block film (herein, the insulation film MZ1 or the insulation film MZ3) can be made larger. Accordingly, the retention characteristic of the nonvolatile memory is more likely to be improved when the SSI method is adopted for the write method than when the tunneling method is adopted for the write method. For this reason, in the present embodiment, the SSI method is adopted for the write method of the split gate type memory cell. Therefore, for the semiconductor device of the present embodiment, at the time of the write operation of the memory cell MC, electric charges (herein, electrons) are injected into the charge accumulation part (herein, the insulation film MZ2) of the insulation film MZ by source side injection. As a result, write to the memory cell MC is performed.

For the split gate type memory cell MC, when the SSI method is adopted for the write method, a positive voltage is applied to the semiconductor region S1 at the time of write, on the other hand, a positive voltage is applied to the semiconductor region D1 at the time of read; thus, the voltage applied to the semiconductor region S1 at the time of write with the SSI method is higher than the voltage applied to the semiconductor region D1 at the time of read. In other words, in FIGS. 6 and 7, the voltage Vs at the time of write is a higher voltage than the voltage Vd at the time of read. In other words, at the time of the write operation of the memory cell MC, the semiconductor region S1 is applied with a first voltage higher than the electric potential of the semiconductor region D1; and at the time of the read operation of the memory cell MC, the semiconductor region D1 is applied with a second voltage higher than the electric potential of the semiconductor region S1. The first voltage is higher than the second voltage.

This is for the following reason: at the time of write with the SSI method, in order to inject hot electrons into the charge accumulation part (herein, the insulation film MZ2) of the insulation film MZ, it is necessary to apply the semiconductor region S1 with a certain degree of high electric potential, and to apply the memory gate electrode MG with a still higher voltage than the voltage applied to the semiconductor region S1. Accordingly, when the SSI method is adopted for the write method, the semiconductor region S1 is required to be applied with a certain degree of high voltage at the time of write. As a result, the voltage to be applied to the semiconductor region S1 at the time of write with the SSI method is higher than the voltage to be applied to the semiconductor region D1 at the time of read. In other words, in FIGS. 6 and 7, the voltage Vs at the time of write is a higher voltage than the voltage Vd at the time of read. For this reason, for the split gate type memory cell MC, when the SSI method is adopted for the write method, the maximum value of the voltage to be applied to the semiconductor region S1 at the time of write, at the time of erase, and at the time of read is higher than the maximum value of the voltage to be applied to the semiconductor region D1 at the time of write, at the time of erase, and at the time of read.

Therefore, for the split gate type memory cell MC, when the SSI method is adopted for the write method, it is important to increase the breakdown voltage of the semiconductor region S1 side of the source side.

Thus, in the present embodiment, to the memory cell of the nonvolatile memory, a split gate type memory cell MC is applied, and the SSI method is adopted for the write method. In addition, the width W1 of the sidewall spacer SW1 is set larger than the width W2 of the sidewall spacer SW2 (W1>W2).

In the present embodiment, by setting large the width W1 of the sidewall spacer SW1, it is possible to improve the breakdown voltage of the semiconductor region S1 side of the source side. Specifically, by setting large the width W1 of the sidewall spacer SW1, it is possible to increase the distance (space) between the $n^+$ type semiconductor region H1 with a high impurity concentration and the channel region of the memory transistor, and to increase the dimension L1 of the $n^-$ type semiconductor region E1 with a low impurity concentration interposed between the $n^+$ type semiconductor region H1 with a high impurity concentration and the channel region. Accordingly, it is possible to increase the breakdown voltage of the semiconductor region S1 side.

On the other hand, on the semiconductor region D1 side of the drain side, a breakdown voltage is not required as much as on the semiconductor region S1 side of the source side. This is for the following reason: as described above, for the split gate type memory cell MC, when the SSI method is adopted for the write method, the voltage to be applied to the semiconductor region D1 at the time of read is lower than the voltage to be applied to the semiconductor region S1 at the time of write with the SSI method. From another viewpoint, the maximum value of the voltage to be applied to the semiconductor region D1 at the time of write, at the time of erase, and at the time of read is lower than the maximum value of the voltage to be applied to the semiconductor region S1 at the time of write, at the time of erase, and at the time of read.

For this reason, on the semiconductor region D1 side on which the breakdown voltage is not required as much as on the semiconductor region S1 side, the width W2 of the sidewall spacer SW2 is reduced. As a result, the dimension (cell size) of the memory cell MC can be reduced. This can reduce the area of the semiconductor device, which enables the size reduction of the semiconductor device.

In this manner, in the present embodiment, the width W1 of the sidewall spacer SW1 is set larger than the width W2 of the sidewall spacer SW2 (W1>W2). With such a configuration, on the semiconductor region S1 side to be applied with a high voltage, the width W1 of the sidewall spacer SW1 is increased, thereby to improve the breakdown voltage. On the semiconductor region D1 side not to be applied with so high voltage, the width W2 of the sidewall spacer SW2 can be reduced, thereby to reduce the cell size. As a result, it is possible to combine the improvement of the reliability of the semiconductor device due to the breakdown voltage improvement, and the size reduction of the semiconductor device.

As described above, for the single gate type memory cell, it is not the source region but the drain region that is applied with a high voltage. The breakdown voltage of the drain side is required to be increased. Accordingly, it is assumed that the width of the sidewall spacer on the drain side is made larger than the width of the sidewall spacer on the source side. When the structure of the single gate type memory cell is applied to the split gate type memory cell as it is, as distinct from the present embodiment, the width W2 of the sidewall spacer SW2 on the drain side is larger than the width W1 of the sidewall spacer SW1 on the source side (W2>W1).

However, the present inventors conducted a study on the case where the SSI method is adopted because it is more advantageous for the retention characteristic to adopt the SSI method than to adopt the tunneling method for the write method. As a result, the present inventors focused on the following fact: when the SSI method is adopted for the write method of the split gate type memory cell, the voltage to be applied to the semiconductor region S1 at the time of write with the SSI method is higher than the voltage to be applied to the semiconductor region D1 at the time of read. Accordingly, the width W1 of the sidewall spacer SW1 on the source side is set larger than the width W2 of the sidewall spacer SW2 on the drain side (W2<W1).

Further, in the present embodiment, the number of layers of the insulation films forming the sidewall spacer SW1 is set larger than the number of layers of the insulation films forming the sidewall spacer SW2. As a result, it is possible to readily and precisely implement the relation that the width W1 of the sidewall spacer SW1 is larger than the width W2 of the sidewall spacer SW2 (W2<W1). For example, the sidewall spacer SW2 is formed of the insulation film Z1 and the sidewall spacer (sidewall insulation film) P3. Thus, the sidewall spacer SW2 is formed of a total of two layers of insulation films. On the other hand, the sidewall spacer SW1 is formed of the insulation film Z1, the sidewall spacer (sidewall insulation film) P2, and the sidewall spacer (sidewall insulation film) P3. Thus, the sidewall spacer SW1 is formed of a total of three layers of insulation films.

Whereas, in the present embodiment, over the main surface of the semiconductor substrate SB, not only the memory cell MC but also the high breakdown voltage MISFET Q2 for the peripheral circuit is formed.

For the MISFET Q2, in order to increase the breakdown voltage, the thickness of the gate insulation film is set large. Further, the width W6 of the sidewall spacer SW6 on the drain side is set larger than the width W5 of the sidewall spacer SW5 on the source side (W6>W5). This improves the breakdown voltage of the semiconductor region D3 side of the drain side. Specifically, by setting large the width W6 of the sidewall spacer SW6, it is possible to increase the distance (space) between the n$^+$ type semiconductor region H6 with a high impurity concentration and the channel region of the MISFET Q2, and to increase the dimension L6 of the n$^-$ type semiconductor region E6 with a low impurity concentration interposed between the n$^+$ type semiconductor region H6 with a high impurity concentration and the channel region. Accordingly, it is possible to increase the breakdown voltage of the semiconductor region D3 side.

The MISFET Q2 is not a nonvolatile memory. For this reason, injection of electric charges associated with write or erase is not performed. At the time of the operation of the MISFET Q2, the drain region is applied with a higher voltage than to the source region. Namely, at the time of the operation of the MISFET Q2, a voltage higher than the electric potential of the semiconductor region S3 is applied to the semiconductor region D3. For this reason, it is important for improving the breakdown voltage to increase the breakdown voltage on the drain side to be applied with a high voltage.

For this reason, for the MISFET Q2, on the drain side to be applied with a high voltage, the width W6 of the sidewall spacer SW6 is increased, thereby to improve the breakdown voltage; on the other hand, the semiconductor region S3 of the source side is not applied with a high voltage. For this reason, the width W5 of the sidewall spacer SW5 on the source side can be reduced, thereby to reduce the area of the semiconductor device. As a result, it is possible to combine the improvement of the reliability of the semiconductor device due to the breakdown voltage improvement, and the size reduction of the semiconductor device.

Herein, the size relation between the width of the sidewall spacer on the source side and the width of the sidewall spacer on the drain side is opposite to that between the MISFET Q2 and the memory cell MC. In other words, for the high breakdown voltage MISFET Q2, the width W6 of the sidewall spacer SW6 on the drain side is set larger than the width W5 of the sidewall spacer SW5 on the source side. However, when the technology is applied to the memory cell MC as it is, as distinct from the present embodiment, the width W2 of the sidewall spacer SW2 on the drain side is set larger than the width W1 of the sidewall spacer SW1 on the drain side.

However, attention has been focused on the following: when the SSI method is adopted for the write method of the split gate type memory cell, the voltage to be applied to the semiconductor region S1 at the time of write with the SSI method is higher than the voltage to be applied to the semiconductor region D1 at the time of read. Accordingly, the width W1 of the sidewall spacer SW1 on the source side is set larger than the width W2 of the sidewall spacer SW2 on the drain side (W2<W1).

Thus, in the present embodiment, in consideration of even the operation method of the nonvolatile memory, the structures of the memory cell MC of the nonvolatile memory and the high breakdown voltage MISFET Q2 for peripheral circuit are designed. As a result, while improving the breakdown voltages of both the memory cell MC and the MISFET Q2, the semiconductor device is reduced in size.

Further, the width W6 of the sidewall spacer SW6 can be set in consideration of the breakdown voltage level required of the MISFET Q2. The width W1 of the sidewall spacer SW1 can be set in consideration of the breakdown voltage level required of the memory cell MC. For this reason, when the width W6 of the sidewall spacer SW6 and the width W1 of the sidewall spacer SW1 are compared with each other, there can be the case of W6>W1, the case of W6=W1, and the case of W6<W1. FIGS. 3 and 5 each show the case where the width W6 of the sidewall spacer SW6 is larger than the width W1 of the sidewall spacer SW1 (i.e., the case of W6>W1). This is particularly preferable for the case where the drain voltage to be applied to the semiconductor region D3 for drain of the high breakdown voltage MISFET Q2 is larger than the voltage Vs to be applied to the semiconductor region S1 at the time of write with the SSI method of the memory cell MC.

Whereas, in the present embodiment, over the main surface of the semiconductor substrate SB, further, the low breakdown voltage MISFET Q1 for peripheral circuit is also formed. For the low breakdown voltage MISFET Q1, the breakdown voltage is less required to be increased. Accordingly, any of the width W3 of the sidewall spacer SW3 on the source side and the width W4 of the sidewall spacer SW4 on the drain side is not required to be increased. For this reason, the width W3 of the sidewall spacer SW3 on the source side and the width W4 of the sidewall spacer SW4 on the drain side are nearly equal to each other (W3=W4).

Second Embodiment

In the First Embodiment, the gate electrode GE3 of the silicon gate electrode was replaced with the gate electrode GE1 of the metal gate electrode, and the gate electrode GE4 of the silicon gate electrode was replaced with the gate electrode GE2 of the metal gate electrode. However, the memory gate electrode MG and the control gate electrode CG were not replaced with metal gate electrodes.

In contrast, in the present Second Embodiment, the gate electrode GE3 of a silicon gate electrode is replaced with the gate electrode GE1 of a metal gate electrode; the gate electrode GE4 of a silicon gate electrode is replaced with the gate electrode GE2 of a metal gate electrode; and the control gate electrode CG of a silicon gate electrode is replaced with a control gate electrode CG1 of a metal gate electrode described later. The memory gate electrode MG is not replaced with a metal gate electrode.

Figure 40:
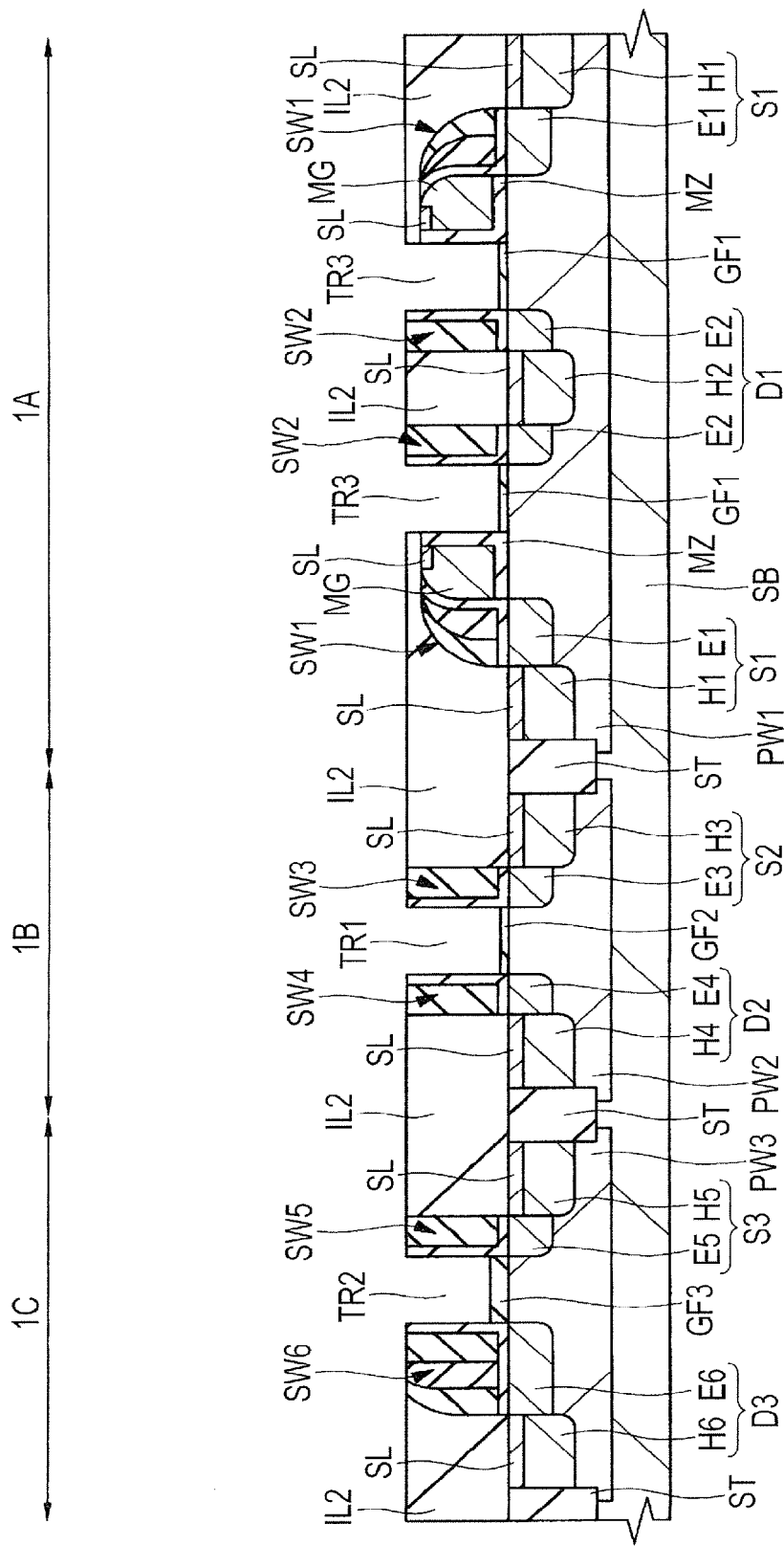
FIG. 40 is an essential part cross sectional view of a semiconductor device of another embodiment during a manufacturing step.
Figure 41:
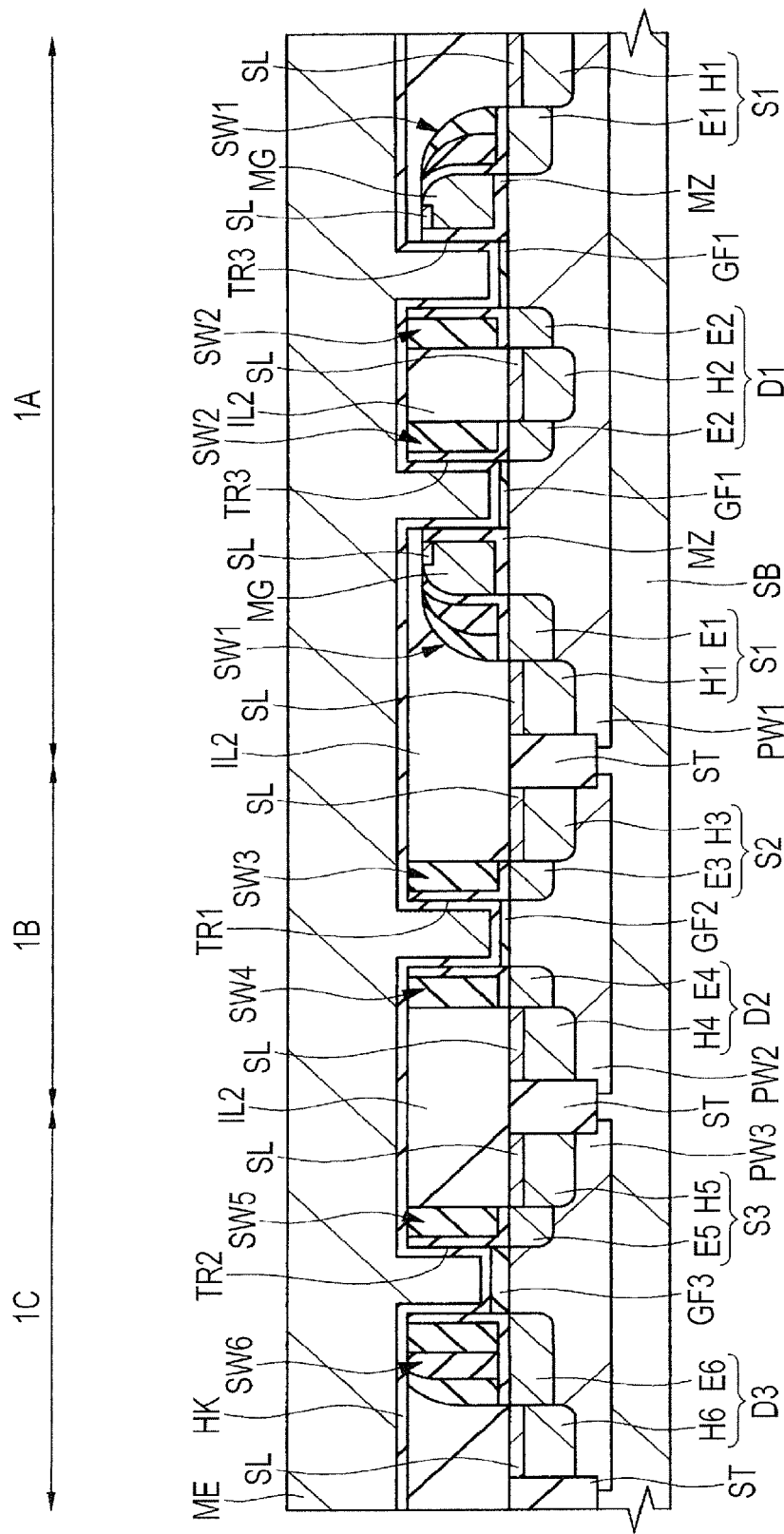
FIG. 41 is an essential part cross sectional view of the semiconductor device during a manufacturing step following FIG. 40.
Figure 42:
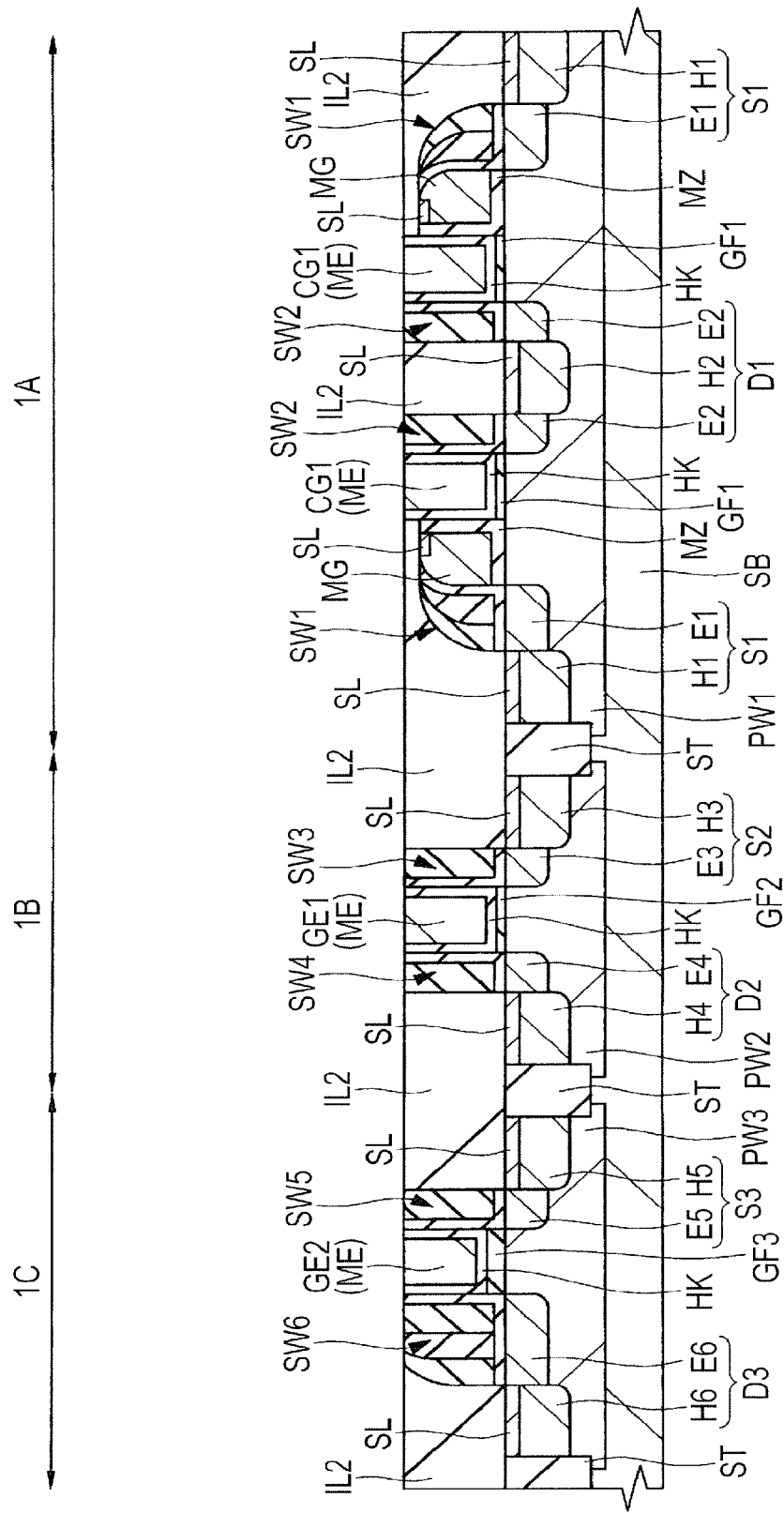
FIG. 42 is an essential part cross sectional view of the semiconductor device during a manufacturing step following FIG. 41.

Below, a specific description will be given with reference to FIGS. 40 to 42. FIGS. 40 to 42 are each an essential part cross sectional view of a semiconductor device of the present Second Embodiment during a manufacturing step.

Until the polishing step of the insulation film IL2 is performed to obtain the structure of FIG. 31, the present Second Embodiment is also equal in manufacturing steps to the First Embodiment. Thus, herein, a description thereon is omitted.

After obtaining the structure of FIG. 31 in the same manner as in the First Embodiment, in the present Second Embodiment, as shown in FIG. 40, the gate electrode GE3, the gate electrode GE4, and the control gate electrode CG are etched and removed. This step will be hereinafter referred to as "the etching step of FIG. 40".

In the etching step of FIG. 40, etching is preferably performed under the conditions such that the insulation film IL2, the sidewall spacers SW, the insulation film MZ, and the insulation films GF1, GF2, and GF3 are less likely to be etched than the gate electrodes GE3 and GE4, and the control gate electrode CG. As a result, in the etching step of FIG. 40, the gate electrodes GE3 and GE4, and the control gate electrode CG can be selectively etched. The etching step of FIG. 40 is performed with respective top surfaces of the gate electrodes GE3 and GE4, and the control gate electrode CG exposed, and with the memory gate electrode MG not exposed. Accordingly, the gate electrodes GE3 and GE4, and the control gate electrode CG are selectively etched and removed, and the memory gate electrode MG is not etched, and is left as it is.

In the etching step of the gate electrodes GE3 and GE4 of FIG. 32, the gate electrodes GE3 and GE4, and the control gate electrode CG were removed, As a result, trenches (concave parts or pit parts) TR1, TR2, and TR3 are formed. The trenches TR1 and TR2 are the same as those in the First Embodiment. The trench TR3 is a region obtained by removing the control gate electrode CG, and corresponds to the region in which the control gate electrode CG was present until the control gate electrode CG was removed. The bottom surface of the trench TR3 is formed of the top surface of the insulation film GF1, and the side surface of the trench TR3 is formed of the insulation film Z1 forming the sidewall spacer SW2, and the insulation film MZ.

Then, as shown in FIG. 41, over the semiconductor substrate SB, namely, over the insulation film IL2 including the inner surfaces (the bottom surfaces and the side surfaces) of the trenches TR1, TR2, and TR3, an insulation film HK is formed as an insulation film for a high dielectric constant gate insulation film. Then, over the semiconductor substrate SB, namely, over the insulation film HK, a metal film ME is formed as a conductive film for a metal gate electrode in such a manner as to fill the insides of the trenches TR1, TR2, and TR3. Respective materials for the insulation film HK and the metal film ME are the same as those in the First Embodiment.

Then, as shown in FIG. 34, the unnecessary portions of the metal film ME and the insulation film HK outside the trenches TR1, TR2, and TR3 are removed by a CMP method, or the like. As a result, the insulation film HK and the metal film ME are embedded in the trenches TR1, TR2, and TR3.

In this manner, in the trench TR1 of the region from which the gate electrode GE3 was removed, the gate electrode GE1 of a metal gate electrode is formed via the insulation film HK of a high dielectric constant insulation film. Whereas, in the trench TR2 of the region from which the gate electrode GE4 was removed, the gate electrode GE2 of a metal gate electrode is formed via the insulation film HK of a high dielectric constant insulation film. Further, in the trench TR3 of the region from which the control gate electrode CG was removed, the gate electrode CG1 of a metal gate electrode is formed via the insulation film HK of a high dielectric constant insulation film. The gate electrodes GE1 and GE2 are the same as those in the First Embodiment.

The metal film ME embedded in the trench TR3 serves as a control gate electrode CG1, and functions as the gate electrode of the control transistor. The lamination body of the insulation film HK and the insulation film GF1 present under the control gate electrode CG1 functions as the gate insulation film of the control transistor.

In the present Second Embodiment, the control gate electrode CG is removed, and is replaced with the control gate electrode CG1. The control gate electrode CG1 is used as the gate electrode of the control transistor forming the memory cell of the nonvolatile memory. For this reason, in the case of the present Second Embodiment, the control gate electrode CG is a dummy gate electrode (pseudo gate electrode), and can be regarded as a replacement gate electrode or a gate electrode for substitution. The control gate electrode CG1 can be regarded as the gate electrode forming the control transistor.

Subsequently, the steps of FIGS. 36 to 38 of the First Embodiment are performed. Namely, the insulation film IL3 is formed over the insulation film IL2 in such a manner as to cover the gate electrodes GE1 and GE2, and the control gate electrode CG1. The contact holes are formed in the insulation films IL3 and IL2. The plugs PG are formed in the contact holes, respectively. Over the insulation film IL3 including the plugs PG embedded therein, the insulation film IL6 and the wire M1 are formed. Herein, the steps are not shown and are not described.

Figure 43:
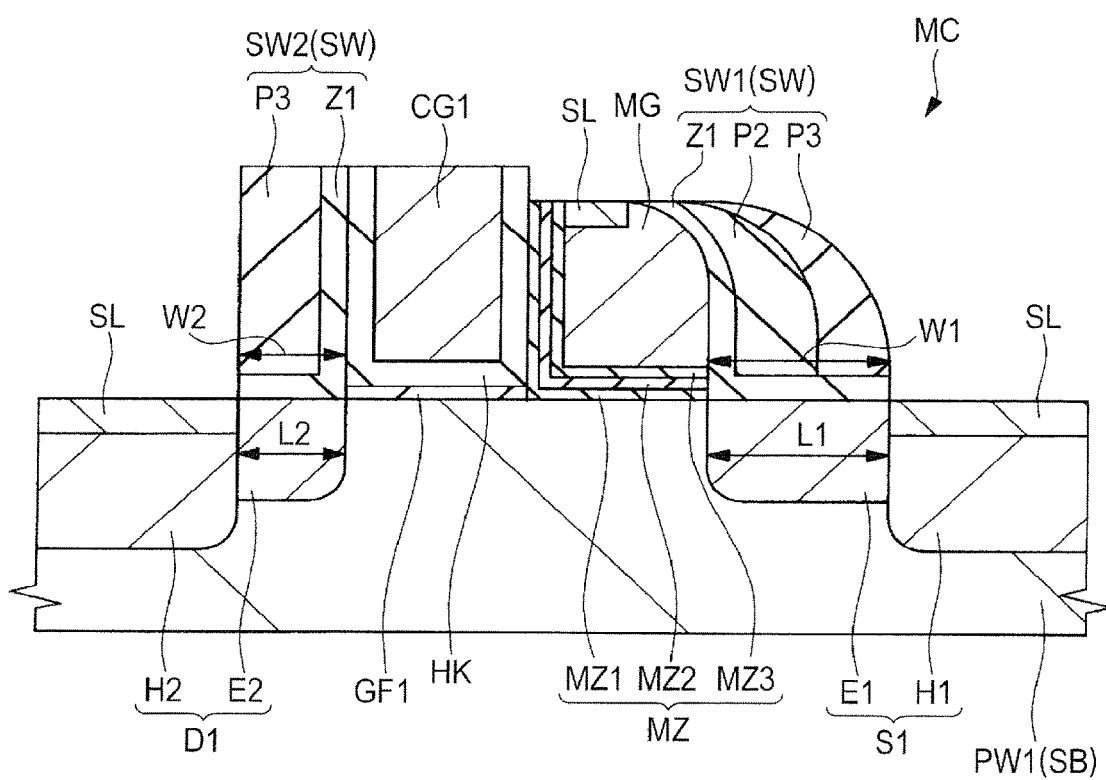
FIG. 43 is an essential part cross sectional view of a semiconductor device of still other embodiment.

FIG. 43 is an essential part cross sectional view of the semiconductor device of the present Second Embodiment, and shows the cross sectional view corresponding to FIG. 3.

The semiconductor device of the present Second Embodiment is different from the First Embodiment in that the control gate electrode CG in the First Embodiment is replaced with the insulation film HK and the control gate electrode CG1 in the present Second Embodiment. The insulation film HK is a high dielectric constant insulation film, and the control gate electrode CG1 is a metal gate electrode. The lamination film of the insulation film HK and the insulation film GF1 is present immediately under the control gate electrode CG1. The insulation film HK is present on the upper side, and the insulation film GF1 is present on the lower side. The insulation film HK covers not only the lower surface of the control gate electrode CG1, but also the side surface of the control gate electrode CG1. For this reason, the insulation film HK extends continuously between the lower surface of the control gate electrode CG1 and the insulation film GF1, between the side surface of the control gate electrode CG1 and the sidewall spacer SW1 (insulation film Z1), and between the side surface of the control gate electrode CG1 and the insulation film MZ. Therefore, the insulation film MZ and the insulation film HK are interposed between the control gate electrode CG1 and the memory gate electrode MG.

Other configurations of the semiconductor device of the present Second Embodiment are almost the same as those of the First Embodiment, and hence, herein, are not described.

The present Second Embodiment also has the features as described in the First Embodiment. This can produce the foregoing effects.

Up to this point, the invention made by the present inventors was described specifically by way of the embodiments. However, it is naturally understood that the present invention is not limited to the embodiments, and may be variously changed within the scope not departing from the gist thereof.

What is claimed is:

1. A method for manufacturing a semiconductor device having a memory cell of a nonvolatile memory,
the method comprising the steps of:
(a) providing a semiconductor substrate;
(b) forming a first gate electrode for the memory cell over the semiconductor substrate via a first insulation film;
(c) forming a second gate electrode for the memory cell over the semiconductor substrate via a second insulation film having a charge accumulation part, and forming the second gate electrode in such a manner as to be adjacent to the first gate electrode via the second insulation film;
(d) after the step (c), forming a first low concentration semiconductor region and a second low concentration semiconductor region of a first conductivity type in the semiconductor substrate by an ion implantation method;
(e) after the step (d), forming a first sidewall spacer adjacent to a first side surface of the first gate electrode opposite to the side thereof adjacent to the second gate electrode, and forming a second sidewall spacer adjacent to a second side surface of the second gate electrode opposite to the side thereof adjacent to the first gate electrode; and
(f) after the step (e), forming a first high concentration semiconductor region and a second high concentration semiconductor region of the first the conductivity type in the semiconductor substrate by an ion implantation method,
wherein in the step (d), the first low concentration semiconductor region is formed in self-alignment with the first gate electrode, and the second low concentration semiconductor region is formed in self-alignment with the second gate electrode,
wherein in the step (f), the first high concentration semiconductor region is formed in self-alignment with the first sidewall spacer, and the second high concentration semiconductor region is formed in self-alignment with the second sidewall spacer,
wherein the impurity concentration of the first high concentration semiconductor region is higher than the impurity concentration of the first low concentration semiconductor region,
wherein the impurity concentration of the second high concentration semiconductor region is higher than the impurity concentration of the first low concentration semiconductor region,
wherein at the read operation of the memory cell, the first high concentration semiconductor region and the first low concentration semiconductor region function as a drain region of the memory cell, and the second high concentration semiconductor region and the second low concentration semiconductor region function as a source region of the memory cell,
wherein at the read operation of the memory cell, electric charges are injected into the charge accumulation part of the second insulation film by source side injection, thereby to perform write to the memory cell, and
wherein a second width of the second sidewall spacer in the gate length direction of the second gate electrode is larger than a first width of the first sidewall spacer in the gate length direction of the first gate electrode.

2. The method for manufacturing a semiconductor device according to claim 1,
wherein the step (e) comprises the steps of:
(e1) forming a third insulation film in such a manner as to cover the first gate electrode and the second gate electrode;
(e2) etching back the third insulation film, and forming a first sidewall insulation film on the first side surface side of the first gate electrode, and forming a second sidewall insulation film on the second side surface side of the second gate electrode;
(e3) removing the first sidewall insulation film, and leaving the second sidewall insulation film;

(e4) forming a fourth insulation film in such a manner as to cover the first gate electrode, the second gate electrode, and the second sidewall insulation film; and (e5) etching back the fourth insulation film, and forming a third sidewall insulation film on the first side surface side of the first gate electrode, and forming a fourth sidewall insulation film on the second side surface side of the second gate electrode, wherein the first sidewall spacer includes the third sidewall insulation film, and wherein the second sidewall spacer includes the second sidewall insulation film and the fourth sidewall insulation film.

3. The method for manufacturing a semiconductor device according to claim 1, wherein at the write operation of the memory cell, the second high concentration semiconductor region is applied with a first voltage higher than the electric potential of the first high concentration semiconductor region, wherein at the read operation of the memory cell, the first high concentration semiconductor region is applied with a second voltage higher than the electric potential of the second high concentration semiconductor region, and wherein the first voltage is higher than the second voltage.

4. The method for manufacturing a semiconductor device according to claim 1, wherein at the write operation of the memory cell, the second high concentration semiconductor region is applied with a first voltage higher than the electric potential of the first high concentration semiconductor region, the second gate electrode is applied with a third voltage higher than the first voltage, and hot electrons are injected from the semiconductor substrate into the charge accumulation part of the second insulation film, thereby to perform write to the memory cell.

5. The method for manufacturing a semiconductor device according to claim 1, the method further comprising the steps of:

(g) after the step (f), forming a first interlayer insulation film in such a manner as to cover the first gate electrode, the second gate electrode, the first sidewall spacer, and the second sidewall spacer;

(h) polishing the first interlayer insulation film, and exposing the first gate electrode;

(i) removing the first gate electrode; and (j) forming a third gate electrode for the memory cell in a region from which the first gate electrode was removed, wherein the first gate electrode is a dummy gate electrode.

* * * * *